(12) United States Patent
Guo

(10) Patent No.: US 12,282,080 B1
(45) Date of Patent: Apr. 22, 2025

(54) MULTI-MODULE VELOCITY SELECTIVE LABELING WITH IMPROVED STABILITY AND ACCURACY IN IMAGING APPLICATIONS

(71) Applicant: The Regents of the University of California, Oakland, CA (US)

(72) Inventor: Jia Guo, Yorba Linda, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 18/835,654

(22) PCT Filed: Jan. 26, 2023

(86) PCT No.: PCT/US2023/061384
§ 371 (c)(1),
(2) Date: Aug. 2, 2024

(87) PCT Pub. No.: WO2023/150468
PCT Pub. Date: Aug. 10, 2023

Related U.S. Application Data

(60) Provisional application No. 63/267,514, filed on Feb. 3, 2022.

(51) Int. Cl.
*G01V 3/00* (2006.01)
*G01R 33/56* (2006.01)
*G01R 33/563* (2006.01)

(52) U.S. Cl.
CPC ... *G01R 33/5608* (2013.01); *G01R 33/56366* (2013.01)

(58) Field of Classification Search
CPC .............. G01R 33/287; G01R 33/4835; G01R 33/5608; A61B 2090/374
(Continued)

(56) References Cited

U.S. PATENT DOCUMENTS

| 2,473,318 A | 6/1949 | Donald |
| 4,988,947 A | 1/1991 | Ugurbil et al. |

(Continued)

FOREIGN PATENT DOCUMENTS

| CN | 109752683 A | * | 5/2019 | |
| CN | 110197106 A | * | 9/2019 | ......... G06K 9/00362 |

(Continued)

OTHER PUBLICATIONS

International Search Report and Written Opinion mailed Jun. 16, 2022 for International Patent Application No. PCT/US2022/023126 (17 pages).

(Continued)

*Primary Examiner* — Walter L Lindsay, Jr.
*Assistant Examiner* — Frederick Wenderoth
(74) *Attorney, Agent, or Firm* — Perkins Coie LLP

(57) ABSTRACT

Techniques, systems and apparatus are described for magnetic resonance imaging. A method includes generating an MRI image by processing a first image obtained by applying a first order of modules including at least a first control module at a first time point and a first labeling module at a second time point to a target object, wherein the first control module inverts a magnetization of the target object and a second image obtained by applying a second order of modules including at least a second labeling module at a third time and a second control module at a fourth time to the target object, wherein the second labeling module inverts the magnetization of the target object.

20 Claims, 42 Drawing Sheets

(58) Field of Classification Search
USPC .......................................................... 324/309
See application file for complete search history.

(56) References Cited

U.S. PATENT DOCUMENTS

| | | | |
|---|---|---|---|
| 7,587,233 B2 | 9/2009 | Wong et al. | |
| 2010/0030062 A1* | 2/2010 | Bolar | A61B 5/055 600/419 |
| 2012/0268126 A1* | 10/2012 | Guo | G01R 33/4838 324/309 |
| 2012/0283547 A1 | 11/2012 | Wong et al. | |
| 2015/0309134 A1* | 10/2015 | Meakin | G01R 33/56366 324/309 |
| 2017/0160365 A1 | 6/2017 | Helle et al. | |
| 2017/0176564 A1 | 6/2017 | Qin et al. | |
| 2025/0004083 A1 | 1/2025 | Guo | |

FOREIGN PATENT DOCUMENTS

| | | | |
|---|---|---|---|
| WO | WO-2015158879 A1 * | 10/2015 | ........... A61B 5/0044 |
| WO | 2022221076 A1 | 10/2022 | |

OTHER PUBLICATIONS

Guo, Jia, et al., "An optimized design to reduce eddy current sensitivity in velocity-selective arterial spin labeling using symmetric BIR-8 pulses", Magnetic Resonance in Medicine, 73(3)., 2015, 1085-1094.

Guo, Jia, et al., "Comparison of velocity-selective arterial spin labeling schemes", Magnetic Resonance in Medicine; 85(4)., 2021, 2027-2039.

Guo, Jia, et al., "Increased SNR Efficiency in Velocity Selective Arterial Spin Labeling Using Multiple Velocity Selective Saturation Modules (mm-VSASL)", Magnetic Resonance in Medicine; 74., 2015, 694-705.

Guo, Jia, "Robust dual-module velocity-selective arterial spin labeling (dm-VSASL) with velocity-selective saturation and inversion", Magnetic Resonance in Medicine; 89(3)., 2023, 1026-1040.

Qin, Qin, et al., "Velocity-Selective-Inversion Prepared Arterial Spin Labeling", Magnetic Resonance in Medicine; 76., 2016, 1136-1148.

Wong, Erin C., et al., "Velocity-selective arterial spin labeling", Magnetic Resonance in Medicine; 55(6)., Jun. 2006, 1334-41.

Ye, Frank Q., et al., "Noise reduction in 3D perfusion imaging by attenuating the static signal (ASSIST)", Magnetic Resonance in Medicine; 44(1)., 2000, 92-100.

International Search Report and Written Opinion from PCT Application PCT/US2023/061384 dated Jun. 21, 2023.

* cited by examiner

| Sequence | | PA61 | VSS$_{inv}$ | VSS+VSS$_{inv}$ | VSS$_{inv}$+VSS$_{inv}$ (BS 1) | VSS$_{inv}$+VSS (BS 2) | VSI | VSI+VSI (BS 1) | VSI+VSI (BS 2) |
|---|---|---|---|---|---|---|---|---|---|
| Averaged BS level across subjects (mean±SEM, %) | GM | 6.55±0.11 | 12.93±0.53 | 15.08±2.10 | 4.70±0.14 | 10.32±0.29 | 10.64±1.17 | 6.02±0.31 | 9.72±0.18 |
| | WM | 8.96±0.23 | 9.00±0.20 | 5.27±0.40 | 5.33±0.22 | 11.25±0.15 | 7.11±0.10 | 7.29±0.26 | 11.65±0.13 |
| | CSF | 4.74±0.40 | 22.01±1.61 | 23.65±3.87 | 7.25±0.47 | 4.12±0.42 | 16.05±1.80 | 6.03±0.92 | 4.51±0.27 |

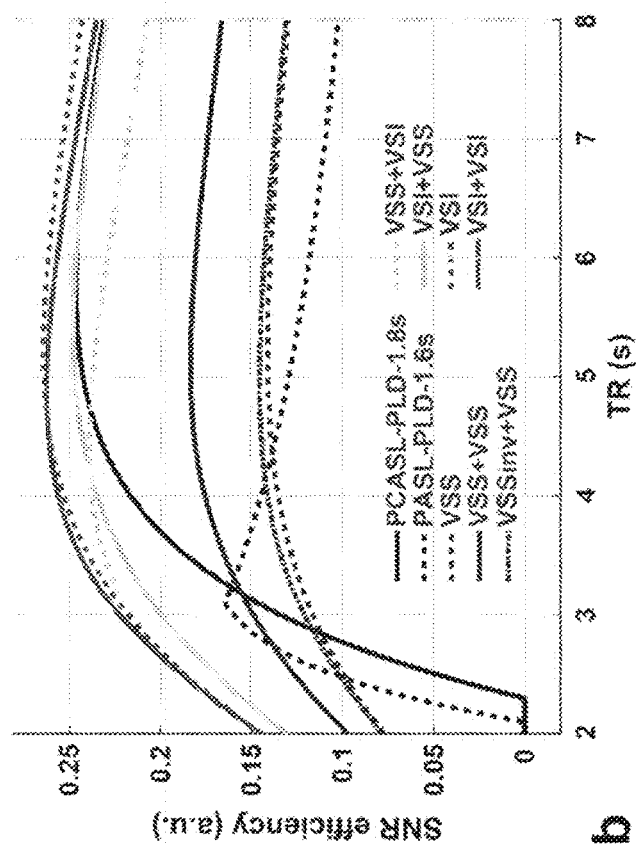
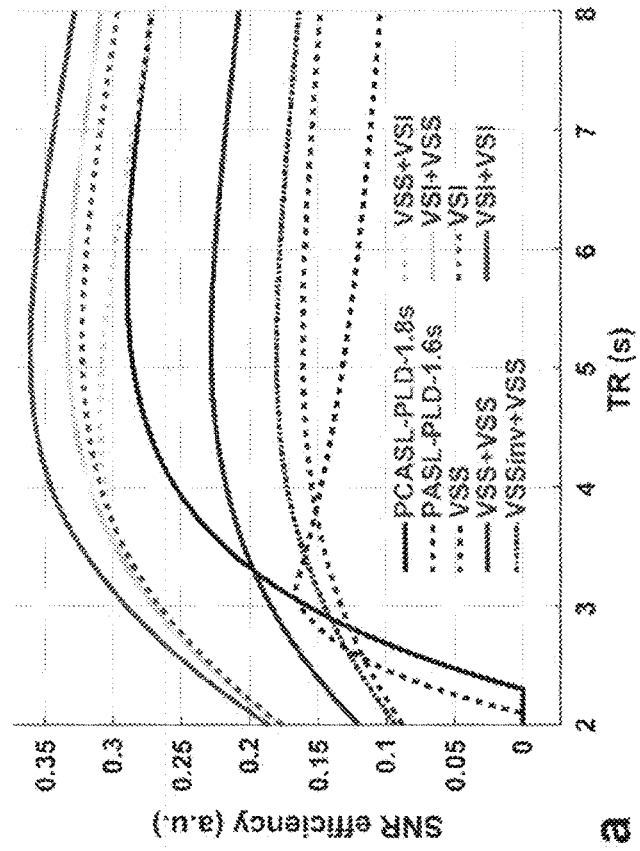
FIG. 16

| Sequence | | PASL | Gray Matter VSS | VSS+VSSinv | VSSinv+VSS | VSI | VSI+VSI | PASL | VSS | White Matter VSS+VSSinv | VSSinv+VSS | VSI | VSI+VSI |
|---|---|---|---|---|---|---|---|---|---|---|---|---|---|
| ASL Signal (%) | sub 1 | 0.58 | 0.55 | 0.62 | 0.51 | 0.78 | 0.61 | 0.18 | 0.28 | 0.12 | 0.17 | 0.24 | 0.36 |
| | sub 2 | 0.46 | 0.39 | 0.44 | 0.44 | 0.60 | 0.64 | 0.18 | 0.16 | 0.14 | 0.20 | 0.27 | 0.27 |
| | sub 3 | 0.50 | 0.34 | 0.49 | 0.32 | 0.49 | 0.48 | 0.15 | 0.15 | 0.12 | 0.13 | 0.19 | 0.20 |
| | sub 4 | 0.35 | 0.29 | 0.38 | 0.31 | 0.42 | 0.42 | 0.14 | 0.14 | 0.09 | 0.14 | 0.21 | 0.21 |
| | mean± SEM | 0.47±0.10 | 0.39±0.11 | 0.46±0.10 | 0.40±0.09 | 0.58±0.16 | 0.59±0.18 | 0.16±0.02 | 0.18±0.06 | 0.12±0.02 | 0.16±0.03 | 0.22±0.03 | 0.26±0.07 |
| | w/ BS corr. | 0.52±0.11 | 0.41±0.12 | 0.51±0.11 | 0.42±0.10 | 0.61±0.17 | 0.65±0.19 | 0.18±0.02 | 0.19±0.07 | 0.13±0.02 | 0.17±0.03 | 0.24±0.04 | 0.28±0.08 |
| CBF (ml/100 g/min) | sub 1 | 51.15 | 49.87 | 45.19 | 44.02 | 47.04 | 55.45 | 12.80 | 20.23 | 11.45 | 11.59 | 13.12 | 18.84 |
| | sub 2 | 35.96 | 32.73 | 31.34 | 36.77 | 35.05 | 41.08 | 10.89 | 11.34 | 9.73 | 12.96 | 12.27 | 13.90 |
| | sub 3 | 40.50 | 29.68 | 36.84 | 27.45 | 35.53 | 32.13 | 9.61 | 9.91 | 9.73 | 8.41 | 10.37 | 10.08 |
| | sub 4 | 26.00 | 24.14 | 27.11 | 25.15 | 24.55 | 26.30 | 8.14 | 9.73 | 7.29 | 8.63 | 9.06 | 10.18 |
| | mean± SEM | 38.43±10.44 | 34.11±11.09 | 35.12±7.8 | 33.35±6.71 | 35.54±9.18 | 38.74±12.69 | 10.16±1.66 | 12.80±5.00 | 9.55±1.71 | 10.40±2.24 | 11.21±1.84 | 13.25±4.13 |

FIG. 19

| ASL schemes (n = 6) | | PASL | VSS | mm-VSS | dm-VSS (BS1) | VSI | dm-VSI (BS1) | dm-VSS (BS2) | dm-VSI (BS2) |
|---|---|---|---|---|---|---|---|---|---|
| Mean BS level (mean ± SEM, %) | GM | 5.8 ± 0.5 | 13.4 ± 0.9 | 15.7 ± 2.2 | 0.8 ± 0.4 | 10.6 ± 1.3 | 9.1 ± 0.2 | 4.7 ± 0.4 | 5.7 ± 0.5 |
| | WM | 8.5 ± 0.7 | 8.6 ± 0.2 | 3.1 ± 0.3 | 11.4 ± 0.3 | 6.7 ± 0.3 | 11.5 ± 0.4 | 5.2 ± 0.2 | 7.1 ± 0.2 |
| | CSF | 5.4 ± 0.4 | 20.4 ± 2.9 | 23.7 ± 3.7 | 5.2 ± 1.3 | 15.7 ± 2.1 | 5.5 ± 0.9 | 7.1 ± 0.8 | 6.3 ± 0.5 |
| Mean tSNR (mean ± SEM) | GM | 4.7 ± 1.3 | 2.1 ± 1.0 | 1.8 ± 0.7 | 4.0 ± 1.1 | 3.2 ± 1.4 | 6.2 ± 1.2 | 3.7 ± 1.4 | 5.6 ± 2.0 |
| | WM | 1.9 ± 0.6 | 0.9 ± 0.2 | 0.8 ± 0.2 | 1.3 ± 0.3 | 1.5 ± 0.5 | 2.3 ± 0.4 | 1.3 ± 0.4 | 2.2 ± 0.5 |

Note: dm-VSS (BS1) and dm-VSI (BS1) were referred to as dm-VSS and dm-VSI for simplicity in later analyses.
Abbreviations: ASL, arterial spin labeling; BS, background suppression; dm-VSI, dual-module velocity-selective inversion; dm-VSS, dual-module velocity-selective saturation; GM, gray matter; mm-VSS, multi-module velocity-selective saturation; PASL, pulsed ASL; SEM, standard error of the mean; tSNR, temporal SNR; VSS, velocity-selective saturation; VSI, velocity-selective inversion; WM, white matter.

FIG. 37

| ASL schemes ($n = 6$) | | PASL | VSS | mm-VSS | 4m-VSS | VSI | 4m-VSI |
|---|---|---|---|---|---|---|---|
| Normalized ASL signal (mean ± SEM, %) | GM | 0.56 ± 0.13 | 0.45 ± 0.12 | 0.55 ± 0.10 | 0.43 ± 0.11 | 0.46 ± 0.15 | 0.69 ± 0.17 |
| | WM | 0.22 ± 0.04 | 0.20 ± 0.05 | 0.18 ± 0.05 | 0.16 ± 0.03 | 0.28 ± 0.05 | 0.31 ± 0.07 |
| CBF (mean ± SEM, ml/100 g·min) | GM | 44.0 ± 14.2 | 43.4 ± 12.6 | 43.9 ± 8.1 | 39.2 ± 11.0 | 40.5 ± 11.0 | 49.6 ± 12.3 |
| | WM | 13.1 ± 3.6 | 14.3 ± 4.3 | 13.0 ± 3.1 | 11.0 ± 2.6 | 13.1 ± 3.0 | 14.4 ± 3.9 |
| Gray/white ratio | | 3.51 | 3.03 | 3.37 | 3.55 | 3.17 | 3.02 |

Note: The signal attenuation from additional background suppression pulses was corrected in ASL signal and CBF calculation.
Abbreviations: CBF, cerebral blood flow; ROI, regions of interest.

MULTI-MODULE VELOCITY SELECTIVE LABELING WITH IMPROVED STABILITY AND ACCURACY IN IMAGING APPLICATIONS

CROSS-REFERENCE TO RELATED APPLICATION(S)

This patent document is a 371 National Stage Application of International Patent Application No. PCT/US2023/061384, filed Jan. 26, 2023, which claims the benefit of priority of U.S. Provisional Patent Application No. 63/267,514, filed on Feb. 3, 2022, which are incorporated by reference as part of the disclosure of this document.

TECHNICAL FIELD

This patent document relates to systems, devices, and processes for magnetic resonance imaging.

BACKGROUND

Imaging through Magnetic Resonance Imaging (MRI) techniques has been widely applied in imaging applications in medical, biological and other fields. A typical MRI technique produces an image of a selected body part of an object under examination by manipulating the magnetic spins in a body part and processing measured responses from the magnetic spins. An MRI system may include hardware to generate different magnetic fields for imaging, including a static magnetic field along a z-direction to polarize the magnetic spins, gradient fields along mutually orthogonal x, y, or z directions to spatially select a body part for imaging, and a radio frequency (RF) magnetic field to manipulate the spins.

SUMMARY

Techniques, systems and apparatus are described for a magnetic resonance imaging (MRI) system in which a new multi-module velocity-selective arterial spin labeling (MM-VSASL) is used.

In one example aspect, a disclosed method includes generating an MRI image by processing a first image obtained by applying a first order of modules including at least a first control module at a first time point and a first labeling module at a second time point to a target object, wherein the first control module inverts a magnetization of the target object and a second image obtained by applying a second order of modules including at least a second labeling module at a third time and a second control module at a fourth time to the target object, wherein the second labeling module inverts the magnetization of the target object.

In another example aspect, a disclosed apparatus comprises a scanner, gradient coils and a radio frequency (RF) and a data processing system in communication with the scanner to receive acquired magnetic resonance imaging (MRI) signals and generate an MRI image of the target from the magnetic resonance signal.

In another example aspect, a computer readable medium is disclosed. The medium stores processor-executable instructions causing a processor to implement a method described in the present document.

Those and other aspects and associated implementations and benefits are described in greater detail in the drawings, the description, attached Appendices and the claims.

BRIEF DESCRIPTION OF THE DRAWINGS

FIG. 11 is a tabular representation of background tissue suppression results measured in one example experiment.

FIG. 14 is a tabular representation of results measured in one example experiment.

FIG. 16 shows examples of SNR efficiencies of different ASL methods under different scenarios.

FIG. 19 is a tabular representation of results measured in one example experiment.

FIG. 37 is a tabular representation of results measured in one example experiment.

FIG. 41 is a tabular representation of results measured in one example experiment.

DETAILED DESCRIPTION

In recent years, advances in magnetic resonance imaging (MRI) technology have led to emergence of MRI imaging systems that provide better image clarity for medical diagnostic purpose than previous MRI systems. However, certain medical applications still present a challenge to present day MRI systems.

Perfusion imaging using arterial spin labeling (ASL) is an important technique used in diagnostics and research. Current velocity selective ASL (VSASL) uses either single or multiple VS Saturation (VSS), or single VS Inversion (VSI) for arterial labeling. These methods have sub-optimal SNR performance. More importantly, the VSASL signal is not as stable as other ASL methods, and the temporal signal-to-noise ratio (tSNR) is typically unsatisfactory in practice due to noise and artefacts from sources such as motion, eddy current and diffusion attenuation effects.

The techniques described in the present document may be used to overcome these limitations of the present day ASL techniques, among others.

Figure 1:
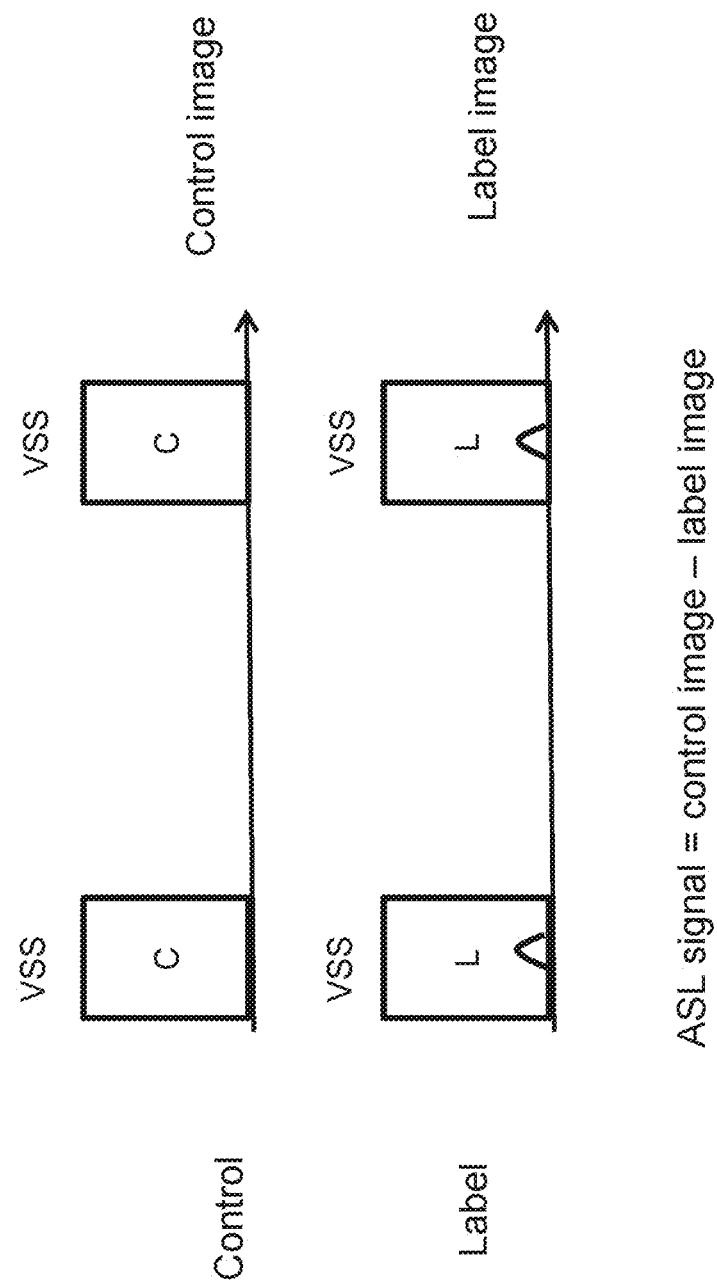
FIG. 1 shows an example of a conventional multi-module velocity-selective arterial spin labeling (MM-VSASL) imaging process using two velocity-selective saturation (VSS) pulse modules.

FIG. 1 shows an example of a conventional velocity-selective saturation (VSS) imaging process using two pulse modules. A control image (top) is obtained by applying, in a control condition, a control VSS module, followed by a second VSS control module. In the labeling condition, a first labeling module is applied, followed by a second labeling module to obtain a labeling image. Typically, VS gradient pulses are applied under the labeling condition, but are turned off under the control condition. The ASL image signal is recovered as a difference between the control image and the labeling image. In addition to the C and L modules (representing control and labeling), gradient pulses are shown as pulses under the L pulse time rectangles.

With respect to FIG. 1 module arrangements, typically, the VSS process shown in FIG. 1 exhibits an increase of ASL signal compared to a single-module VSS labeling process, and a very robust labeling in real-world scenarios when a robust VSS module, such as a symmetric eight-segment B1-insentivity rotation (symBIR-8) pulse train, is used, where application of pulses is relatively immune to influence from surrounding tissue and magnetic field conditions.

With respect to FIG. 1 module arrangements, typically, the VSS process shown in FIG. 1 exhibits an increase of ASL signal compared to a single-module VSS labeling process, and a very robust labeling in real-world scenarios when a robust VSS module, such as a symmetric eight-segment B1-insentivity rotation (symBIR-8) pulse train, is used, where application of pulses is relatively immune to influence from surrounding tissue and magnetic field conditions.

Figure 2:
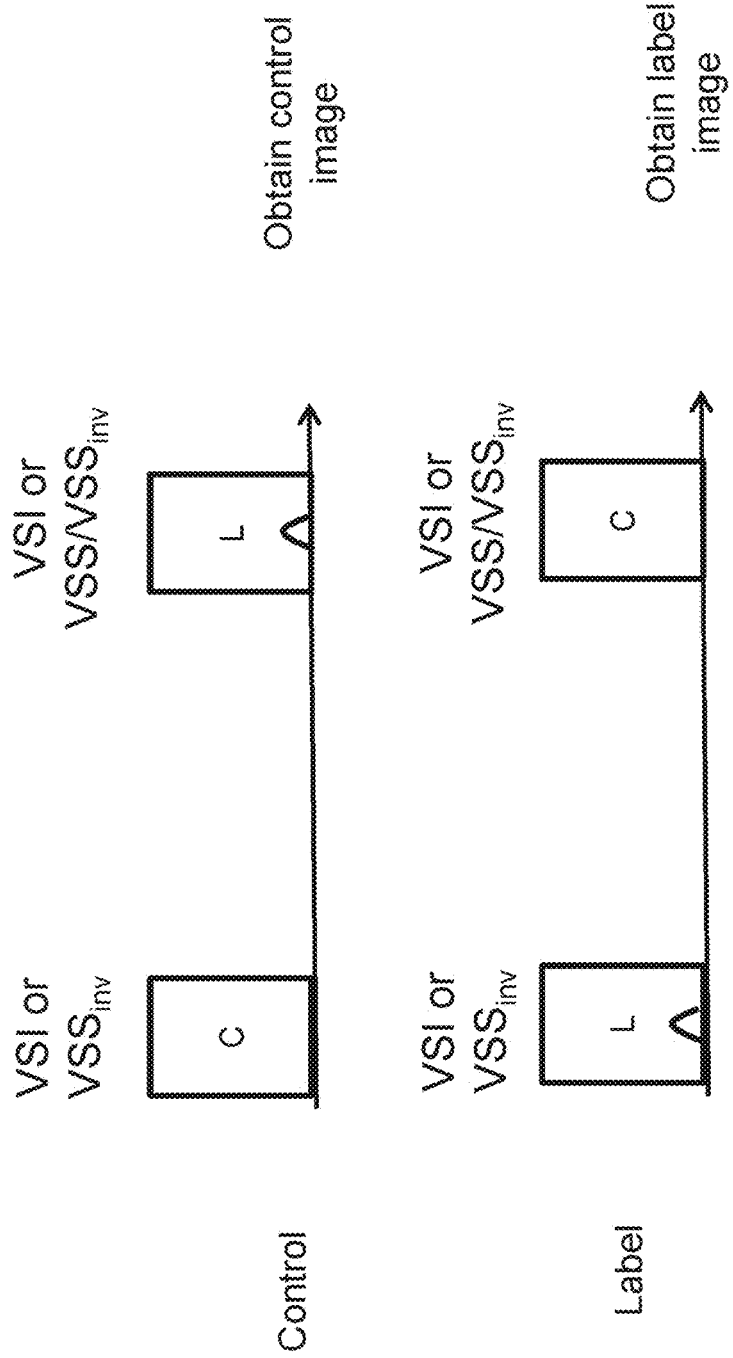
FIG. 2 shows an example of a new MM-VSASL imaging process using two VS inversion (VSI) or VSS (or VSS with additional inversion, VSSinv) pulse modules.

FIG. 2 shows an example of the new MM-VSASL imaging process using two pulse modules. This process uses VSS with additional inversion ($VSS_{inv}$) or VSI in the application of magnetic pulses. In the depicted embodiment, a control image is obtained by applying a sequence of a control module followed by a labeling module and, during labeling condition, a labeling module is applied followed by a control module. In this embodiment depicted in FIG. 2, compared to the FIG. 1 arrangement, the first VS pulse module ($VSS_{inv}$ or VSI) naturally inverts the magnetization of static tissues in a target, and therefore the control and labeling conditions are switched in a different order in the second VS pulse module. The gradients are more balanced between the label and the control conditions that leads to better temporal SNR (tSNR), as the arrangement mitigates or reduces the eddy current effects and the diffusion effects that are typically observed by application of gradient pulses in VS labeling.

For dm-VSI labeling: The first VSI pulse is applied under a label (or control) condition, after some time, a second VSI pulse is applied with the label/control condition opposite to the first VSI module, i.e., control (or label). Then ASL images can be acquired after some delay.

For the proposed new dm-VSS labeling: The first VSS is applied with a built-in inversion ($VSS_{inv}$), which can be implemented in several ways, such as adding a phase of 7 to the last segment of the symmetric BIR-8 (sBIR8) pulse. Then the second VSS is applied with a flipped label/control condition, with or without the built-in inversion.

In various embodiments, dm-VSASL using VSS and VSI: VSS+VSI, VSI+VSS and their inverted variants may be implemented. Label/control condition should be flipped in the second VS module when the first VS labeling inverts stationary spins.

Alternatively, the inversion effect from the first VS module can be realized using additional inversion pulses after the VS labeling pulse. For example, an inversion pulse can be applied after the first regular VSS pulse to allow a $VSS_{inv}$-equivalent VS labeling.

Figure 3:
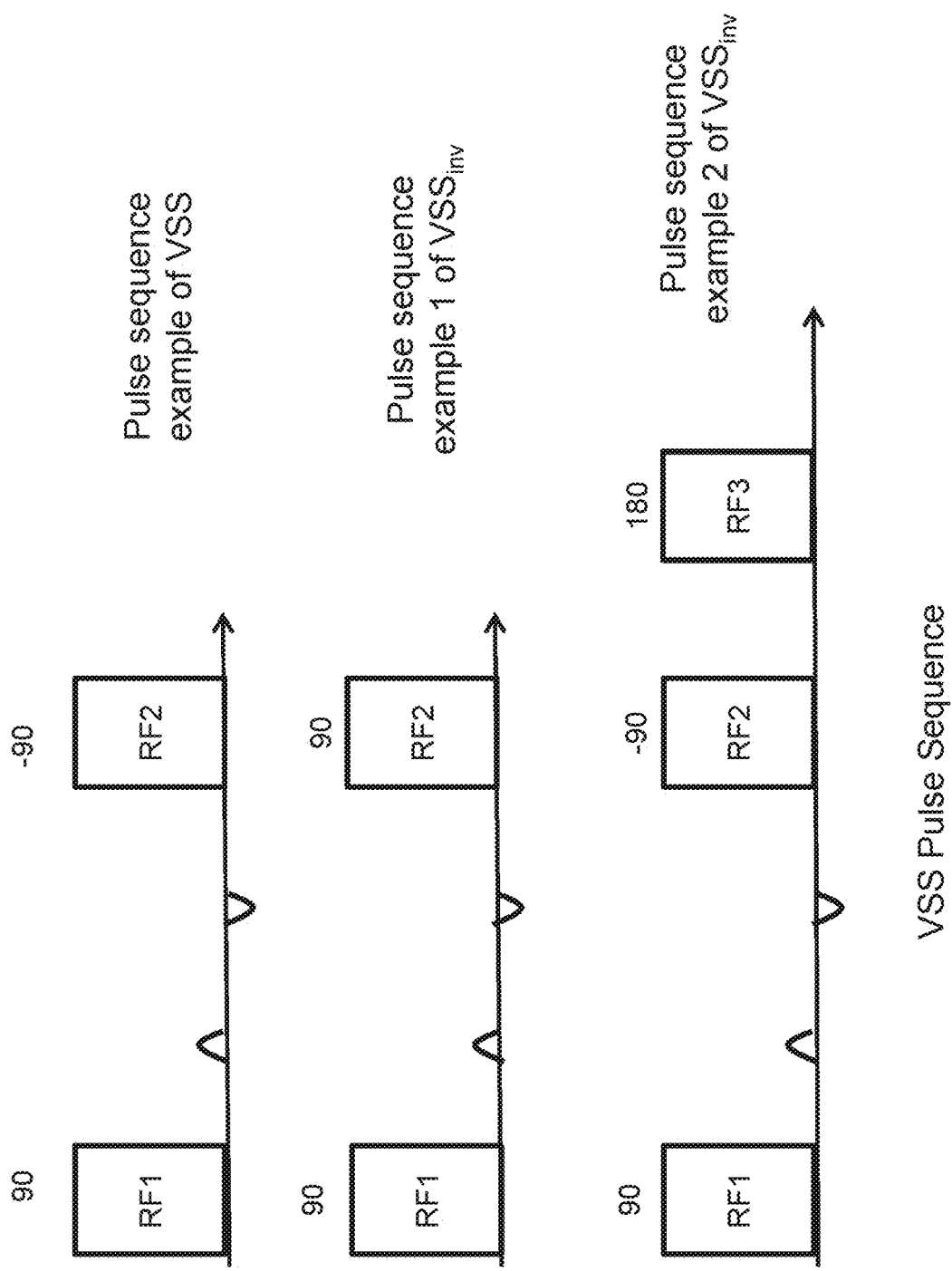
FIG. 3 shows examples of modifying a VSS pulse module into a VSSinv pulse module.

FIG. 3 shows an example of modifying a VSS module into a $VSS_{inv}$ module. The timeline on the top shows a simplest pulse sequencing example of a VSS process in which the two RF pulses are applied with +90-degree and −90-degree rotations and gradient pulses to labeling moving spins by saturation, while keeping stationary spins at equilibrium. $VSS_{inv}$ may be achieved by adding a 180-degree phase to the second RF pulse in the VSS module (e.g., apply a +90-degree rotation). Alternatively, or in addition, inversion pulses (e.g., 180-degree RF pulse) may be applied at a time after the VSS module to cause the inversion of stationary spins. In the case of labeling using VSI module, since it inverts stationary spins by default, the VSI module can be directly applied in this new multi-module VSASL process without additional modification.

Figure 4:
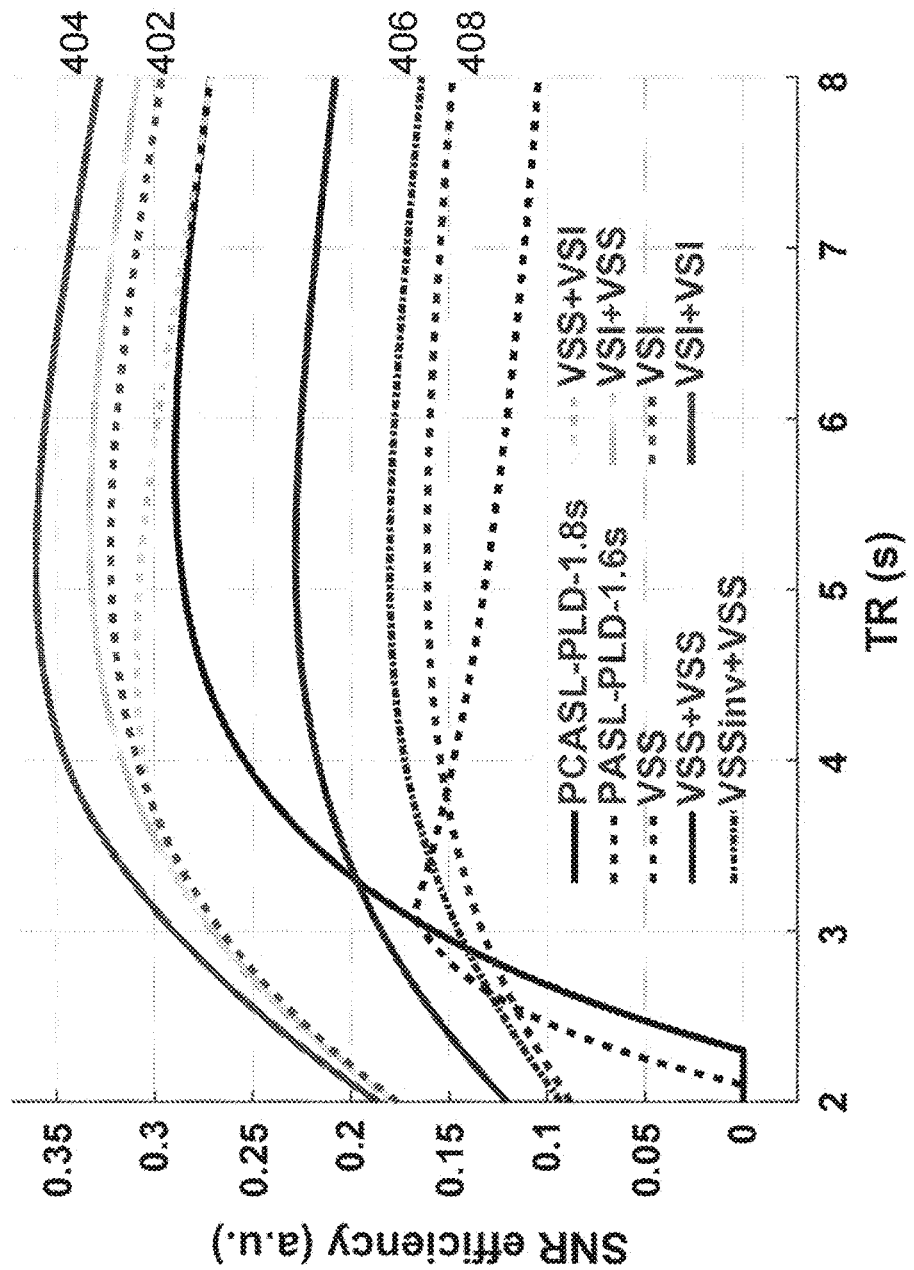
FIG. 4 shows an example of comparison of SNR efficiencies of different arterial spin labeling methods.

FIG. 4 shows an example of comparison of theoretical SNR efficiencies of different labeling methods. The dashed curve (402) shows the signal-to-noise ratio (SNR) efficiency obtained in case of a single VSI pulse application. The solid curve (404) shows increased SNR efficiency due to application of dual-module VSI, compared to the single VSI application. The dot-dashed curve (406) shows the SNR efficiency obtained in case of a $VSS_{inv}$ pulse application followed by a VSS pulse application, and has an SNR efficiency increase, compared to that with a single-module VSS pulse application (dashed curve 408). Other combinations also show improved SNR efficiencies, compared to single-module VSS or VSI application, respectively. It will be appreciated that more than 2 VSI (or $VSS_{inv}$) pulse trains may be applied with the label/control conditions switching to further increase the SNR efficiency, while maintaining a high temporal SNR.

Figure 5:
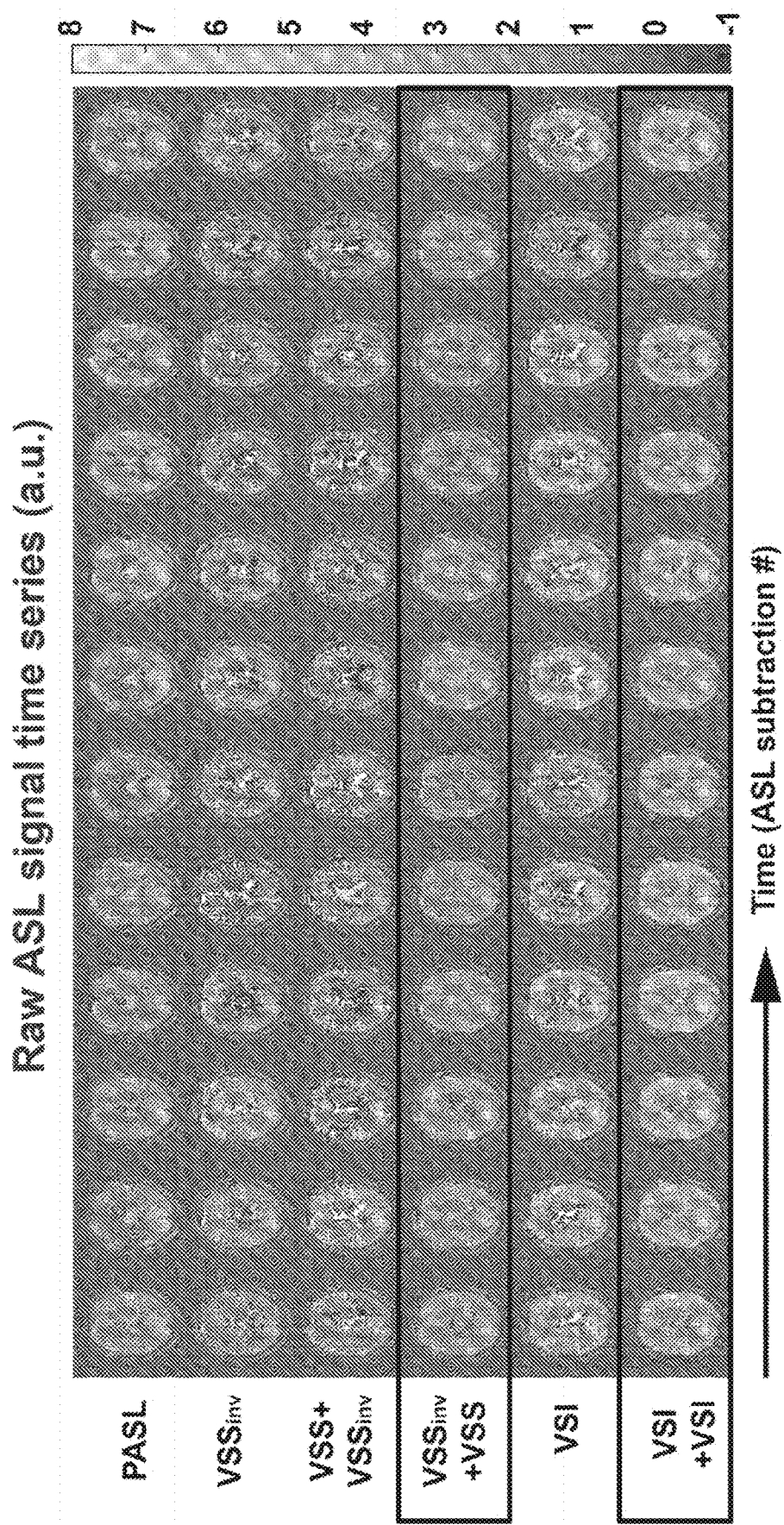
FIG. 5 shows an example of the ASL signal time series from a human subject, using different labeling methods.

FIG. 5 shows an example of the ASL signal time series using different labeling methods in a human subject, where individual images represent ASL images after subtraction between the control and label images. The $VSS_{inv}$ acquisition was equivalent to a single-module VSS method, and the $VSS+VSS_{inv}$ acquisition was equivalent to the previous dual-module VSS method. The pulsed arterial spin labeling (PASL) was acquired with a pulsed ASL method for reference. Compared with the single-module VS ($VSS_{inv}$ and VSI) methods and the previous dual-module VSS method ($VSS+VSS_{inv}$), the new MM-VSASL methods ($VSS_{inv}$+VSS and VSI+VSI) significantly stabilized the ASL signal throughout the measurement duration, i.e., significantly improved tSNR.

Figure 6:
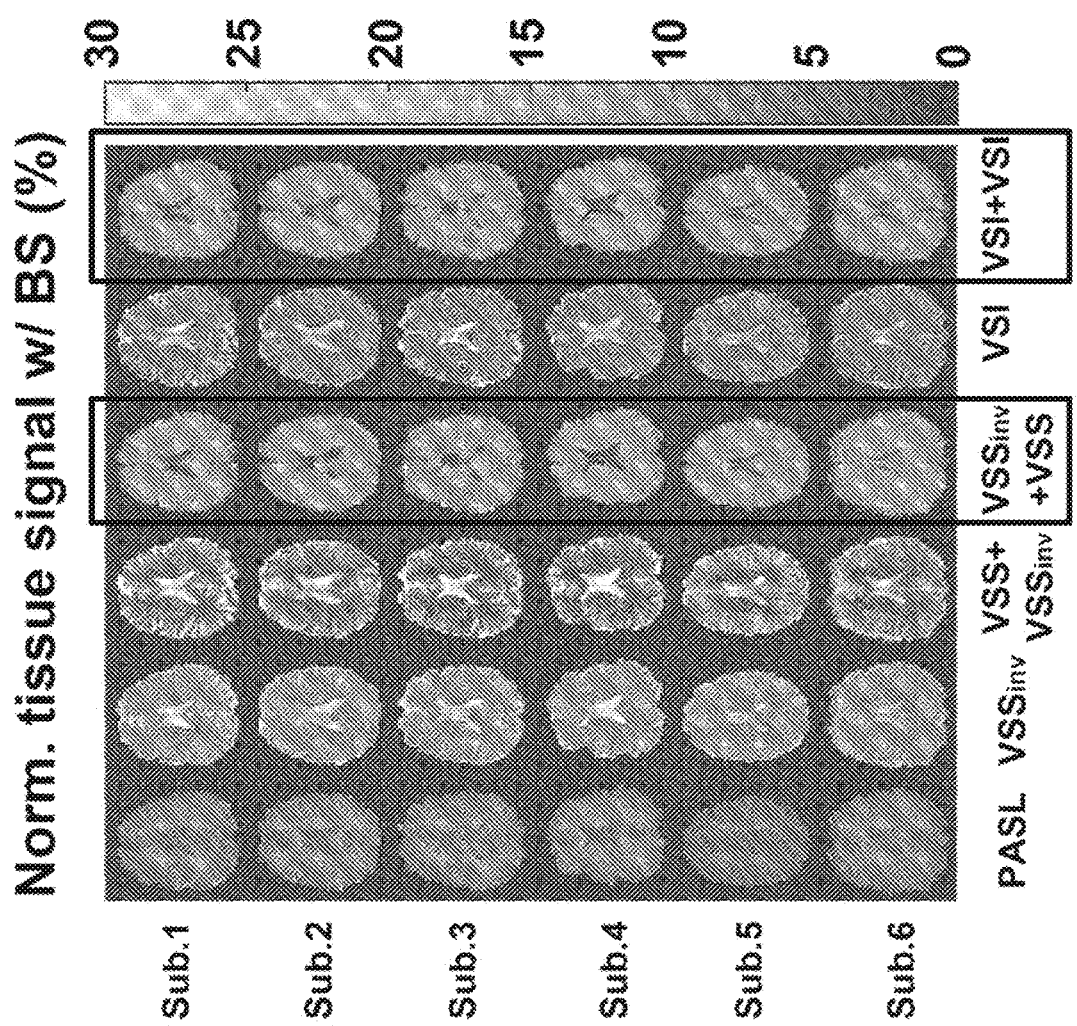
FIG. 6 shows an example of the background tissue signal suppression in human subjects using different labeling methods.

FIG. 6 shows an example of measured normalized background tissue signal maps using the disclosed MRI schemes in human subjects. The acquisition schemes were the same as those shown in FIG. 5. It is obvious that the new MM-VSASL methods ($VSS_{inv}$+VSS and VSI+VSI, in red boxes) significantly improved suppression of background tissue signals, especially of the cerebrospinal fluid in the ventricles, compared to their single-module counterparts ($VSS_{inv}$ and VSI, respectively) and the previous dual-module VSS scheme ($VSS+VSS_{inv}$).

Figure 7:
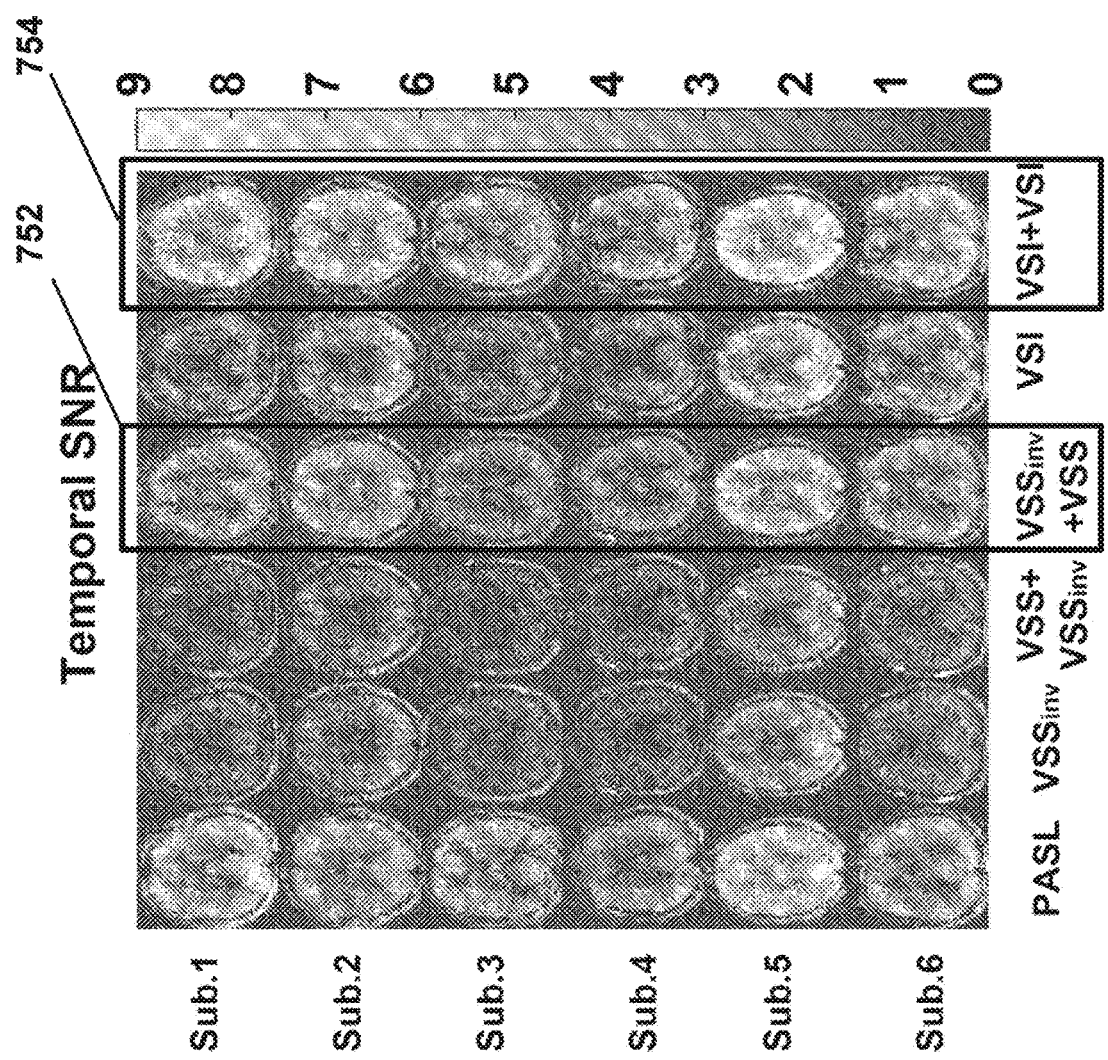
FIG. 7 shows an example of the temporal SNR (tSNR) maps in human subjects using different labeling methods.

FIG. 7 shows an example of measured tSNR maps using the disclosed MRI schemes in human subjects. The acquisition schemes were the same as those shown in FIG. 5. It is obvious that the new MM-VSASL methods ($VSS_{inv}$+VSS and VSI+VSI, in boxes 752, 754) significantly improved the tSNR compared to their single-module counterparts ($VSS_{inv}$ and VSI, respectively) and the previous multi-module VSS scheme ($VSS+VSS_{inv}$).

Figure 8:
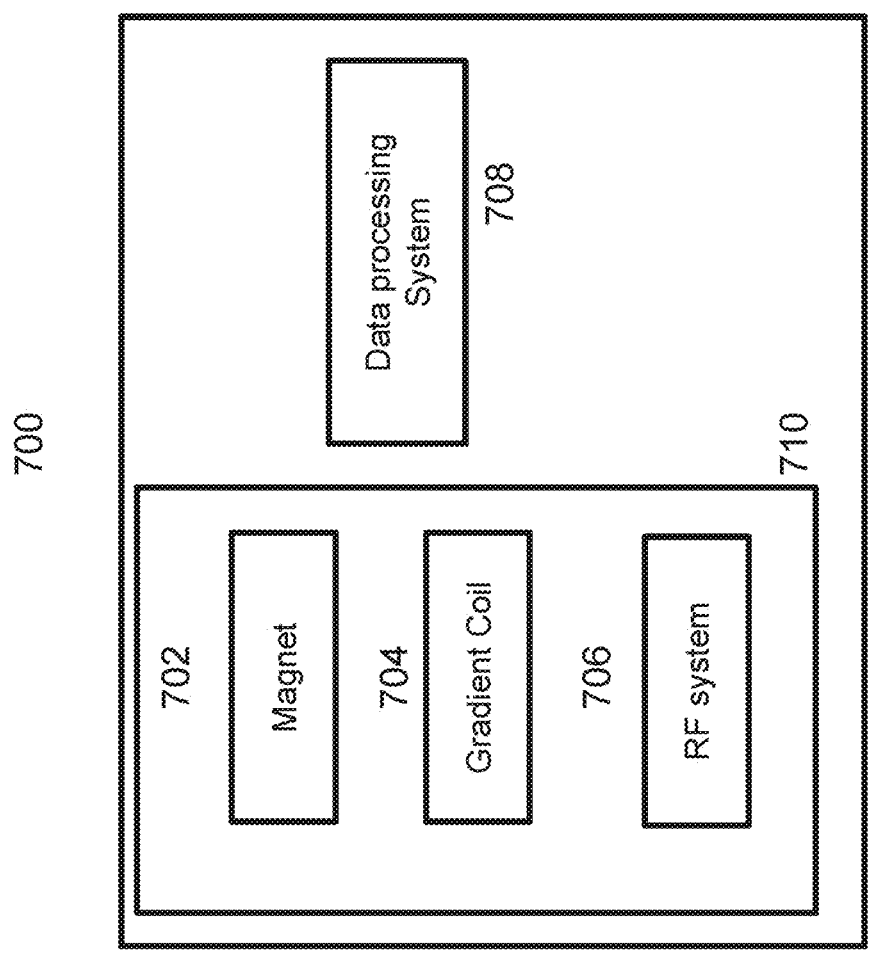
FIG. 8 is a block diagram of an example MRI system.

FIG. 8 is a block diagram of an example of an MRI system 700. The system includes a scanner (710) comprising one or more magnets (702), one or more gradient coils (704) and a radio frequency (RF) system (706). The MRI system 700 further includes a data processing system 708 in communication with the scanner 710 to receive the acquired magnetic resonance signals and generate an MRI image of the target from the magnetic resonance signal. The scanner 702 may be configured to scan a target during the process of acquiring an MRI image. The gradient coils 704 may be used to apply electromagnetic signals (e.g., the modules described herein) to the target using the magnets. The RF system 706 may be configured to generate the composite pulse as described in the present document. A processor (not explicitly shown) may control operation of the scanner 710 and the data processing system 708. In some embodiments, the data processing system 708 may include a processor, a memory and optionally hardware circuitry to implement image processing algorithms for generation of an MRI image.

In some embodiments, a processor may be configured to control operation of the above-described MRI system. The processor may control the gradient coils RF systems to generate a composite pulse as described in the present document and control the scanner to capture electromagnetic response generated by the target. The processor may process the data collected from the scanner and generate an MRI image of the target.

Figure 9:
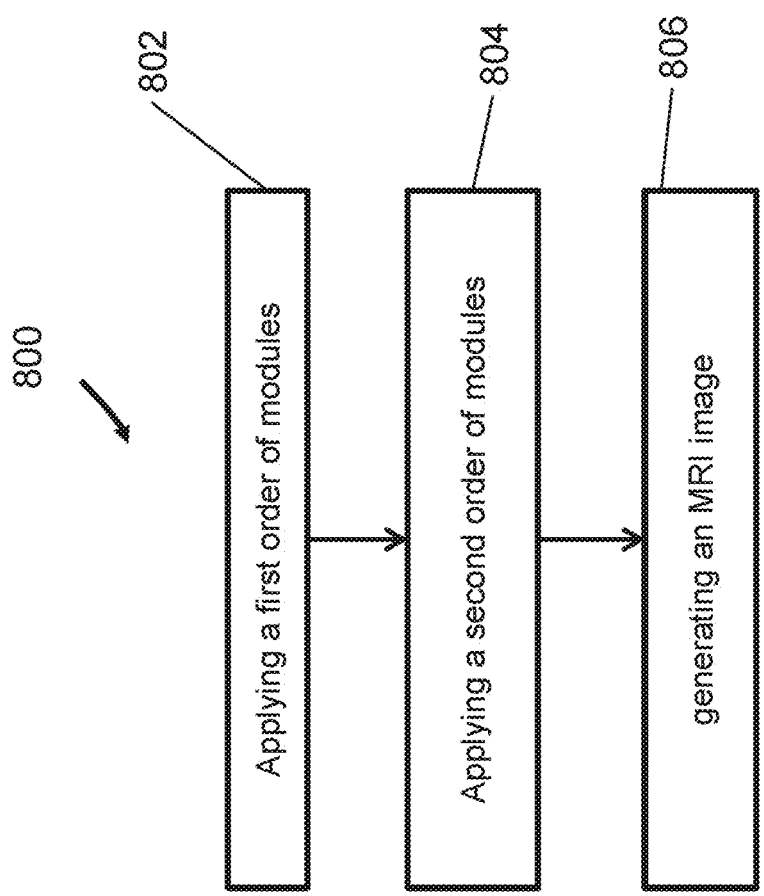
FIG. 9 is a flowchart of an example method of operating an MRI system.

FIG. 9 is a flowchart of an example method 800 of operating an MRI system. The method 800 includes generating (806) an MRI image by processing a first image obtained by applying (802) a first order of modules including at least a first control module at a first time point and a first labeling module at a second time point to a target object, wherein the first control module inverts a magnetization of the target object and a second image obtained by applying (804) a second order of modules including at least a second labeling module at a third time and a second control module at a fourth time to the target object, wherein the second labeling module inverts the magnetization of the target object.

In some embodiments, the first module and the second modules are applied using gradient coils that are communicatively coupled to a processor that controls their operation. In some embodiments, the first and second images are generated using a scanner that captures the resulting magnetic field intensities. In various embodiments described in the present document with reference to FIGS. 1 to 7 and FIGS. 10 to 24, the first module and the second module may use the dual module (dm) VSASL technique described herein. For example, in some embodiment, a vascular crushing module (VCM) may be used, e.g., as described with reference to FIGS. 26 and 34.

1. Dual-Module Velocity-Selective Arterial Spin Labeling (Dm-VSASL) Embodiment Examples Velocity-selective arterial spin labeling (VSASL) is insensitivity to inhomogeneous transit times. It demonstrated great promise in clinical imaging of perfusion with long delays. Dual-module (dm-) VS saturation (dm-VSS) and VS inversion (VSI) preparation have been developed to improve the signal-to-noise ratio (SNR) efficiency of VSASL. However, the temporal SNR (tSNR) of VSASL methods was not satisfactory in practice. Though recent studies compared the tSNR of different VSASL methods without background suppression (BS), an investigation on the tSNR performance of VSASL with BG is of high interest to the community. A novel dual-module labeling strategy is introduced to enable dual-module labeling for both VSS and VSI with improved SNR efficiency.

The new dm-labeling strategy uses VS pulses that invert the stationary spins as the first VS module, and then switch the label/control condition in the second VS module to allow proper accumulation of ASL signal in the tissue. This results in a more balanced utility of VS gradients under the label/control conditions. See, e.g., FIG. 2, FIG. 3. This should reduce noise and artefacts from sources such as motion, eddy currents (EC) and diffusion.

In some embodiments, Sinc-VSI was used for dm-VSI labeling. For dm-VSS labeling, symmetric BIR-8 (sBIR8) pulse was used with a phase of 7 added to the last segment to invert the stationary spins ($VSS_{inv}$). $VSS_{inv}$ was also used when its inversion effect can be used for BS.

Four healthy human subjects (1F, age 23-38) were studied on a 3T scanner (Siemens Prisma, Erlangen, Germany). In addition to the ASL scans described in the other abstract, two dm-VSASL scans were performed with different levels of BS, resulting in 8 ASL scans: 1) PASL: FAIR Q2Tips, $TI_1$=0.8 s, TI=2.4 s, 2 BS pulses 1.4/0.42 s before imaging; 2) $VSS_{inv}$: TI=1.4 s, 1 BS pulse 0.48 s before imaging; 3) $VSS+VSS_{inv}$: $TI_{1/2}$=1.16/0.83 s, 1 BS pulse 0.26 s before imaging; 4) $VSS_{inv}+VSS_{inv}$ (BS1): $TI_{1/2}$=1.45/0.54 s, 2 BS pulses 0.37/0.25 s before imaging; 5) $VSS_{inv}$+VSS (BS2): $TI_{1/2}$=1.45/0.54 s, 1 BS pulse 0.28 s before imaging; 6) VSI: TI=1.4 s, 1 BS pulse 0.48 s before imaging; 7) VSI+VSI (BS1): $TI_{1/2}$=1.45/0.54 s, 2 BS pulses 0.37/0.25 s before imaging; 8) VSI+VSI (BS2): $TI_{1/2}$=1.45/0.54 s, 2 BS pulses 0.47/0.14 s before imaging.

1.1 Results

Figure 10:
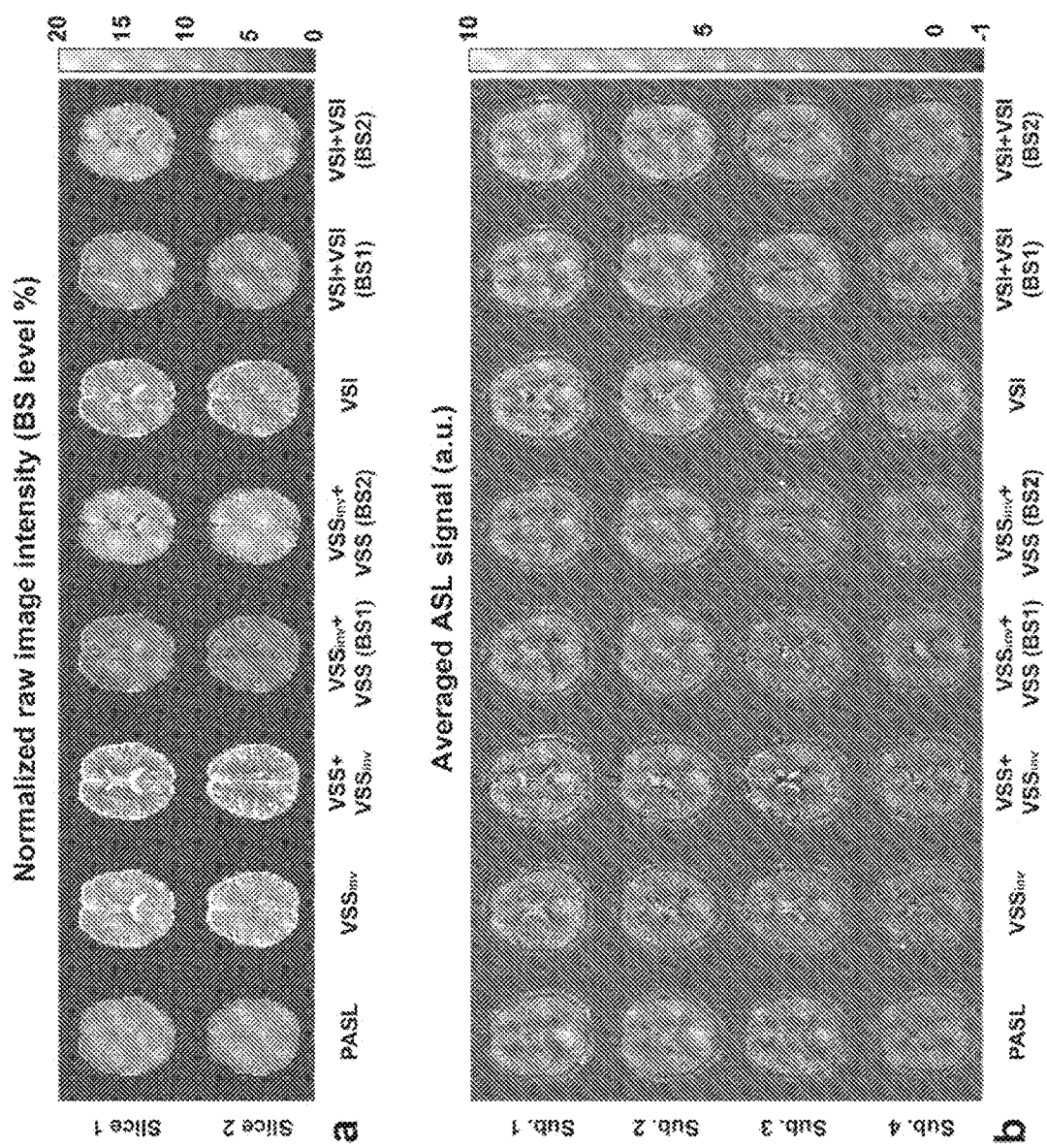
FIG. 10 shows an example of raw ASL images and averages ASL signal maps.

Examples of raw ASL images (top) and averaged ASL signal maps (bottom) are shown in FIG. 10. BS levels in gray matter (GM), white matter (WM) and cerebrospinal fluid (CSF) regions of interest (ROIs) were averaged across subjects and are reported in FIG. 11 table. Different levels of BS were achieved consistently across subjects. Note that the CSF signals in $VSS_{inv}$, $VSS+VSS_{inv}$ and VSI could not be sufficiently suppressed. The new dm-VSASL ($VSS_{inv}$+$VSS_{inv}$, $VSS_{inv}$+VSS and VSI+VSI) achieved sufficient suppression across all brain tissues.

Figure 12:
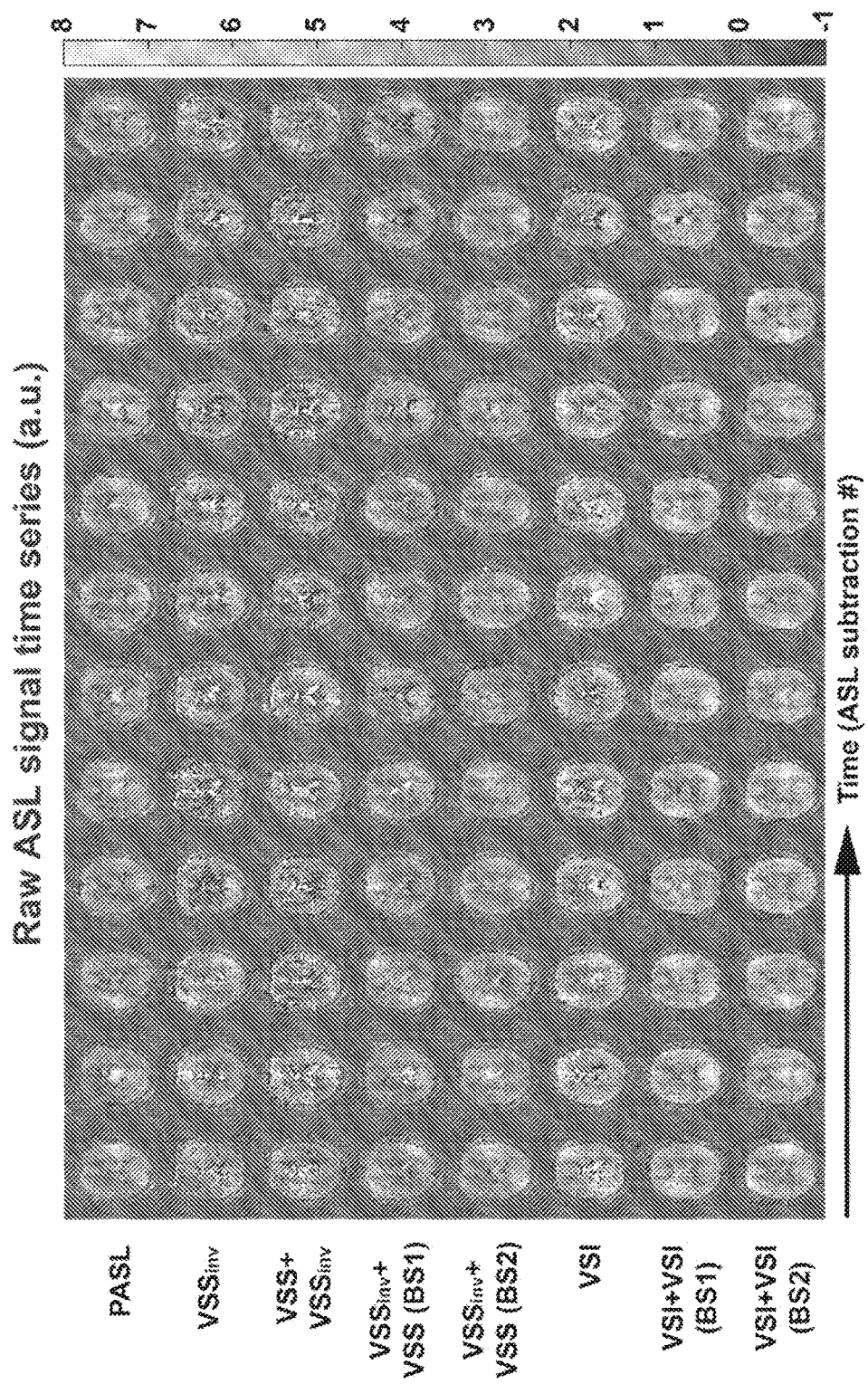
FIG. 12 shows an example of an ASL signal time series.

Examples of the ASL signal time series from a subject are shown in FIG. 12. High signal fluctuations were observed in regions where CSF signals were not sufficiently suppressed in sm-VSAL and $VSS+VSS_{inv}$. Though the fluctuations were mostly averaged out, there were erroneous ASL signals in voxels where CSF signals dominate, such as in the ventricles and around the sulci. In contrast, both the VSS- and VSI-based new dm-VSASL methods produced ASL signals with high temporal stability throughout the brain.

Figure 13:
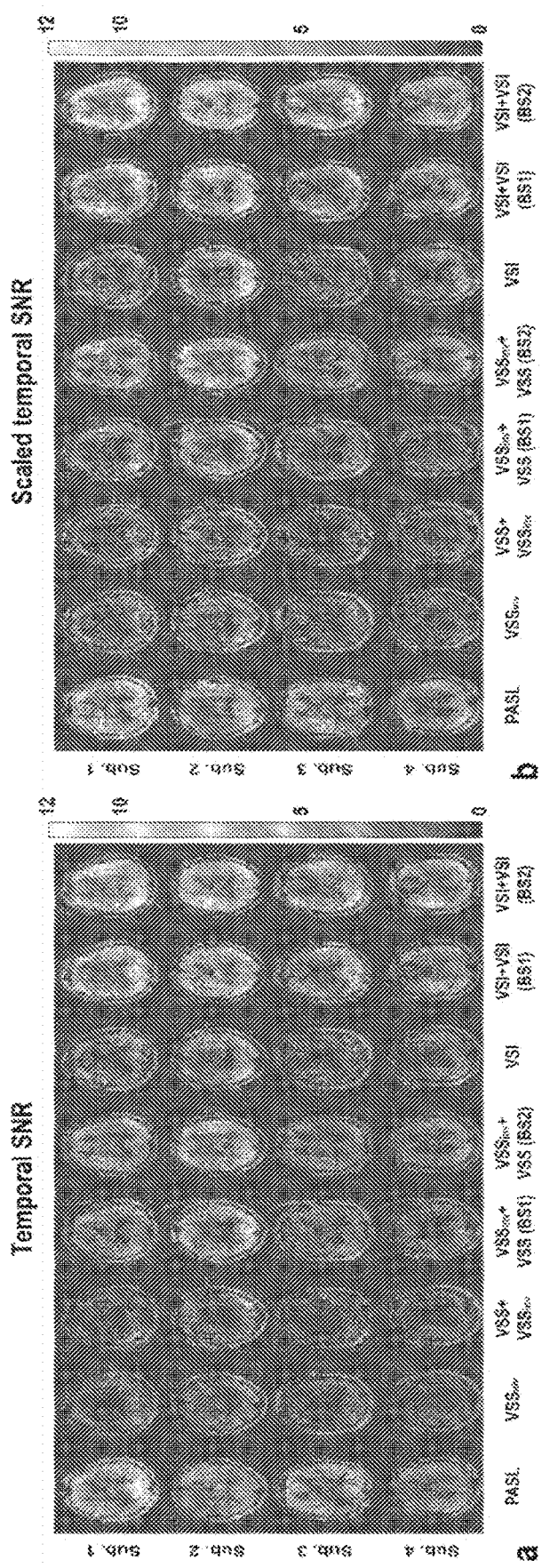
FIG. 13 shows an example of raw tSNR maps and the scaled counterparts.
Figure 14:
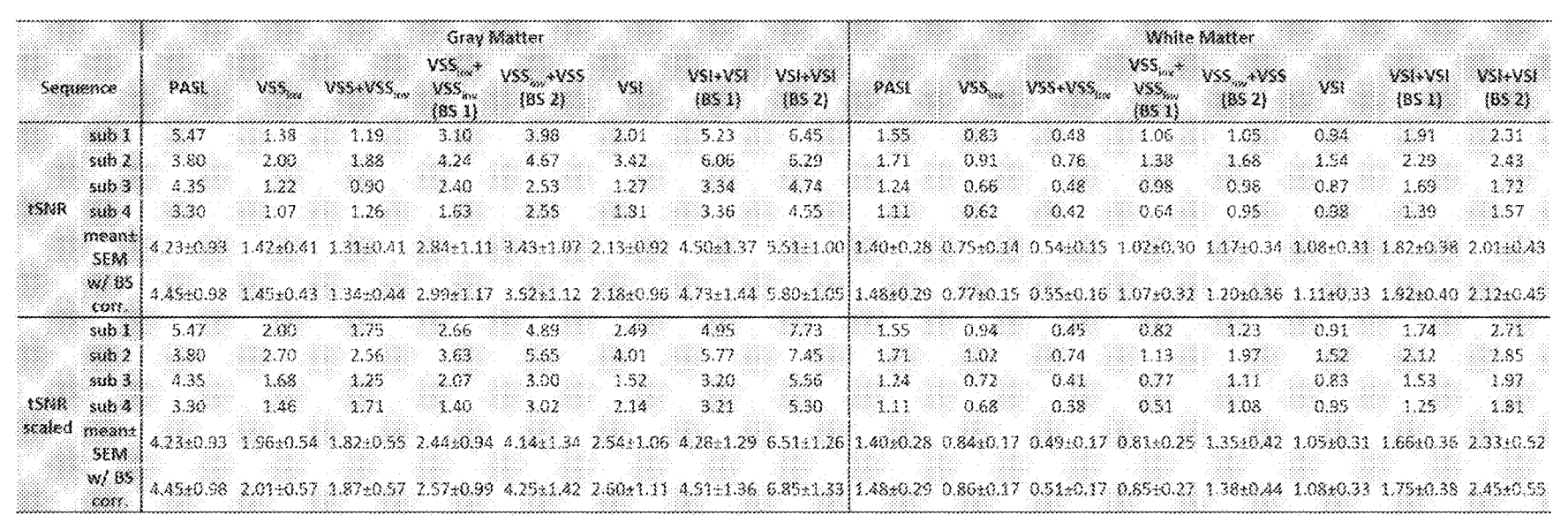

Raw tSNR maps and the scaled counterparts aiming to separate out the contribution from the efficacy of BS were calculated and are shown in FIG. 13, where tSNR and scaled tSNR are shown in the left and right images for different schemes. Averaged tSNR values in GM and WM ROIs were summarized in FIG. 14 table. Compared to the single-module counterparts, $VSS_{inv}$+VSS improved the tSNR by 142.2% (GM, p=0.011) and 55.2% (WM, p=0.044); and dm-VSI improved the tSNR by 165.6% (GM, p=0.003) and 90.5% (WM, p=0.010), at a more favorable BS level (BS2). After scaling, the improvements were 111.2% (GM, p=0.015) and 60.7% (WM, p=0.043) for $VSS_{inv}$+VSS; and 163.1% (GM, p=0.003) and 127.4% (WM, p=0.007) for dm-VSI.

1.2 Discussion

Dm-VSASL with BS2 (higher GM/WM and lower CSF signals) had a better tSNR improvement than with BS1 (lower GM/WM and higher CSF signals), indicating that CSF generates higher noise than GM/WM, and its suppression should be prioritized with BS.

The ASL signals in WM are less likely to be affected by noises from CSF. Consequently, the tSNR improvement in WM at similar BS levels, e.g., VSI+VSI (BS1) vs. VSI, indicated that the new dm-VSASL strategy likely reduced the noise from sources such as motion, diffusion and ECs.

The new dm-VSASL strategy provides two major advantages: 1) the inversion effect from the first VS module enables more flexibility in BS optimization, especially for suppressing CSF signals, which is more difficult to suppress given the timing constraints in VSASL; 2) the label/control condition flipping in the second VS module creates a more balanced distribution of VS gradients and diffusion weighting in the label/control conditions, reducing artefacts from sources mentioned above.

It will be appreciated that Dm-VSASL significantly improves the tSNR of VSASL. Combined with the SNR advantage of VSI, dm-VSI should be an excellent tool for imaging baseline and functional changes of perfusion.

2. Additional Implementation Examples and Experimental Results

2.1 Introduction

Velocity-selective ASL (VSASL) is insensitive to inhomogeneous arterial transit times (ATT) among ASL methods, offering an SNR advantage when ATT is long. VS saturation (VSS) based labeling has relatively low signal-to-noise ratio (SNR). Recent development on improving the SNR includes: 1) multi-module VSS preparation, and 2) VS inversion (VSI) preparation. An SNR improvement in the range of 20~30% compared to single-module (sm-) VSS based preparation has been reported using both methods. A novel labeling strategy is invented to enable dual-module (dm-) VSI labeling to further improve the SNR efficiency, which also benefits VSS labeling.

2.2 Theory and Methods

Figure 15:
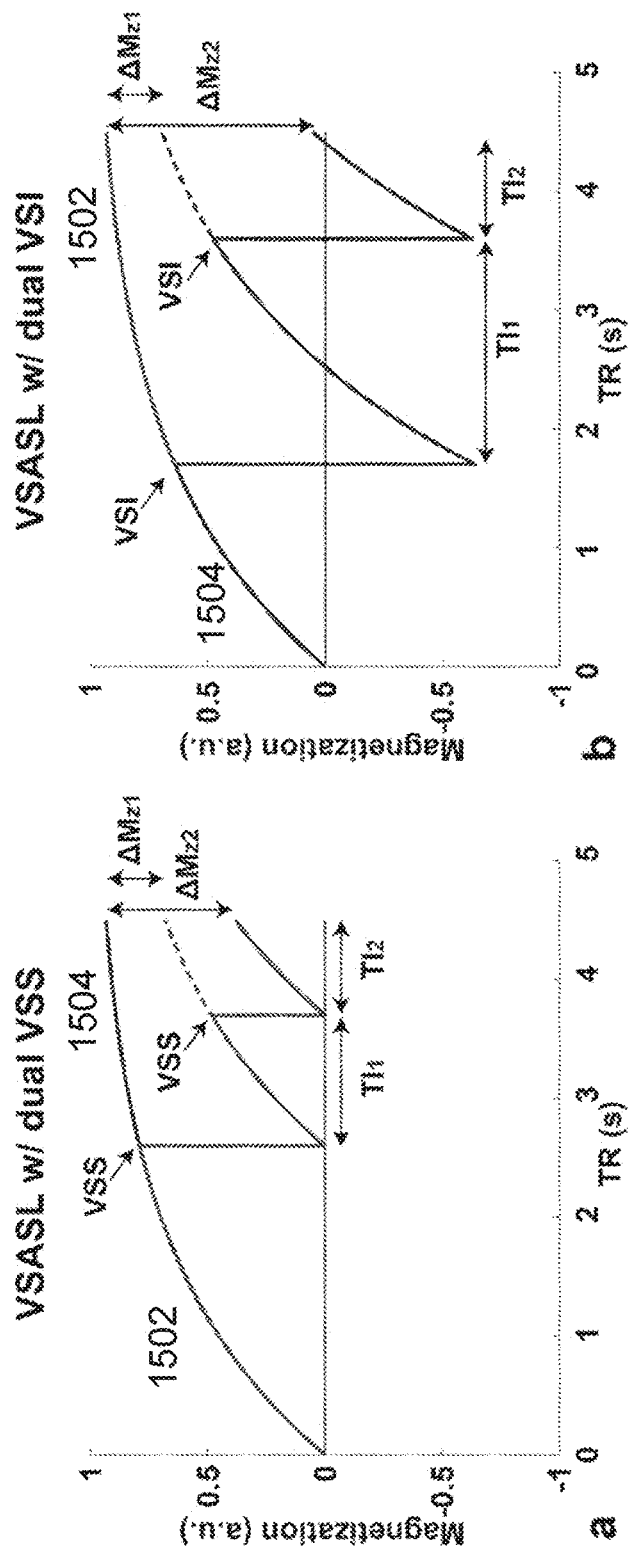
FIG. 15 shows an example of evolution of the magnetization for dual-VSS and dual-VSI.

Similar to the dm-VSS preparation, two groups of spins are considered for dm-VSI: 1) one labeled by only the first VS module; 2) one labeled by both VS modules. The evolution of the magnetization for dual-VSS and dual-VSI is shown in FIG. 15, and $Sig_{ASL} \propto \Delta M_{z1} \cdot TI_1 + \Delta M_{z2} \cdot TI_2$. In FIG. 15, left graph, magnetization (vertical axis) as a function of TR (horizontal axis) is shown for VSASL with dual VSS, while the right graph shows magnetization as a function of TR for VSASL with dual VSI.

Dm-VSI labeling: VSI pulses invert the stationary spins, therefore flipping the label/control condition in the second VSI is required to avoid signal canceling. Additional benefits include: 1) the sensitivity to motion, diffusion attenuation and eddy current (EC) effects are better balanced in the label/control images, potentially reducing artefacts and improving quantification accuracy; 2) the inversion effects allow more efficient background suppression (BS).

Dm-VSS labeling: 1) VSS+VSS as described previously; 2) $VSS_{inv}$+VSS or $VSS_{inv}$+$VSS_{inv}$ to allow a more balanced label/control design as described above. $VSS_{inv}$ can be implemented in several ways, such as adding a phase of 7 to the last segment of the symmetric BIR-8 (sBIR8) pulse.

Dm-VSASL using VSS and VSI: VSS+VSI, VSI+VSS and their inverted variants. Label/control condition should be flipped in the second VS module when necessary.

2.3 Modeling and Simulation

A kinetic ASL model was used to model the ASL signals, including Pulsed ASL (PASL) and Pseudo-Continuous ASL (PCASL). The SNR efficiency, $Sig_{ASL}/\sqrt{2TR}$, was evaluated with and without $T_2$ relaxation for VSASL, and realistic labeling efficiencies for PASL and PCASL. The maximal bolus durations were: 2 s for VSASL, 1 s for PASL and unlimited for PCASL.

2.4 In Vivo Experiments

Four healthy human subjects (1F, age 23-38) were studied on a 3T scanner (Siemens Prisma, Erlangen, Germany)

under an IRB approval. Symmetric BIR-8 and sinc-VSI pulses were used for VSS and VSI labeling, respectively. ASL scans were acquired in a randomized order with BS: 1) PASL: FAIR Q2Tips, $TI_1$=0.8 s, TI=2.4 s, 2 BS pulses; 2) $VSS_{inv}$: TI=1.4 s, 1 BS pulses; 3) VSS+$VSS_{inv}$: $TI_{1/2}$=1.16/0.83 s, 1 BS pulses; 4) $VSS_{inv}$+VSS: $TI_{1/2}$=1.45/0.54 s, 1 BS pulses; 5) VSI: TI=1.4 s, 1 BS pulses; 6) VSI+VSI: $TI_{1/2}$=1.45/0.54 s, 2 BS pulses. Other parameters were: 2-interleaved 3D gradient and spin echo (GRASE) echo planar imaging EPI readout, field of view FOV=220×220 mm (64×64), 24 slices, 4 mm thickness, TR=4 s (PASL) and 5 s (VSASL), 15 and 12 label/control pairs for PASL and VSASL, cutoff velocity=2 cm/s along S/I in VSASL. Reference images were acquired for quantification.

2.5 Results

SNR efficiencies of different ASL methods from simulation are shown in FIG. 16. Compared to sm-VSI, the maximal SNR efficiency of dm-VSI was increased by 11.8% without $T_2$ relaxation; and was the same with $T_2$ relaxation. Maximal ASL SNR efficiencies at TRs from 2 to 8 s and an imaging time of 0.5 s: a) the labeling efficiency (a) was 1 for all; b) with $T_2$ relaxation for VS labeling (effective TE of 20 ms and 30 ms for VSS and VSI, respectively), and a=0.85 and 0.98 for PCASL and PASL, respectively. The labeling timings were optimized for optimal SNR efficiency at each TR. The PLDs were 1.8 s and 1.6 s for PCASL and PASL, respectively. $T_1$ of 1660 ms and $T_2$ of 150 ms were assumed for arterial blood.

Figure 17:
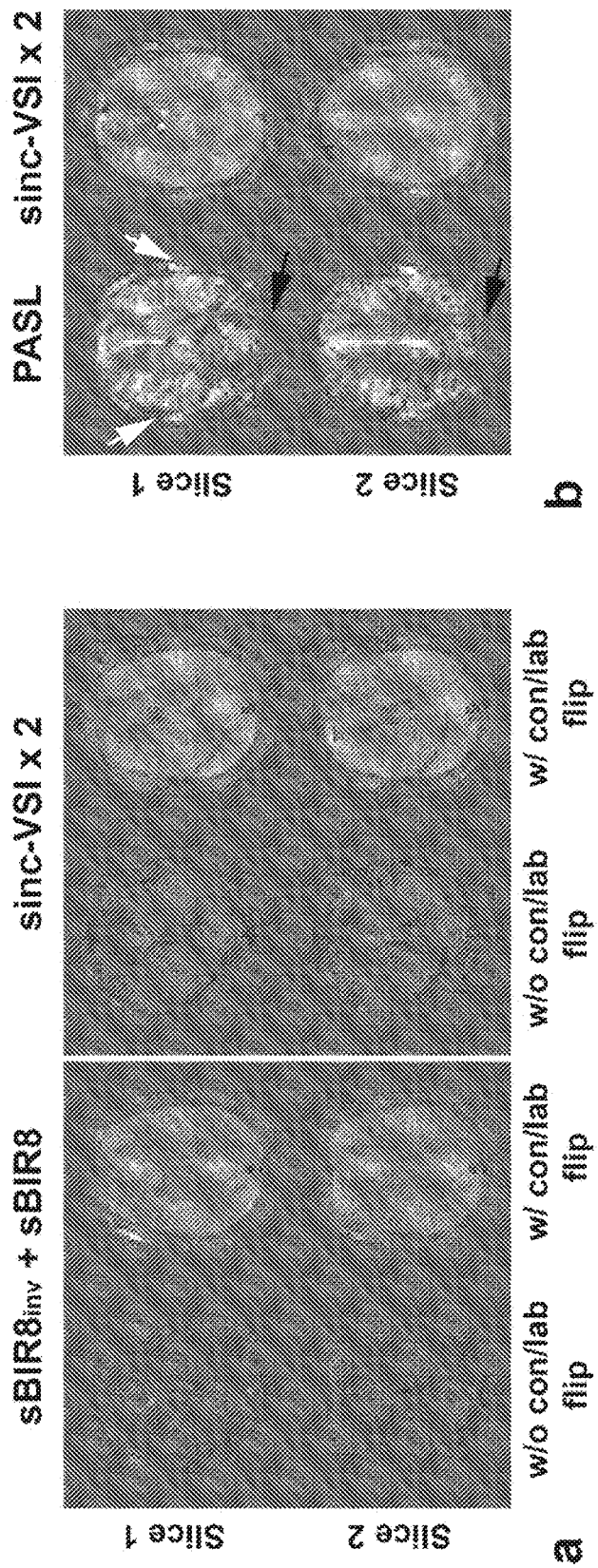
FIG. 17 shows additional examples of implementation of dual-module VS labeling and the transit-delay insensitivity of VSASL labeling.

FIG. 17 (left graph) demonstrates the necessity of the label/control flipping in the second VS module in $VSS_{inv}$+VSS and VSI+VSI. FIG. 17 (right graph) shows ATT artefacts with PASL in an early testing in a subject, while VSASL demonstrated excellent ATT insensitivity. a) ASL images without and with control/label condition flipping in the second VS module; b) transit artefacts with PASL acquisition in sub. 3 ($TI_1$=0.8 s and TI=2 s, delayed perfusion and intravascular ASL signals are labeled with black and white arrows, respectively), but not with any of the VS labeling methods (only one example is shown). A later PASL scan with a longer TI of 2.4 s (FIG. 18) and angiography confirmed that the flow was delayed due to tortuous vasculature.

Figure 18:
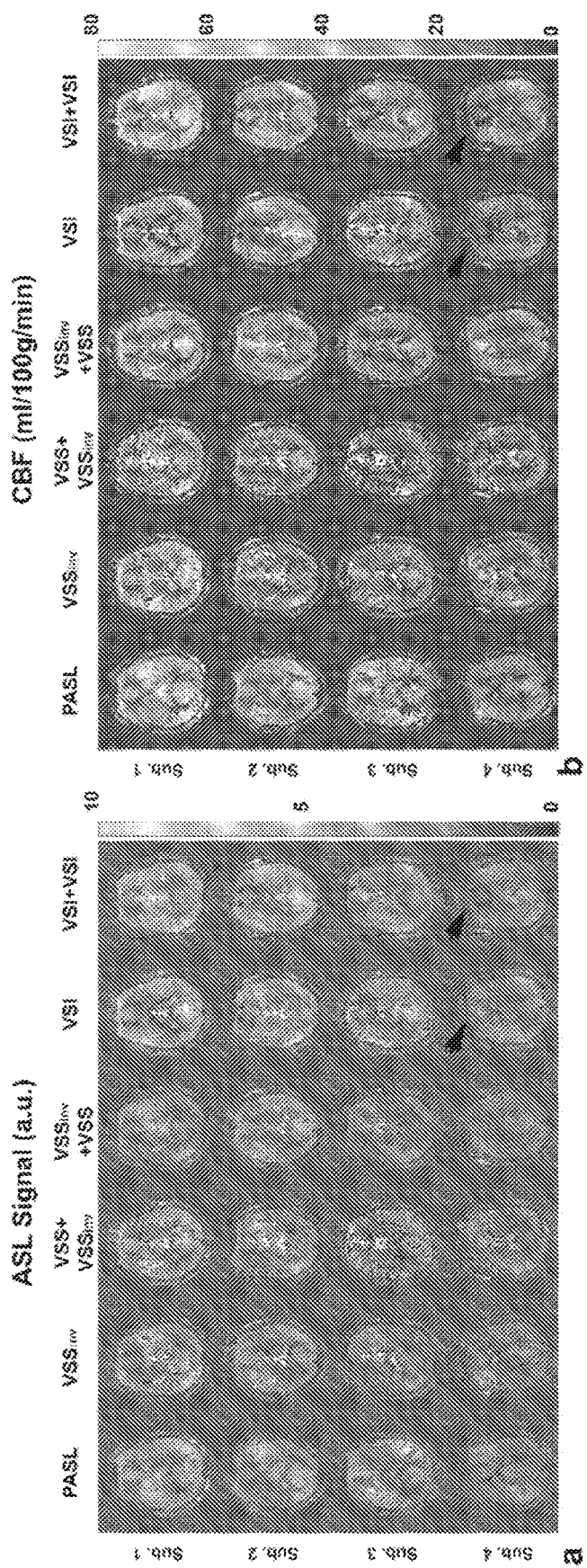
FIG. 18 shows an example of normalized ASL signal and cerebral blood flow (CBF) maps.

Normalized ASL signal and cerebral blood flow (CBF) maps are shown in FIG. 18. Averaged values in gray matter (GM) and white matter (WM) are summarized in FIG. 19. After correcting for the signal attenuation from BS (5% reduction each), dm-VSI produced the highest signal in GM, followed by sm-VSI, and VSS+$VSS_{inv}$. Dm-VSI showed a trend of increasing the signal by 6.6% (p=0.062) compared to sm-VSI labeling; VSS+$VSS_{inv}$ increased ASL signal by 24.4% (p=0.025) compared to sm-VSS, consistent with previous findings; $VSS_{inv}$+VSS showed a marginal increase of 2.4% (p=0.91). Dm-VSI and sm-VSI increased ASL signal by 50% (p<0.01) compared to sm-VSS. There was no significant difference in CBF between labeling methods (p=0.19 in GM, and p=0.070 in WM). In addition, the temporal SNR was doubled with dm-VSASL in GM (details reported in another abstract). A regional ASL signal reduction was observed in sub. 4 using VSI labeling (FIG. 18).

FIG. 18 shows examples of normalized ASL signal (as a percentage of the reference signal to allow inter-subject comparison) and corresponding CBF maps from human subjects. The ASL signal in the anterior region in sub. 4 was slightly lower using VSI labeling (black arrows), possibly due to its sensitivity to field inhomogeneities.

Table in FIG. 19 shows measured ASL signals (normalized to percentages of the reference scan) and CBF (ml/100 g/min) in gray and white matters in vivo. The raw ASL signals corrected for the background suppression (BS) attenuation were also shown. For visual clarity, only mean values were shown for individual subjects.

2.6 Discussion

For dm-VSI vs. sm-VSI, in vivo experiments measured a signal increase of 6.6%, higher than that predicted by simulation, likely due to an improved overall labeling process. Sinc-VSI is preferred to rect-VSI because of a shorter effective TE (eTE, 29.4 ms vs. 37.6 ms using the same timings in the study). Further reduction of eTE should increase the SNR advantage of dm-VSASL.

It is important to arrange VS modules properly to accumulate ASL signals constructively. It is required to flip the label/control condition in the second VS module if the first one inverts stationary spins. This can help reduced diffusion attenuation/EC artifacts. Consistent with the findings in a recent study, further reduction of the sensitivity to field inhomogeneities is needed for VSI pulses.

Dual-module VSS and VSI can be implemented with improved SNR efficiency and/or temporal SNR with potentially reduced artefacts, may be a preferred VSASL labeling strategy for clinical applications.

FIG. 15 shows an example of evolution of the magnetization of the moving spins under the label (1502) and the control (1504) conditions for dual-module VSS (a) and dual-module VSI (b) preparations. Under the label condition, the spins labeled by only the first VS module and by both VS modules follow the red solid and red dashed lines, respectively. Note that for simplicity and visual clarity, the inversion effect on $\Delta M_{z1}$ from the second VSI module is not shown in (b).

FIG. 16 shows an example of Maximal ASL SNR efficiencies at TRs from 2 to 8 s and an imaging time of 0.5 s: a) the labeling efficiency (α) was 1 for all; b) with $T_2$ relaxation for VS labeling (effective TE of 20 ms and 30 ms for VSS and VSI, respectively), and α=0.85 and 0.98 for PCASL and PASL, respectively. The labeling timings were optimized for optimal SNR efficiency at each TR. The PLDs were 1.8 s and 1.6 s for PCASL and PASL, respectively. $T_1$ of 1660 ms and $T_2$ of 150 ms were assumed for arterial blood. In the left graph, at the right end, the curves from top to bottom are for: VSI+VSI, VSI+VSS, VSI, VSS+VSI, PCASL-PLD-1.8 s, VSS+VSS, $VSS_{inv}$+VSS, VSS and PASL-PLD-1.6 s. In the right graph, at the right end, the curves from top to bottom are for: VSI, VSI+VSI, PCASL-PLD-1.8 s, VSI+VSS, VSS+VSI, VSS+VSS, VSS, $VSS_{inv}$+VSS, PASL-PLD-1.6 s.

FIG. 17 (left graphs) show examples of ASL images without and with control/label condition flipping in the second VS module; b) transit artefacts with PASL acquisition in sub. 3 ($TI_1$=0.8 s and TI=2 s, delayed perfusion and intravascular ASL signals are labeled with black and white arrows, respectively), but not with any of the VS labeling methods (only one example is shown). A later PASL scan with a longer TI of 2.4 s (FIG. 18) and angiography confirmed that the flow was delayed due to tortuous vasculature.

3. Details of ASL and VSASL Technologies

FIGS. 20 to 33 provides additional information regarding VSASL, and in particular, MRI imaging using multiple VSS modules.

Figure 20:
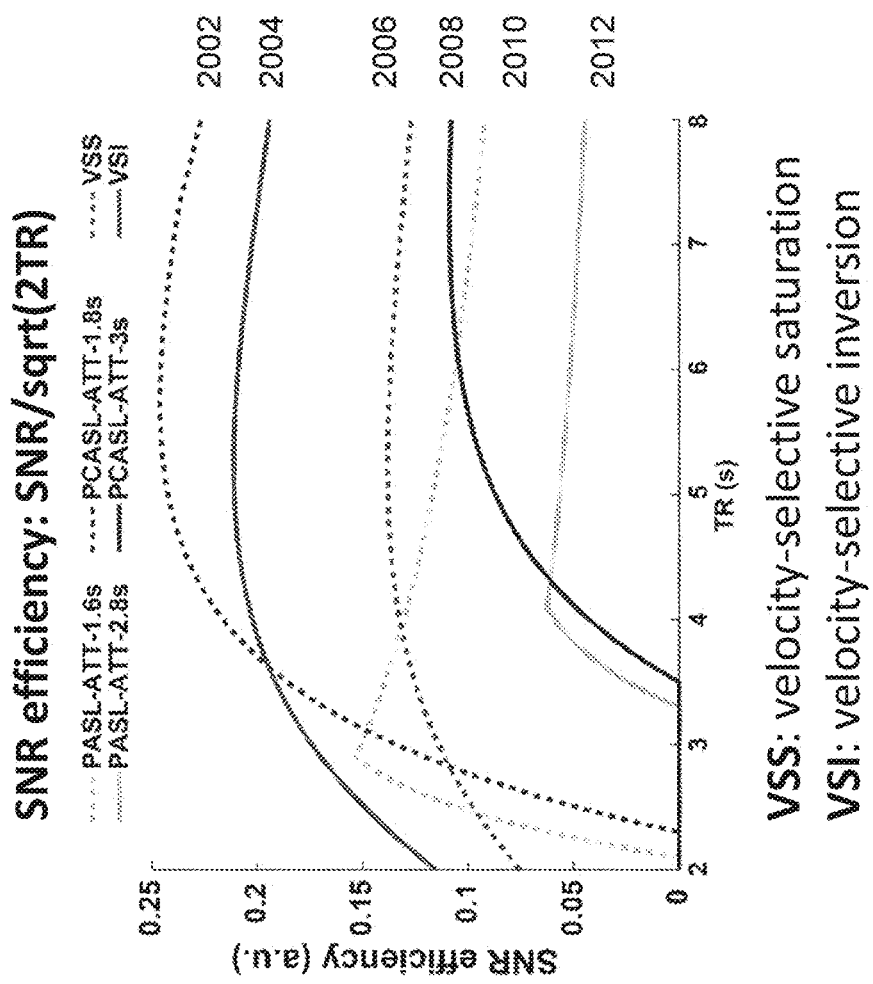
FIG. 20 is a graph showing examples of SNR efficiencies of various methods.

As depicted in FIG. 20, Velocity-selective arterial spin labeling (VSASL) 1 is insensitivity to inhomogeneous arterial transit times (ATT) and has an SNR advantage when ATTs are long. However, artefacts/errors reduce its robustness and accuracy, hindering its clinical adoption Due to motion, eddy currents (ECs) and diffusion attenuation, esp. w/CSF Low temporal SNR (tSNR). The present document discloses a dual-module labeling to overcome these challenges with improved SNR efficiency and tSNR. The various curves are: PCASL-ATT-1.8 s (2002), VSI (2004), VSS (2006), PCASL-ATT-3s (2008)T, PCASL-ATT-1.6 s (2010), PCASL-ATT-2.8 s (2012).

Figure 21:
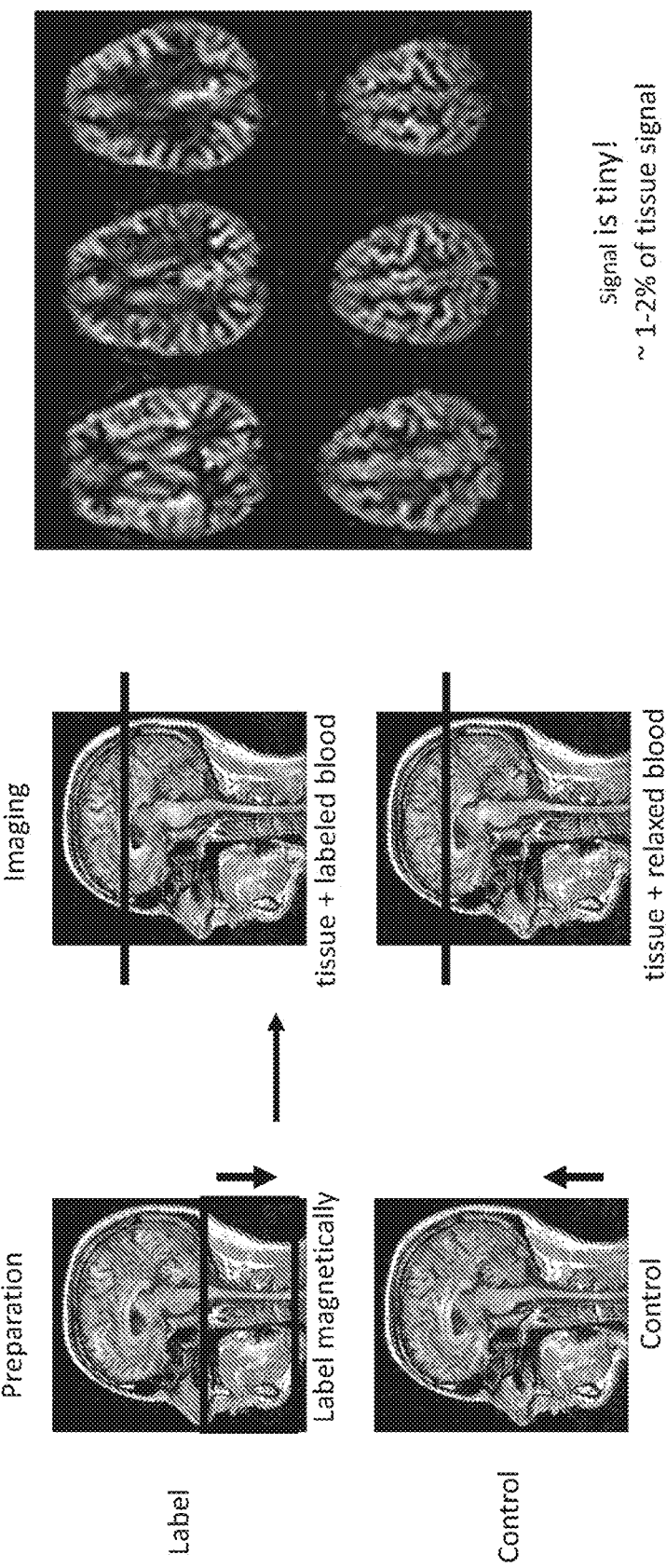
FIG. 21 is an example illustration of how ASL works.

FIG. 21 depicts an example illustrating how ASL works. Using arterial blood water as endogenous contrast agent—Non-invasive, diffusable, sensitive to perfusion, short-lived (T1 of blood). As depicted in FIG. 21, ASL signal is a combination of control minus label and is sensitive to perfusion (ASL Signal=Control−Label ∝Perfusion).

Figure 22:
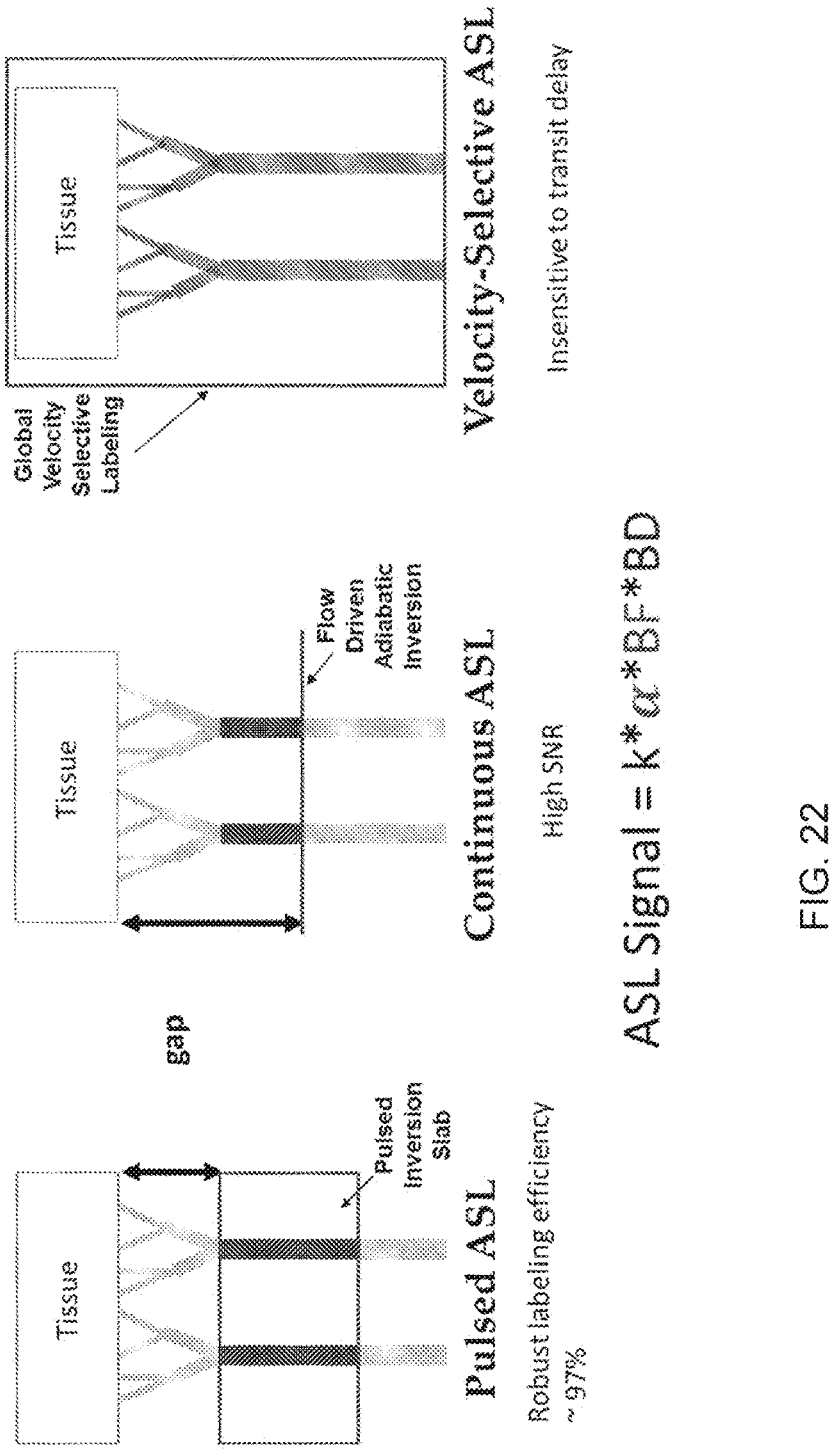
FIG. 22 illustrates three categories of ASL.

FIG. 22 is an illustration of three categories of ASL. On left, pulsed ASL example is shown that includes pulsed inversion slab. In the middle, a continuous ASL example is shown with flow-driven adiabatic inversion. Such an ASL is characterized by high SNR. On the right, velocity selective ASL example is depicted to include global velocity selective labeling, that exhibits insensitivity to transit delays. Here, ASL Signal=k*α*BF*BD.

Figure 23:
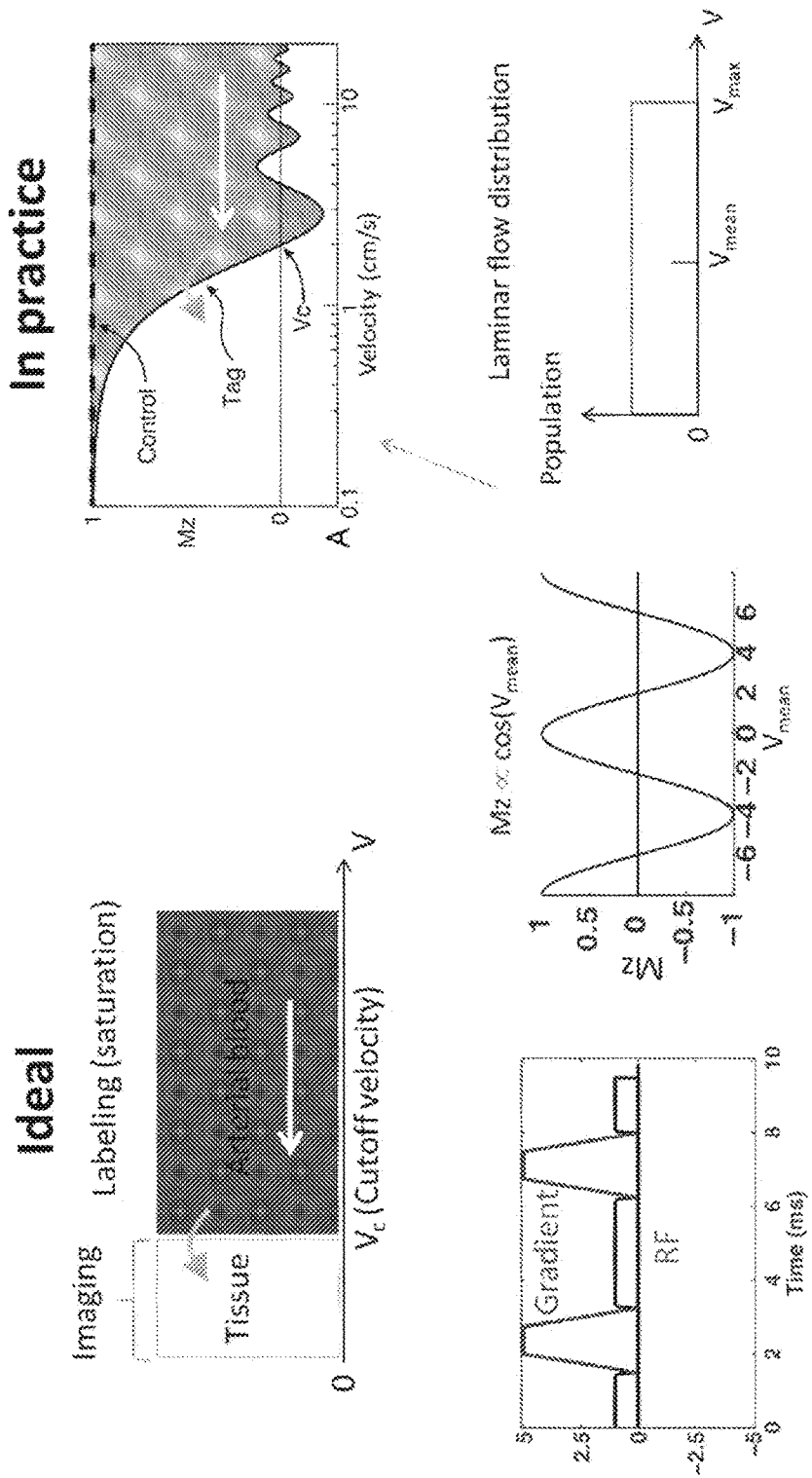
FIG. 23 is a graphical illustration of how VSASL works.

FIG. 23 is a graphical explanation of the VSASL technique.

Figure 24:
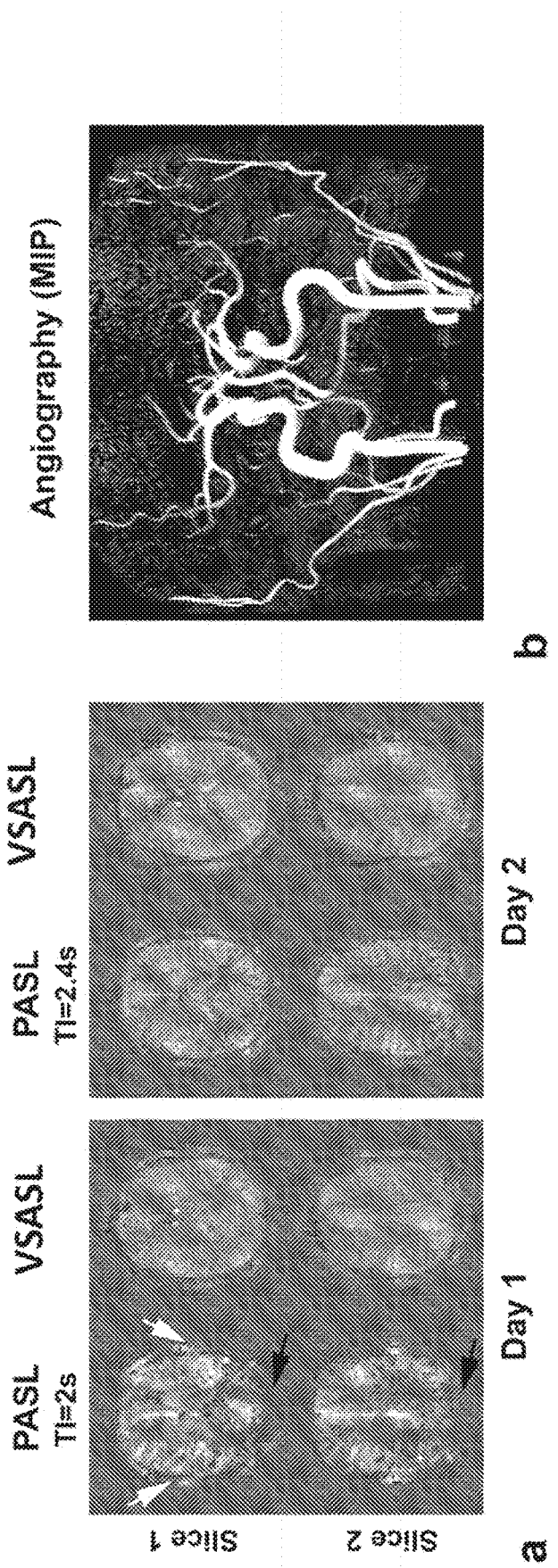
FIG. 24 shows some example results using VSASL depicting insensitivity to arterial transit artefacts.

FIG. 24 shows some example results using VSASL depicting insensitivity to arterial transit artefacts.

Figure 25:
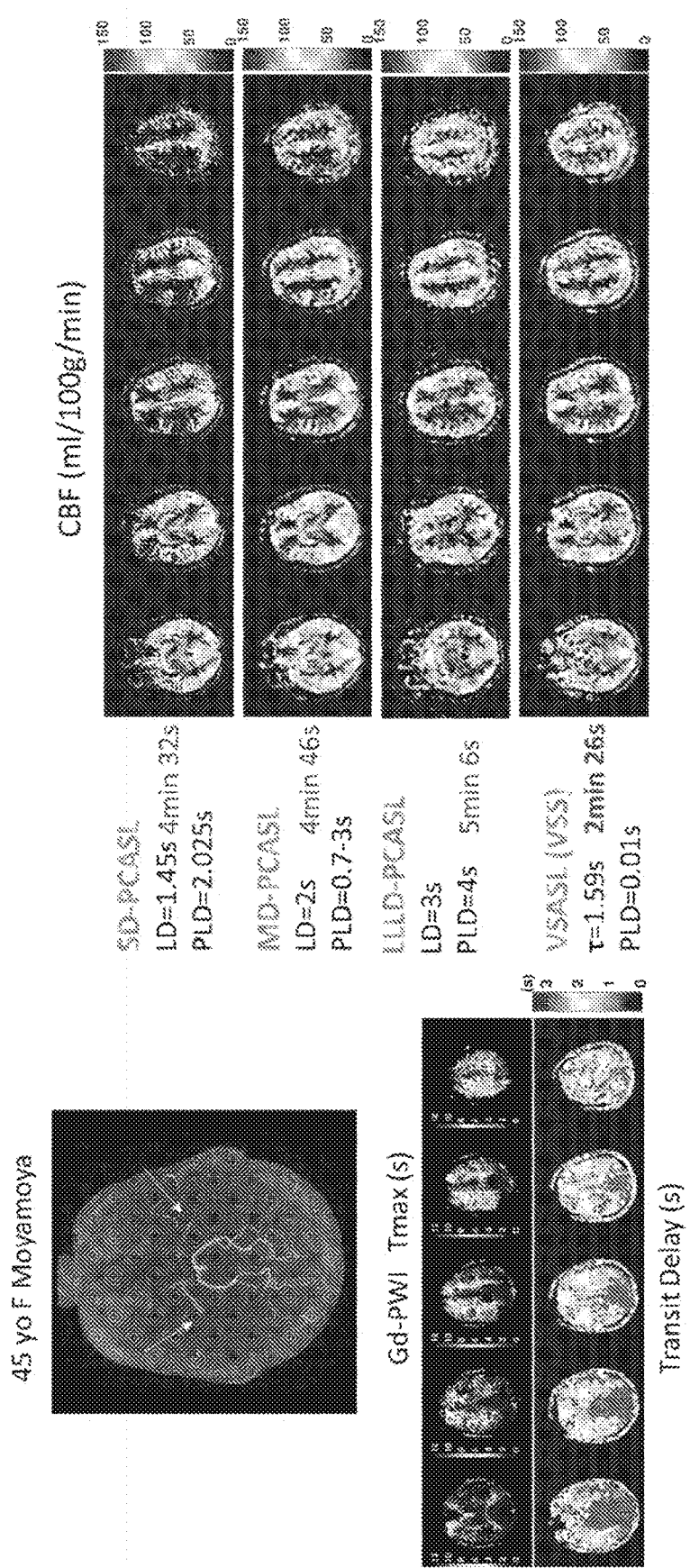
FIG. 25 shows an example demonstrating that VSASL is more SNR efficient at imaging delayed flow.

FIG. 25 shows an example demonstrating that VSASL is more SNR efficient at imaging delayed flow.

Figure 26:
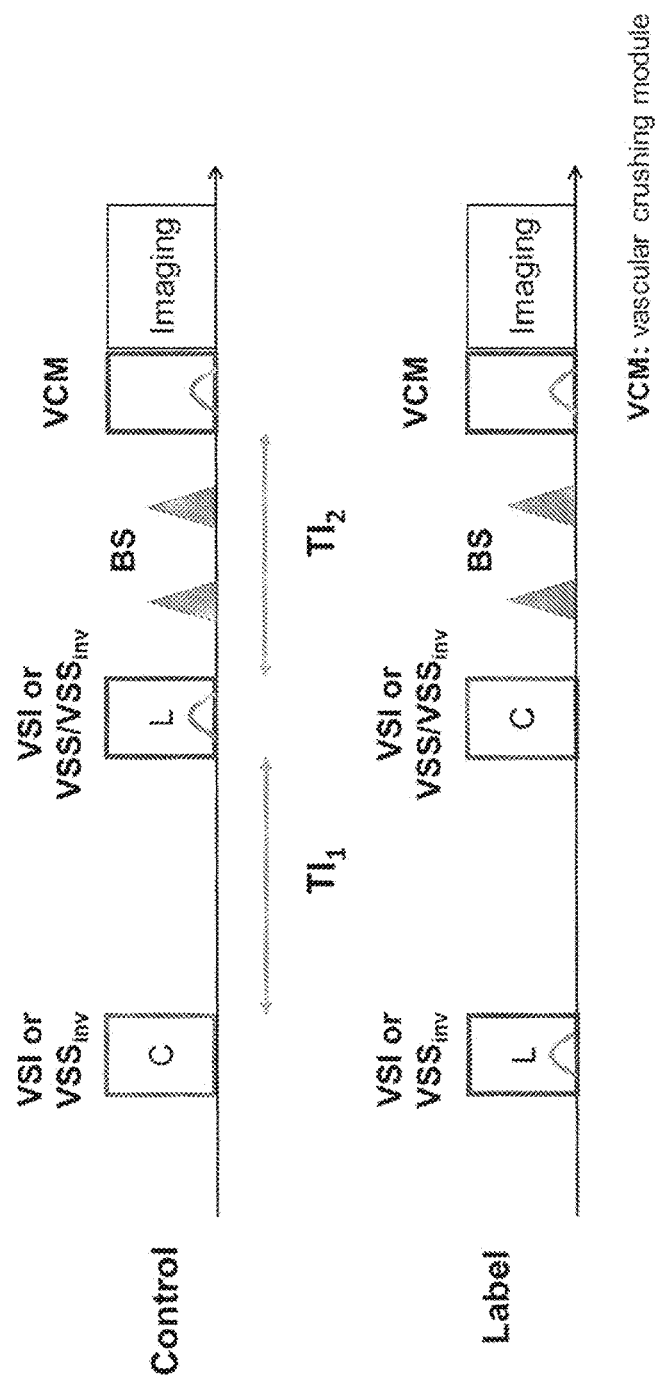
FIG. 26 shows an example of the proposed dual-module VS labeling.

FIG. 26 shows an example of the proposed dual-module VS labeling. The top graph shows application of control pulses. A first module is a VSS or a $VSS_{inv}$ module, followed by a VSI or $VSS/VSS_{inv}$ module with a TI1 time separation. After TI2 time, a VCM module may be applied. During the TI2 interval background suppression pulses may be applied. The lower graph shows labeling scheme (time coincident with the top graph). First label module may be a VSI or VSSin module, followed by a VSI or $VSS/VSS_{inv}$ module. At the end of the VCM module, imaging may be performed to obtain MRI images.

Figure 27:
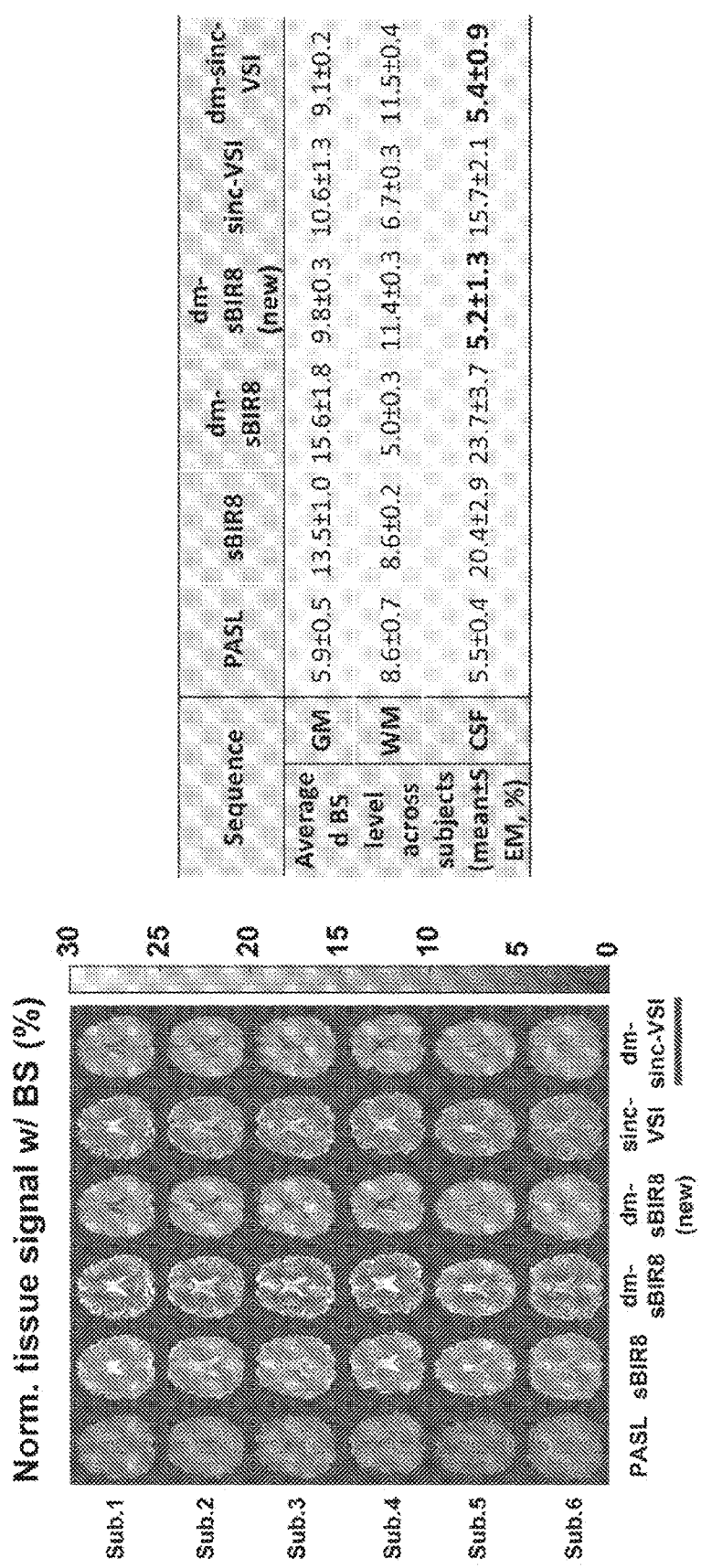
FIG. 27 shows results of background tissue signal suppression obtained in some experiments.

FIG. 27 shows results obtained in some experiments. The graph on the left shows that the proposed technique enables efficient background suppression. Numerical values of the obtained results are shown in the table on the right. The superiority of the presently disclosed technique is established by the results presented in columns labeled dm-sBIR8 and dm sinc-VSI.

Figure 28:
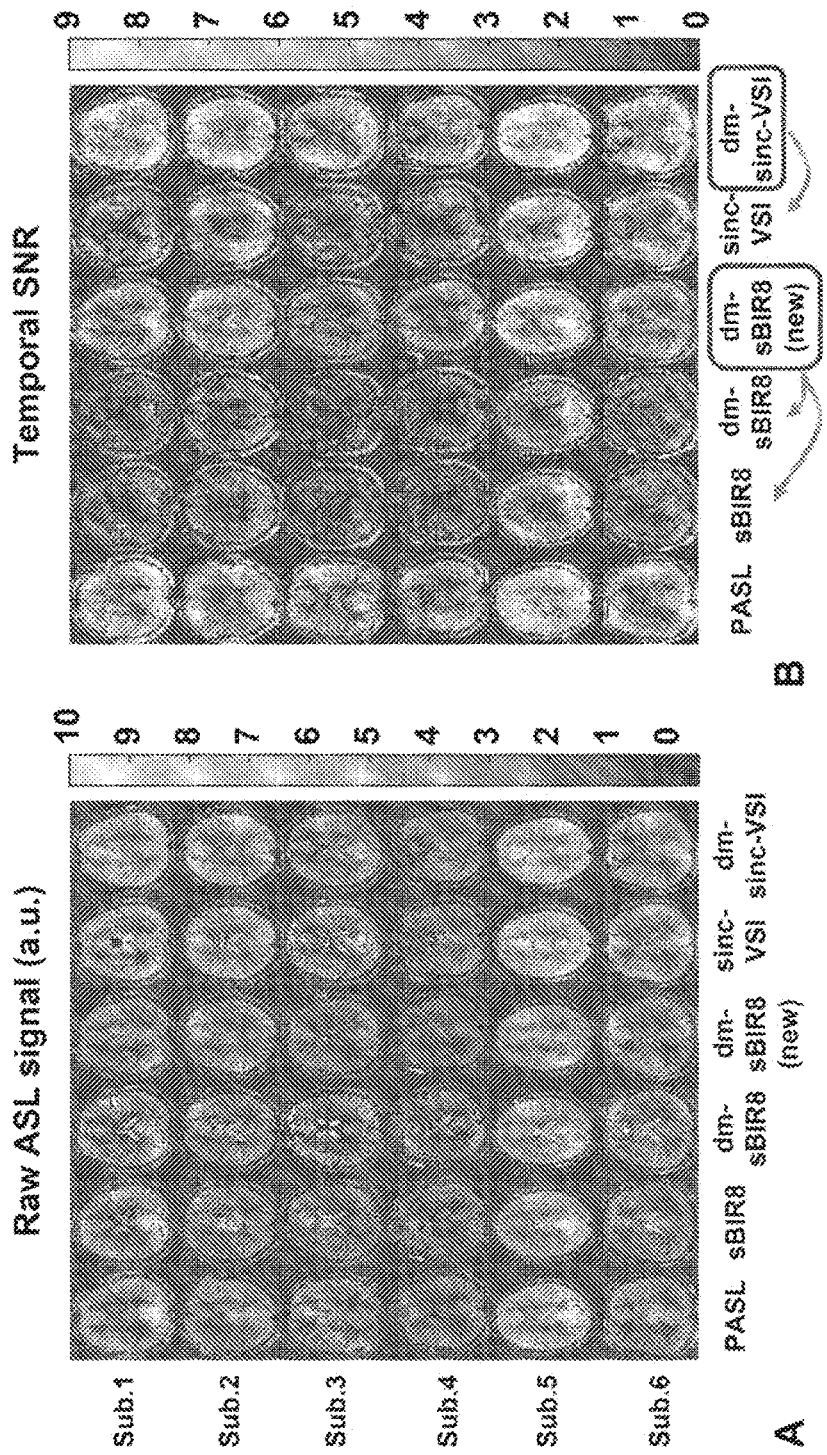
FIG. 28 shows example results obtained for ASL and tSNR using the proposed techniques (boxed results on the right graph).

FIG. 28 shows example results obtained for ASL and tSNR using the proposed techniques (boxed results on the right graph). The superiority of the presently disclosed technique is established by the results presented in columns labeled dm-sBIR8 and dm sinc-VSI.

Figure 29:
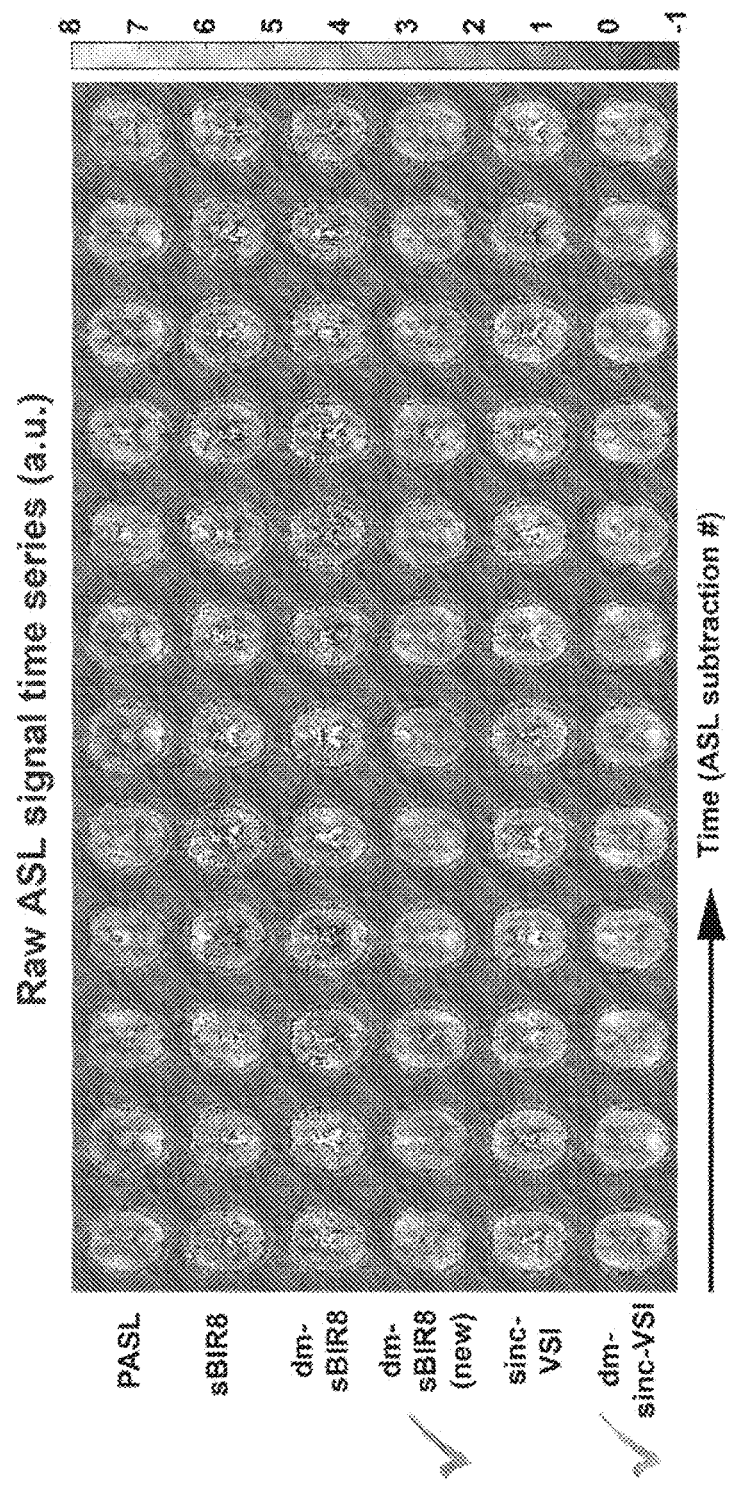
FIG. 29 shows some results illustrating raw ASL time series examples.

FIG. 29 shows some results illustrating raw ASL time series examples. The graph demonstrates visual superiority of dm-sBIR8 and dm-sinc-VSI schemes.

Figure 30:
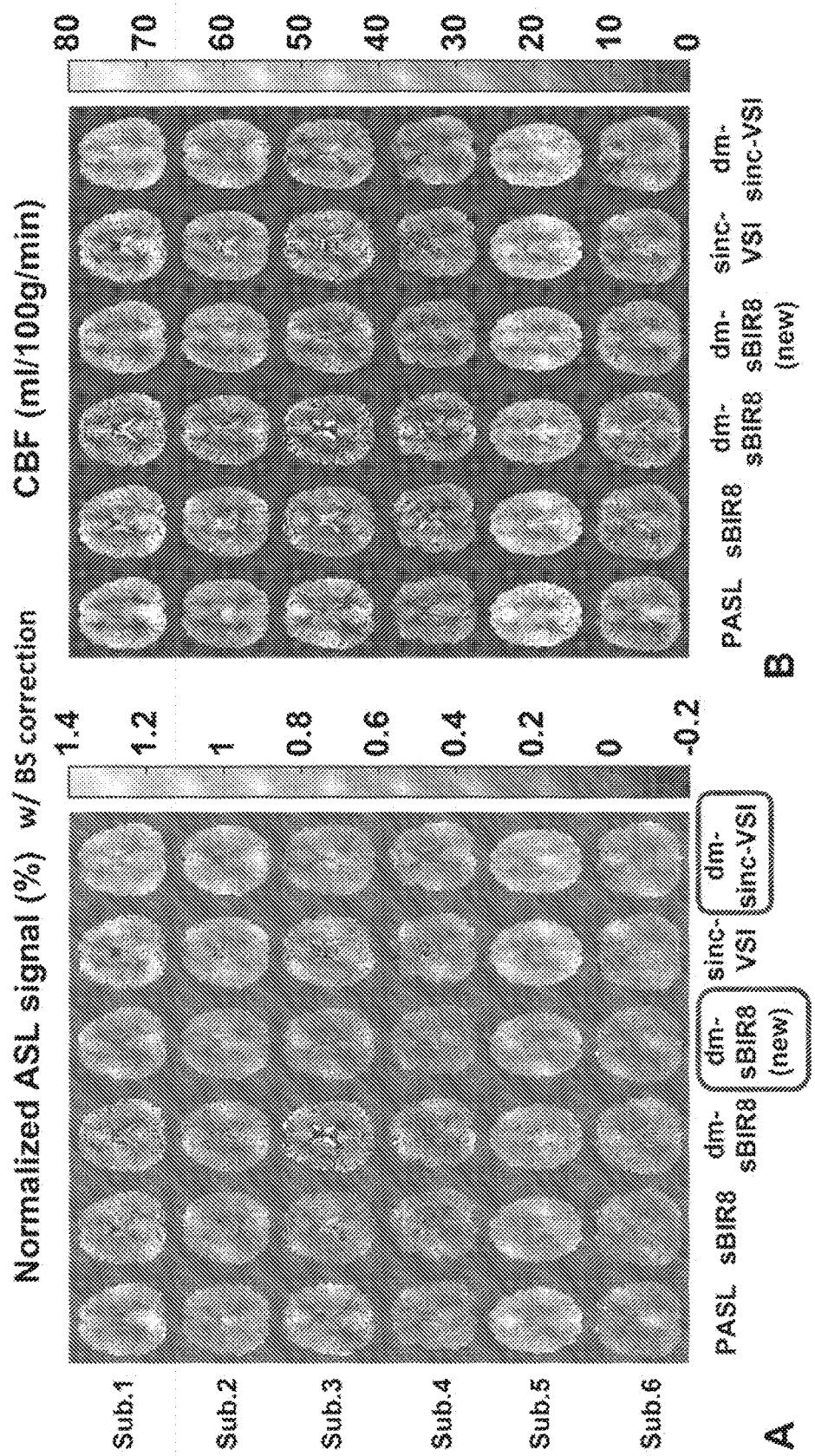
FIG. 30 is a graphical representation of results obtained for ASL signal and CBF in some experiments.

FIG. 30 is a graphical representation of results obtained for ASL signal and CBF in some experiments. The superiority of the presently disclosed technique is established by the results presented in columns labeled dm-sBIR8 and dm sinc-VSI.

Figure 31:
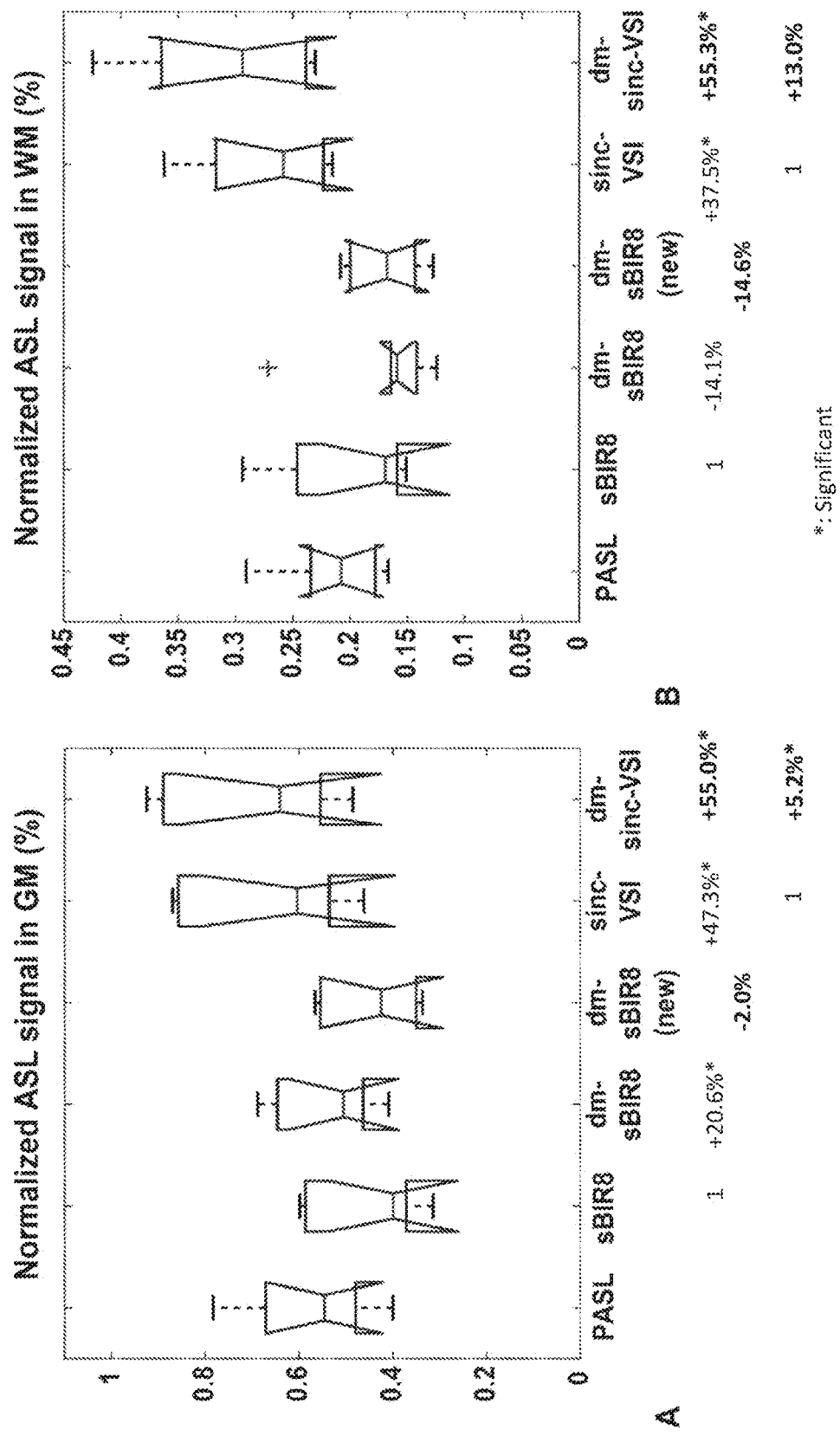
FIG. 31 depicts boxplots of experimental results for mean ASL signals. As can be seen from the graphs, a significant amount of improvement in both GM ASL signal and WM ASL signal for the proposed dual-module VS labeling compared to single-module labeling.

FIG. 31 depicts boxplot of experimental results for mean ASL signals. As can be seen from the graphs, a significant amount of improvement in both tSNR of GM ASL signal and tSNR of WM ASL signal for the proposed dm modes.

Figure 32:
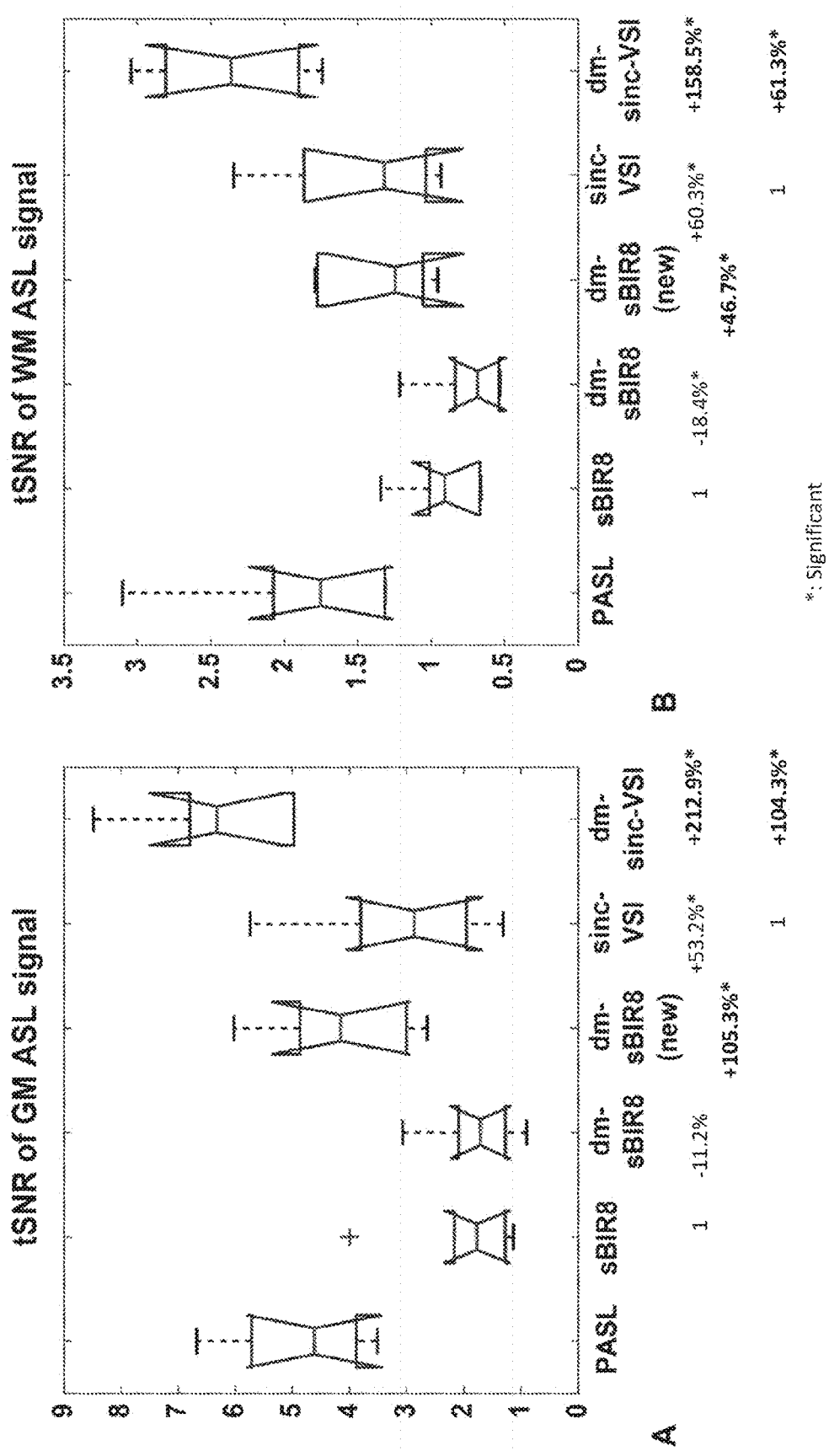
FIG. 32 depicts boxplots for experimental results for mean tSNR. As can be seen from the graphs, a significant amount of improvement in both tSNR of GM ASL signal and tSNR of WM ASL signal for the proposed dual-module VS labeling compared to single-module labeling.

FIG. 32 depicts boxplot for experimental results for mean tSNR. As can be seen from the graphs, a significant amount of improvement in both tSNR of GM ASL signal and tSNR of WM ASL signal for the proposed dm modes.

Figure 33:
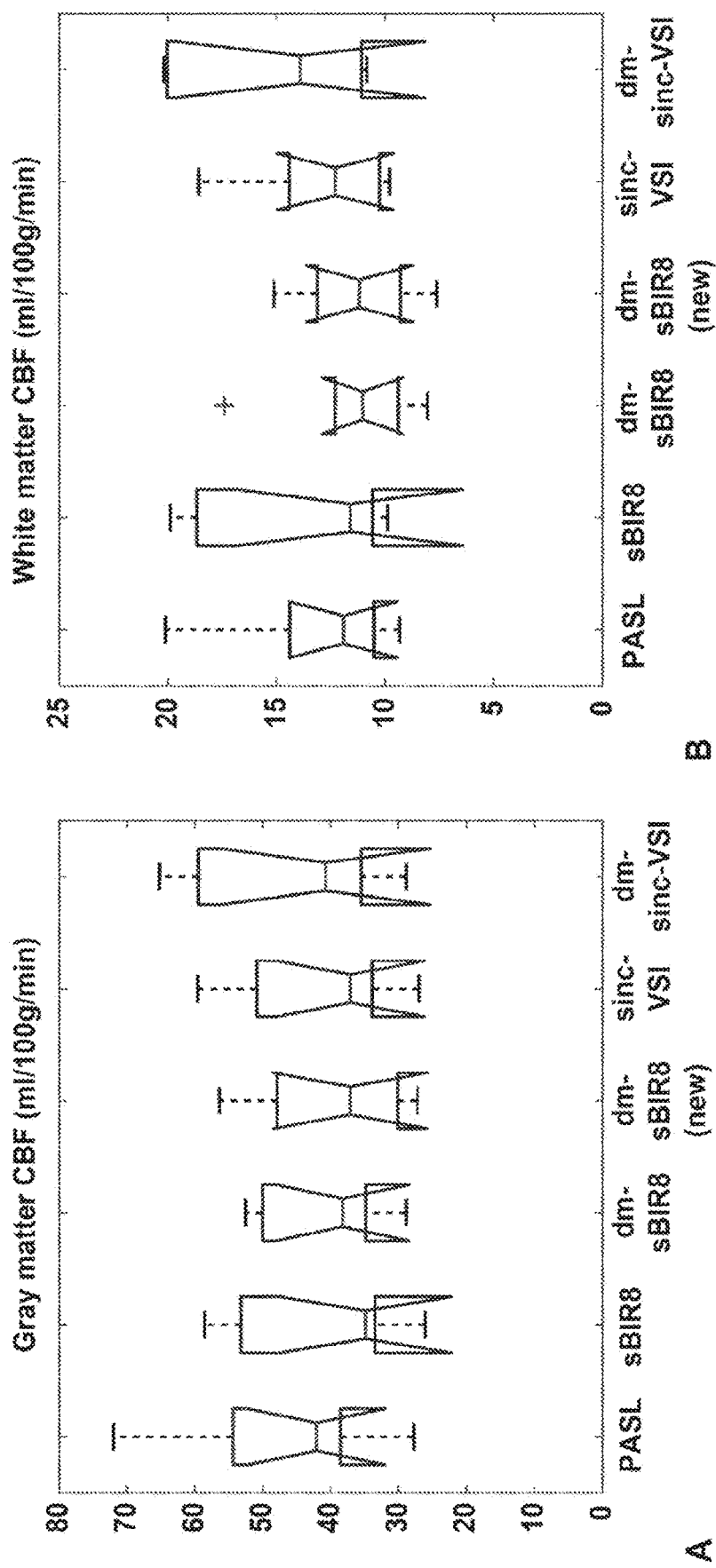
FIG. 33 shows boxplots for experimental results of mean CBF. It can be seen from these results that there is no significant difference in CBF in GM or WM.

FIG. 33 shows boxplot for experimental results of mean CBF. It can be seen from these results that there is no significant difference in CBF in GM or WM.

4. Another Examples of Dm-VSASL

Another example embodiments of dm-VSASL (Refer to FIGS. 34 to 42) is described next.

Compared to conventional arterial spin labeling (ASL) methods, velocity-selective ASL (VSASL) is more sensitive to artifacts from eddy currents, diffusion attenuation, and motion. Background suppression is typically suboptimal in VSASL, especially of CSF. As a result, the temporal SNR and quantification accuracy of VSASL are compromised, hindering its application despite its advantage of being delay-insensitive.

4.1 Methods

The novel dual-module VSASL (dm-VSASL) described herein improves the SNR efficiency and the temporal SNR with a more balanced gradient configuration in the label/control image acquisition. This strategy applies for both VS saturation (VSS) and VS inversion (VSI) labeling. The dm-VSASL schemes were compared with single-module labeling and a previously developed multi-module schemes for the SNR performance, background suppression efficacy, and sensitivity to artifacts in simulation and in vivo experiments, using pulsed ASL as the reference.

4.2 Results

Dm-VSASL enabled more robust labeling and efficient background suppression across brain tissues, especially of CSF, resulting in significantly reduced artifacts and improved temporal SNR. Compared to single-module labeling, dm-VSASL significantly improved the temporal SNR in gray (by 90.8% and 94.9% for dm-VSS and dm-VSI, respectively; P<0.001) and white (by 41.5% and 55.1% for dm-VSS and dm-VSI, respectively; P<0.002) matter. Dm-VSI also improved the SNR of VSI by 5.4% (P=0.018).

As can be seen from these results, dm-VSASL can significantly improve the robustness of VS labeling, reduce artifacts, and allow efficient background suppression. When implemented with VSI, it provides the highest SNR efficiency among VSASL methods. Dm-VSASL is a powerful ASL method for robust, accurate, and delay-insensitive perfusion mapping.

5. VSASL Examples

Velocity-selective arterial spin labeling (VSASL) is a category of arterial spin labeling (ASL) methods that label arterial blood based on its velocity. Compared to the other 2 ASL categories relying on spatial labeling, and therefore sensitive to arterial transit time (ATT) effects, that is, pulsed ASL (PASL) and (pseudo-) continuous ASL ([P-]CASL), VSASL is insensitive to ATT effects, and has an SNR advantage when arterial blood supply is significantly delayed.

VSASL can be performed with VS saturation (VSS) or VS inversion (VSI) labeling. In VSS, ASL signal is created by saturating the magnetization of spins moving above a cutoff velocity ($V_{cut}$) under the label condition and leaving the same population of spins at equilibrium (relaxed) under the control condition. In VSI, the blood moving above the $V_{cut}$ is inverted under the control condition and is relaxed under the label condition. The velocity selectivity is realized by the combined effects of RF and flow-sensitive gradient pulses and a physical mixing process. In both VSS- and VSI-based VSASL, a vascular crushing module (VCM) with the same $V_{cut}$ may be used to define the trailing edge of the bolus by removing intravascular signal moving faster than $V_{cut}$ and unwanted venous signal for quantification. A post-labeling delay (PLD) is the time between the VCM and the image acquisition. In practice, PLD in VSASL is typically set to a minimal value, such as zero, to reduce the $T_1$ decay.

Despite recent advancement in VSASL method development, 2 major challenges remain: (1) the labeling efficiency is relatively low; and (2) artifacts compromise the robustness and the quantification accuracy of VSASL.

For labeling efficiency, the VSS-based VSASL has a maximal labeling efficiency of 0.5 theoretically, lower than typical values of PASL (0.97) and pseudo-continuous ASL (PCASL) (0.85) in practice, resulting in compromised SNR. To improve the SNR, 2 strategies have been developed including: (1) using multiple VSS modules to re-label relaxed ASL signal and generate a larger labeling bolus; and (2) using a VSI preparation, which has a maximal labeling efficiency of 1 in theory. In practice, both strategies can improve the SNR by 20%-30% compared to single-module VSS-based VSASL. Despite these achievements, further improvement of the SNR of VSASL is desired.

The artifacts in VSASL mainly come from the fact that the application of flow-sensitive gradient pulses differs under the label and control conditions. Typically, under the label condition, gradient pulses with zero zeroth moment and non-zero first moment are applied; whereas under the control condition, zero zeroth and zero first moment are required, either by turning off the gradient pulses or using flow-compensated gradient pulses. Typically, the gradient pulses under the label and control conditions have small but different diffusion attenuation and different sensitivity to eddy current (EC) effects. Such difference makes the labeling sensitive to processes that are irrelevant to blood flow, such as diffusion attenuation, or undesired labeling of tissues caused by ECs; that is, artifactual ASL "signals" are generated, resulting in compromised robustness and quantification accuracy. For example, cerebral blood flow (CBF) may be significantly overestimated if EC effects are not reduced or properly matched in the label and control images. Methods have been developed to improve the preparation and quantification accuracy of VSASL, such as reducing sensitivity to EC effects, and correction of artifactual ASL signal due to diffusion attenuation effects, especially in voxels containing CSF. Despite these development and research efforts, the temporal SNR (tSNR) of existing VSASL methods is still low in practice.

The dual-module labeling strategy described herein addresses the 2 major challenges in VSASL described above. It is applicable with VSS and VSI labeling modules and their combinations. In addition, it also enables better background suppression (BS) than existing VSASL methods, further enhancing the SNR performance. To differentiate the new dual-module labeling method from the previous VSS-based multi-module VSASL (mm-VSASL) method, we refer to the new dual-module labeling strategy as dual-module VSASL (dm-VSASL), though the mm-VSASL can be (and typically is) implemented with 2 VSS modules.

The principles of the dm-VSASL scheme are first introduced and followed by the modeling of dm-VSASL signal and the optimization for maximal SNR efficiency. The practical performance, including the ASL signal strength, labeling robustness or tSNR, BS performance, and CBF quantification, was examined and compared with existing VSASL methods and PASL in in vivo experiments.

5.1 Discussion of Differences Between VSASL and Dm-VSASL

As described herein, traditional VSASL (single-module VSASL, or sm-VSASL) has different gradient layouts, and thus unbalanced diffusion and EC sensitivities, in the acquisition of label and control images; and mm-VSASL has improved SNR efficiency, but the diffusion and EC sensitivities are higher; that is, 2 VS modules under the label condition (with flow-sensitizing gradients) are used to acquire label images. To tackle this, the dm-VSASL design rearranges the flow-sensitizing gradients in the acquisition of label and control images such that the diffusion and EC sensitivities are better balanced in the 2; therefore, the associated artifacts can be reduced or canceled after subtraction. Similar to mm-VSASL, dm-VSASL uses more than 1 VS labeling module in preparation, but they differ in a few important aspects: (1) mm-VSASL is applicable with VSS labeling only, whereas dm-VSASL can use both VSS and VSI labeling and their combinations; (2) dm-VSASL uses a different gradient configuration to acquire label and control images; (3) dm-VSASL requires the first VS module to invert the static spins, whereas mm-VSASL does not.

Figure 34:
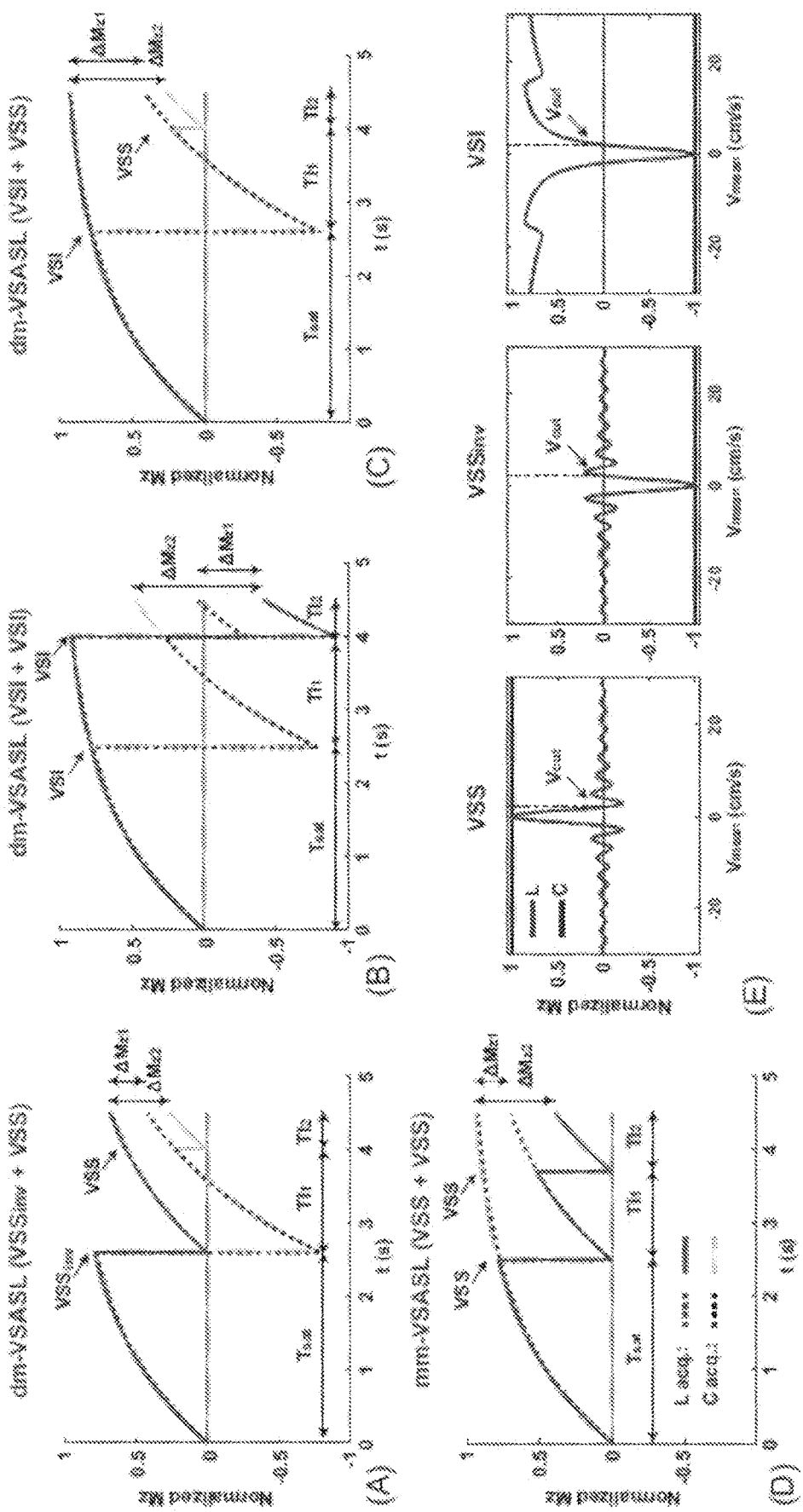
FIG. 34 shows an example magnetization evolution of different VSASL methods, including dm-VSASL technology.

Below we start with the implementation of dm-VSASL to demonstrate the design principles as illustrated in FIG. 34. Briefly, a global saturation is first applied to reset the magnetization of all spins to a known state ($M_z$=0). After a delay time of $T_{sat}$ (e.g., 2 s) for the arterial spins to recover, 2 VS modules are applied consecutively with a delay (on the order of 1 s) after each to allow arterial inflow to deliver. The types of the VS modules (VSS vs. VSI) and the conditions (label vs. control) depend on the specific implementation and the image type being acquired (label vs. control), as described in the details below. Then a VCM is applied to remove undelivered (i.e., with $V>V_{cut}$) spins and followed by image acquisition after a short PLD (close to zero). Additional BS pulses can be applied between the second VS module and the VCM.

FIG. 34 (inset D) shows the new dual-module VSASL scheme, where the VS modules under the control condition are labeled with C (blue), and the ones under the label condition are labeled with L (red), with green shapes representing flow-sensitive gradient pulses. The pulse sequence diagram on the top is for acquiring a control image and the diagram at the bottom for acquiring a label image. $TI_1$ and $TI_2$ are the time between the 2 VS modules, and between the second VS module and the VCM. BS, background suppression; PLD, post-labeling delay; VCM, vascular crushing module; VSASL, velocity-selective arterial spin labeling; VSI, velocity-selective inversion; VSS, velocity-selective saturation; $VSS_{inv}$, velocity-selective saturation that can invert stationary magnetization.

5.2 Dm-VSASL Using VSI Only

To acquire a control image, the first VSI module is applied under the control condition, that is, without flow-sensitive gradients. After a delay of $TI_1$, the second VSI module is applied under the label condition, that is, with the flow-sensitive gradient pulses. After a second delay time $TI_2$, the VCM can be applied and followed by PLD and image acquisition. To acquire a label image, the first VSI module is applied under the label condition, and the second module under the control condition. Background tissue signals are partially suppressed by the inversion effect of the VSI modules, and the SNR is improved. Additional global BS pulses can be applied after the second VSI module to further improve the SNR.

5.3 Dm-VSASL Using VSS Only

Unlike the previous mm-VSASL, where 2 VSS modules under the same condition are applied consecutively to acquire a label or a control image, dm-VSASL using VSS only obtains a control image with the first VSS module under the control condition and the second module under the label condition, and a label image with the first VSS module under the label condition and the second module under the control condition. In addition, the first VSS module has to be modified to invert the magnetization of static spins. To differentiate it from the unmodified VSS module, this is denoted as $VSS_{inv}$. The second VSS module can be either VSS or $VSS_{inv}$.

$VSS_{inv}$ can be implemented in 2 ways: (1) applying an inversion pulse immediately after the VSS module, or (2) modifying the phase of the RF pulses in the VSS module to induce a built-in inversion effect; for example, a phase of $\pi$ can be added to the last RF pulse in a double-refocused hyperbolic secant/tangent or a symmetric 8-segment $B_1$ insensitive rotation (sBIR8) module to tip the static spins down instead of up. The $VSS_{inv}$ module with built-in inversion is preferred because: (1) it does not increase the specific absorption rate; and (2) no addition signal reduction is introduced. Like VSI, $VSS_{inv}$, effectively serves as a BS pulse whose inversion effect should be accounted for in BS timing calculation.

5.4 Dm-VSASL Using Both VSS and VSI

Combinations of VSS and VSI modules, such as VSI+ $VSS/VSS_{inv}$ and $VSS_{inv}$+VSI, are also feasible. For example, a VSI module followed by a VSS or $VSS_{inv}$ module, or a $VSS_{inv}$ followed by a VSI module, would also work under the principles of dm-VSASL.

Note that for the dm-VSASL implementations described above, the label/control condition switching is required for proper accumulation of ASL signal (see below). Otherwise, the ASL signal created by the 2 VS modules will have opposite signs, resulting in signal reduction or even cancellation.

Compared to sm-VSASL and mm-VSASL, dm-VSASL has a more balanced gradient configuration between the label and the control image acquisition. This arrangement should mitigate the eddy current and the diffusion attenuation effects that are typically observed in VSASL, as well as reducing its sensitivity to motion, potentially reducing artifacts and improving quantification accuracy. In addition, the inversion effects at an early time allow more flexible and efficient BS. All these should contribute to improving the labeling stability, the tSNR, and the quantification accuracy of VSASL.

5.5 Dm-VSASL Signal Modeling and Blood Flow Quantification

Figure 35:
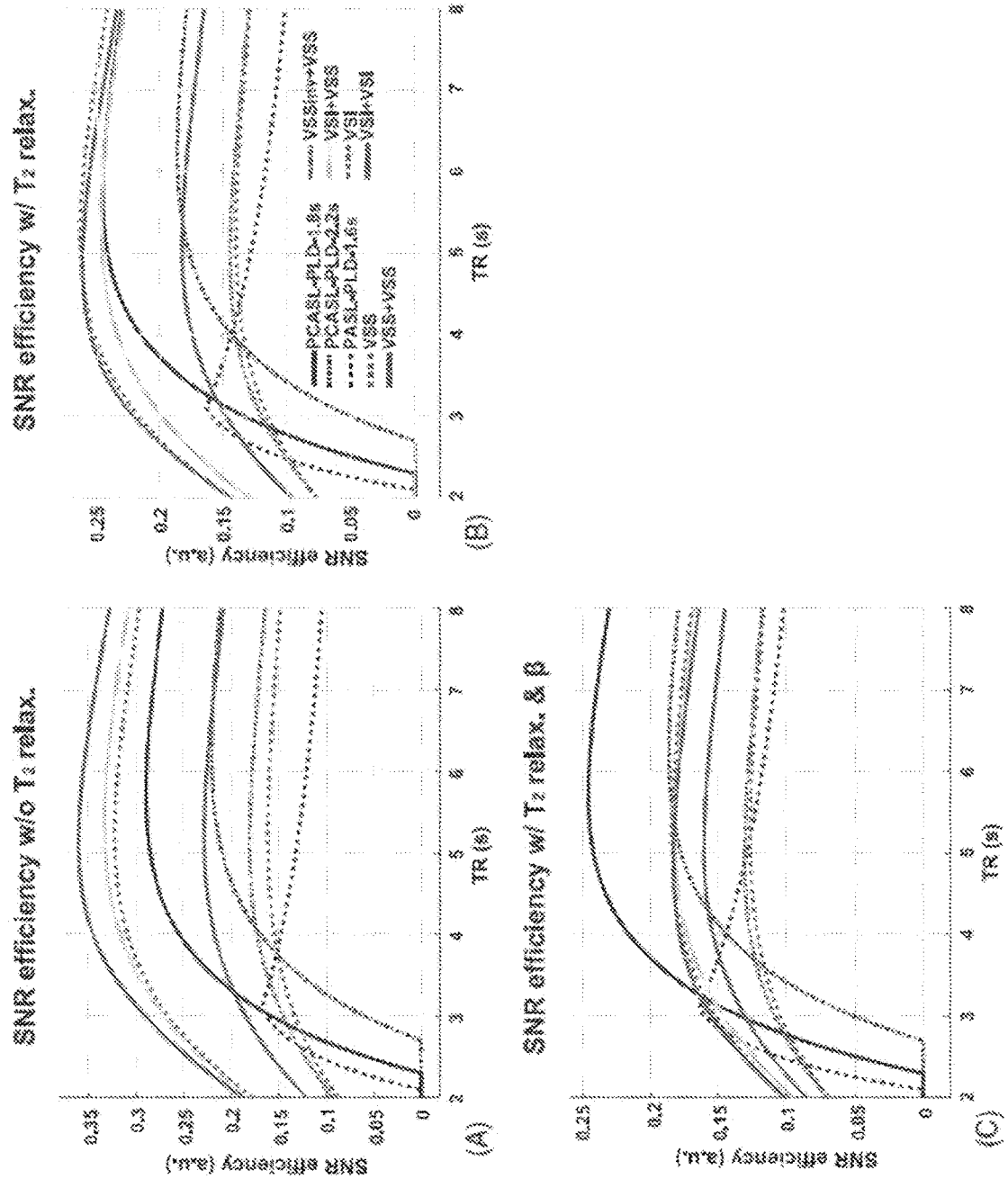
FIG. 35 shows example results of SNR efficiency simulations.

Similar to the previous mm-VSASL signal modeling, 3 groups of arterial spins are considered in dm-VSASL: (1) group 1 being labeled by only the first VS module, that is, it is in the transmit field of the RF coil and moves above $V_{cut}$ at the application of the first VS module and has decelerated below $V_{cut}$ (delivered) at the application of the second VS module; (2) group 2 being labeled by both VS modules, that is, in the range of the RF coil and moving above $V_{cut}$ at the application of both VS modules; and (3) group 3 being labeled only by the second VS module, that is, moving into the transmit field of the RF coil after the first VS module. Since group 3 is not likely to contribute to the measured ASL signal when $TI_1+TI_2 < BD_{max}$ ($BD_{max}$ is the maximal bolus duration, on the order of 2 s) and including it complicates the quantification, only the first 2 groups are included in the following modeling. The evolution of the magnetization of the 2 groups is shown in FIG. 35. Note that the label/control condition switching in the second VS module is necessary to ensure the ASL signals from the 2 groups are of the same sign.

FIG. 34 shows the magnetization evolution of the proposed dm-VSASL with label/control switching (FIG. 34) using $VSS_{inv}$+VSS (A), VSI+VSI (B) and VSI+VSS (C); and the pervious mm-VSASL (no label/control switching) using VSS+VSS (D); (E) the $M_z$ vs. $V_{mean}$ profiles of VSS, $VSS_{inv}$ and VSI labeling after convolving with a laminar flow distribution with the $V_{cut}$ shown (label: red, control: blue). In panels A-D, the group of arterial spins seeing only the first VS module is shown in dashed lines (group 1), and the group seeing both VS modules is shown in solid lines (group 2). The magnetization evolution in the label image acquisition is shown in warm colors (group 1: dashed red; group 2: solid magenta), and that in the control image acquisition is shown in cool colors (group 1: dashed blue; group 2: solid cyan). The curves in A-D are shifted slightly for better visualization, and only $T_1$ relaxation effect was included. Note that the label/control condition in the second VS module is switched in A, B and C, such that the ASL signals from groups 1 and 2 ($\Delta M_{z1}$ and $\Delta M_{z2}$) are of the same sign.

With ideal VS modules, that is, without considering the labeling efficiency, the ASL signal can then be modeled as $$Sig_{ASL} = Sig_{ctrl} - Sig_{lab} \quad (1)$$
$$= f \cdot (\Delta M_{z1} \cdot TI_1 + \Delta M_{z2} \cdot TI_2) \cdot e^{\frac{PLD}{T_{1a}}},$$

where f is the blood flow under investigation; $\Delta M_{z1}$ and $\Delta M_{z2}$ are the magnetization difference of arterial spin groups 1 and 2 between the control and label acquisition ($Sig_{ctrl}$–$Sig_{lab}$) without considering labeling efficiency; $TI_1$ and $TI_2$ are the time between the first and the second VS modules, and that between the second VS and the VCM modules; and $T_{1a}$ is the $T_1$ of arterial blood.

When realistic VS pulses are considered, the 2 groups of arterial spins are affected differently by the labeling efficiency and the $T_2$ relaxation of the VS modules. The labeling efficiency of a VS module $\alpha_{VS}$ can be modeled as:

$$\alpha_{VS} = \beta \cdot e^{-\frac{eTE_{VS}}{T_{2a}}}, \quad (2)$$

where $eTE_{VS}$ is the effective TE of the VS module; $T_{2a}$ is the arterial $T_2$ relaxation time; and $\beta$ is a scaler containing other factors affecting the VS labeling efficiency, such as the shape of the VS labeling profile with respect to velocity, distribution of arterial blood velocity, and sensitivity to $B_0$ and $B_1$ variations within the labeling volume. Note that for VSS, a factor of 0.5 is not included, as the $\Delta_{VS}$ is defined based on the $\Delta M_z$ created by VS preparation (see below), not normalized by $2M_0$.

Under such definition, group 1 is first affected by the labeling efficiency of the first VS module $\alpha_{VSI}$, and then only scaled by the $T_2$ relaxation of the second VS module since the arterial blood has decelerated and reached the capillary bed when the second VS module is applied; whereas group 2 is affected by both VS modules as it is in the arterial space at the application of both VS modules. Following Equation 1, the magnetization difference of the 2 groups can be approximated (see Supporting Information for detailed derivation) as:

For dm-VSASL using VSI+VSI:

$$\Delta M_{z1} = 2M_0 \cdot e^{-\frac{eTE_{VSI}}{T_{2a}}} \cdot \alpha_{VSI} \cdot e^{-\frac{TI_1+TI_2}{T_{1a}}} \cdot \left(1 - e^{-\frac{T_{sat}}{T_{1a}}}\right), \text{ and}$$

$$\Delta M_{z2} = 2M_0 \cdot \alpha_{VSI} \cdot e^{-\frac{TI_2}{T_{1a}}} \cdot \left(1 - e^{-\frac{TI_1}{T_{1a}}}\right),$$

where $T_{sat}$ is the time between the global saturation and the first VS module, and $M_0$ is the fully relaxed magnetization of arterial blood. Note the absence of the $\alpha_{VSI}^2$ terms in $\Delta M_{z2}$ due to complete cancelation from the inversion in VSI and the label/control switching.

For dm-VSASL using $VSS_{inv}$+VSS:

$$\Delta M_{z1} = -M_0 \cdot e^{-\frac{eTE_{VSS}}{T_{2a}}} \cdot \alpha_{VSS} \cdot e^{-\frac{TI_1+TI_2}{T_{1a}}} \cdot \left(1 - e^{-\frac{T_{sat}}{T_{1a}}}\right), \text{ and}$$

$$\Delta M_{z2} = -M_0 \cdot \alpha_{VSS} \cdot e^{-\frac{TI_2}{T_{1a}}} \cdot \left(1 - e^{-\frac{TI_1}{T_{1a}}}\right).$$

Note that there is no $\alpha_{VSS}^2$ term accumulated in $\Delta M_{z2}$ because the label condition is applied in both the label and control image acquisition, which sets $M_z$ to 0, that is, removing the effect of $\alpha_{VSS}$.

For reference, the mm-VSASL using VSS+VSS has $$\Delta M_{z1} = M_0 \cdot e^{-\frac{eTE_{VSS}}{T_{2a}}} \cdot \alpha_{VSS} \cdot e^{-\frac{TI_1+TI_2}{T_{1a}}} \cdot \left(1 - e^{-\frac{T_{sat}}{T_{1a}}}\right), \text{ and}$$

$$\Delta M_{z2} = M_0 \cdot \alpha_{VSS} \cdot e^{-\frac{TI_2}{T_{1a}}} \cdot \left(1 - e^{-\frac{TI_1}{T_{1a}}} + \alpha_{VSS} \cdot e^{-\frac{TI_1}{T_{1a}}} - \alpha_{VSS} \cdot e^{-\frac{T_{sat}+TI_2}{T_{1a}}}\right).$$

And for hybrid dm-VSASL using VSI+VSS, $$\Delta M_{z1} = -2M_0 \cdot e^{-\frac{eTE_{VSS}}{T_{2a}}} \cdot \alpha_{VSI} \cdot e^{-\frac{TI_1+TI_2}{T_{1a}}} \cdot \left(1 - e^{-\frac{T_{sat}}{T_{1a}}}\right), \text{ and}$$

$$\Delta M_{z2} = -M_0 \cdot \alpha_{VSS} \cdot e^{-\frac{TI_2}{T_{1a}}} \cdot \left(1 - e^{-\frac{TI_1}{T_{1a}}} + \alpha_{VSI} \cdot e^{-\frac{TI_1}{T_{1a}}} - \alpha_{VSI} \cdot e^{-\frac{T_{sat}+TI_2}{T_{1a}}}\right).$$

For mm-VSASL and hybrid dm-VSASL, there are $\alpha^2$ terms left due to incomplete cancelation or lack of label/control switching.

Note the sign difference between different dm-VSASL implementations. Since $Sig_{ASL}$ is affected by the $T_2$ relaxation of both VS modules, it is therefore beneficial to use VS modules with short eTE. For example, sinc-shaped VSI (sinc-VSI) is preferred over rectangular-shaped VSI (rect-VSI) in dm-VSI for its shorter eTE (29.4 ms versus 37.6 ms with the same pulse duration of ~64 ms).

6. Optimizing SNR Efficiency of VSASL

One of the major goals of designing dm-VSASL is to improve its SNR efficiency (SNR per unit time), defined as $Sig_{ASL}/\sqrt{2TR}$. A kinetic ASL signal model was used to model and compare the SNR efficiency of different VSASL schemes, along with PASL and PCASL for reference. The SNR efficiency was evaluated with ideal or realistic labeling efficiencies, at different TR ranging from 2 to 8 s. At each TR, the maximal SNR efficiency was calculated with different values of TI (for sm-VSASL), or $TI_1$ and $TI_2$ (for mm-VSASL and dm-VSASL) by grid searching under the constraint $TI<BD_{max}$ or $TI_1+TI_2<BD_{max}$, respectively. $BD_{max}$ is the maximal bolus duration: 2 s for VSASL, 1 s for PASL, and unlimited for PCASL. Other parameters included: $T_{1\alpha}$=1.66 s, $T_{Acq}$=0.5 s, $PLD_{PASL}$=1.6 s, $PLD_{PCASL,1}$=1.8 s, $PLD_{PCASL,2}$=2.2 s, $\alpha_{PASL}$=0.98, and $\alpha_{PCASL}$=0.85. When $T_2$ relaxation was considered for VSASL: $T_{2\alpha}$=150 ms, $eTE_{VSS}$=20 ms, $eTE_{VSI}$=30 ms; when realistic $\beta$ was considered: $\beta_{VSS}$=0.9 and $\beta_{VSI}$=0.7 were assumed.

7. In Vivo Experiments

Six young healthy subjects (2 female, age 21-38 years) were studied on a 3 Tesla scanner (Siemens Prisma, Erlangen, Germany) under University of California Riverside's Internal Review Board approval and written consent from the subjects. Among the dm-VSASL implementations, 2 dm-VSASL with VSS labeling only and VSI labeling only were implemented and tested. sBIR8 and sinc-VSI pulses were used for VSS and VSI, respectively. There are other VS pulses, such as BIR-4 and double-refocused hyperbolic secant/tangent[1] for VSS and rect-VSI for VSI labeling. sBIR8 VSS was chosen for its $B_0/B_1$ insensitivity and robustness against EC effects, and sinc-VSI was chosen for its higher labeling efficiency (shorter effect TE) and smoother velocity-labeling profile compared to rect-VSI.

Single-module VSASL using VSS and sinc-VSI labeling, and mm-VSASL using 2 VSS modules, were compared. A PASL scan was also included as the reference for its robust labeling efficiency compared to PCASL in the presence of off-resonance and blood velocity difference. The following ASL scans with BS were performed in a randomized order in each subject: (1) PASL: FAIR with Q2TIPS, $TI_1$=0.8 s, TI=2.4 s (PLD=1.6 s), 2 BS pulses applied at 1.4 s and 0.42 s before imaging; (2) sm-VSASL using VSS ($VSS_{inv}$ or VSS for simplicity): TI=1.4 s, 1 BS pulse at 0.48 s before imaging; (3) mm-VSASL (VSS+$VSS_{inv}$ or mm-VSS): $TI_{1/2}$=1.15/0.82 s, 1 BS pulse 0.26 s before imaging; (4) dm-VSASL using VSS ($VSS_{inv}$+VSS or dm-VSS, BS1): $TI_{1/2}$=1.45/0.54 s, 1 BS pulse at 0.28 s before imaging; (5) sm-VSASL using VSI (VSI): TI=1.4 s, 1 BS pulse at 0.48 s before imaging; (6) dm-VSASL using VSI (dm-VSI, BS1): $TI_{1/2}$=1.45/0.54 s, 2 BS pulses at 0.47 s and 0.14 s before imaging. To explore the flexibility and the effectiveness of BS in dm-VSASL, additional scans with different BS timings were performed: (7) dm-VSASL using VSS ($VSS_{inv}$+$VSS_{inv}$ or dm-VSS, BS2), and (8) dm-VSASL using VSI (dm-VSI, BS2), both with the same timings: $TI_{1/2}$=1.45/0.54 s, 2 BS pulses at 0.37 s and 0.25 s before imaging.

Other imaging parameters included: 2-segmented (along the slice-encoding direction) 3D gradient and spin echo (GRASE) EPI readout with 180° refocusing RF pulses; an in-plane FOV of 220×220 mm and a matrix size of 64×64; 24 slices and 4 mm thickness to cover the whole brain; TR=4 s (PASL) and 5 s (VSASL); TE=36.1 ms; 15 and 12 label/control pairs for PASL and VSASL, respectively. In VSASL, a VCM using sBIR8 VSS module was applied about 100 ms (PLD) before image acquisition. The $V_{cut}$ was 2 cm/s along the superoinferior direction. The total scan time was 4 min for each ASL scan. Additional fully relaxed proton-density-weighted reference images were acquired for quantification. 3D $T_{1w}$ anatomical images were collected using MP-RAGE sequence with TR/TE=2.4 s/2.72 ms, TI=1.06 s, an isotropic resolution of 0.8 mm, and an acquisition time of 6.5 min.

8. Data Processing

To ensure the quality of ASL images, the first pair of ASL acquisition was discarded. The BS level (tissue signal) maps were calculated by dividing the mean of control/label images by the relaxed reference images, and expressed in percentage. ASL signal was produced with pairwise subtraction. The signal reductions due to additional BS pulses were corrected, assuming 5% reduction per BS pulse. Normalized mean ASL signal was calculated as percentage relative to the reference image for comparison across subjects. The average ASL signal across time was divided by its temporal SD to calculate the tSNR[31] in each scan. CBF was quantified with the modeling and parameters provided earlier. Gray and white matter (GM and WM) and CSF regions of interest (ROIs) were identified after registering the $T_{1w}$ anatomical images to the ASL images and segmentation using the FSL toolbox. The normalized ASL signal, tSNR, and CBF were compared between different labeling schemes.

9. Statistical Analysis

The mean tissue signal (BS level), normalized ASL signal, tSNR, and CBF in the ROIs across subjects were tested for normality (Jarque-Bera test). All values were normally distributed except the tissue signals acquired using PASL, and Wilcoxon signed rank test was used when needed. ASL signal, tSNR, and CBF in the GM and WM ROIs were compared using 1-way analysis of variance (with Tukey-Kramer adjustment) and multiple pairwise t tests. Significant differences were identified with $P<0.05$ (uncorrected). Bonferroni correction was applied on the threshold when multiple pairwise comparisons (reported as n) were performed, and uncorrected P value are reported.

10. SNR Efficiency Optimization

The results of SNR efficiency simulation are shown in FIG. 35. The SNR efficiencies of VSASL methods generally peaked around TR=5 s. Under ideal conditions, that is, the labeling efficiencies were 1 for all methods, the maximal SNR efficiency of dm-VSASL ($TI_{1/2}$=1.52/0.48 s) was increased by 12.0% compared to sm-VSASL (TI=1.4 s) for both VSS and VSI. For dm-VSS, the increase was smaller than that of mm-VSS ($TI_{1/2}$=1.18/0.82 s, 41.6%). Note the SNR efficiency advantage of VSASL methods compared to PCASL and PASL in this ideal scenario. When $T_2$ relaxation was included (P=1), the maximal SNR efficiency of dm-VSI ($TI_{1/2}$=1.46/0.54 s) was almost the same as VSI (TI=1.4 s) labeling; dm-VSS had a smaller increase (3.4%), whereas mm-VSS ($TI_{1/2}$=1.16/0.84 s) still had an increase of 30.2%, compared to VSS labeling. When realistic VS pulses were considered (with $T_2$ relaxation and $\beta<1$), the SNR efficiencies of VSASL methods would further decrease. Compared to VSI (TI=1.4 s), dm-VSI ($TI_{1/2}$=1.46/0.54 s) still had a comparable SNR efficiency (0.4% less), and the hybrid dm-VSASL (VSI+VSS, $TI_{1/2}$=1.43/0.57 s) had a slightly lower SNR efficiency (2.7% less). Compared to VSS, dm-VSS ($TI_{1/2}$=1.48/0.52 s) had a slightly higher SNR efficiency (3.4% more), and mm-VSS ($TI_{1/2}$=1.18/0.82 s) had an increase of 28.5%. Note that under this realistic scenario, PCASL had a higher SNR efficiency than VSASL methods when PLD was not long (1.8 s); when a longer PLD (e.g., 2.2 s) was used in PCASL due to prolonged ATTs, dm-VSASL using at least 1 VSI module would have a comparable SNR efficiency and would be more SNR-efficient if the PLD in PCASL had to be further increased.

FIG. 35 shows SNR efficiency (SNR per unit time) comparison between PASL, PCASL, and VSASL with different labeling schemes under different scenarios: (A) all the ASL schemes have an ideal labeling efficiency of 1; (B) $\alpha_{PASL}$=0.98, $\alpha_{PCASL}$=0.85, for VSASL schemes, $T_2$ relaxation during the 2 VS modules were included and $\beta_{VSS}$=$\beta_{VSI}$=1; (C) scenario (B) with $\beta_{VSS}$=0.9 and $\beta_{VSI}$=0.7. PASL, pulsed ASL; PCASL, pseudo-continuous ASL; VSASL, velocity-selective ASL.

11. In Vivo Results

Figure 36:
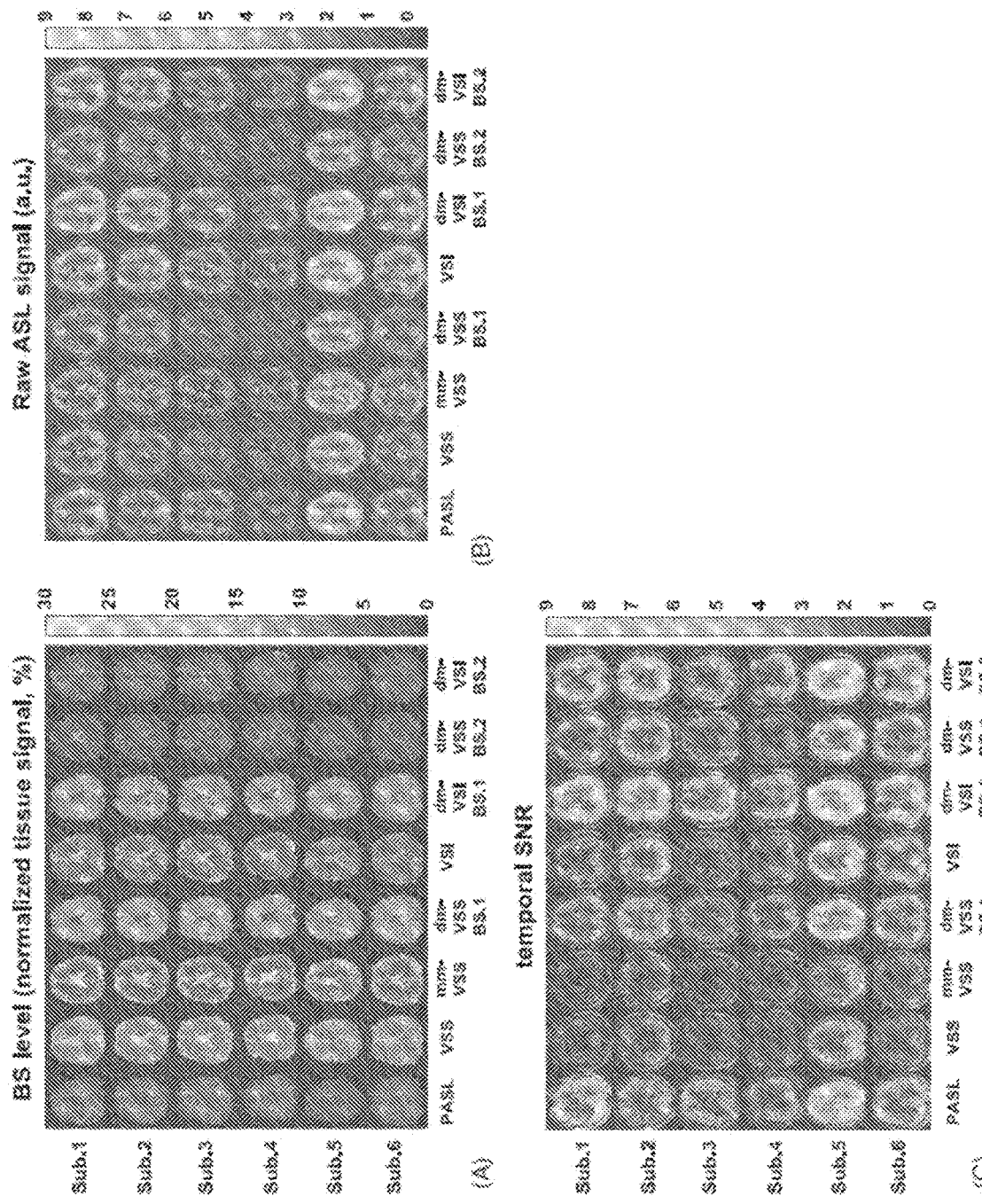
FIG. 36 shows graphs for an example of in vivo results.

The BS level maps are shown in FIG. 36 (left top). The averaged BS levels in different tissue ROIs and across subjects are summarized in Table 1. Different and consistent BS levels were achieved using different ASL methods across subjects. In VSS, mm-VSS, and VSI, the CSF signal could not be sufficiently suppressed (≥15.7%) despite the effort in BS timing optimization. In contrast, the new dm-VSASL strategy achieved sufficient suppression across all brain tissues in both BS1 and BS2, including excellent suppression of CSF compared to VSS, mm-VSS, and VSI (≤7.1%, P<0.001, n=3).

FIG. 36 shows three graphs: (A) BS level at left top, (B) raw ASL signal at right top; and (C) temporal SNR (tSNR) maps across subjects at bottom. Note the effective suppression of CSF signals, reduced artifacts, and improved tSNR using the proposed dm-VSASL methods. BS, background suppression; tSNR, temporal SNR.

TABLE 1 also reproduced in FIG. 37, shows examples of normalized BS levels in GM, WM, and CSF; and the averaged tSNR in GM and WM across subjects

| ASL schemes (n = 6) | | PASL | VSS | mm-VSS | dm-VSS (BS1) | VSI | dm-VSI (BS1) | dm-VSS (BS2) | dm-VSI (BS2) |
|---|---|---|---|---|---|---|---|---|---|
| Mean BS level (mean ± SEM, %) | GM | 5.8 ± 0.5 | 13.4 ± 0.9 | 15.7 ± 2.2 | 9.8 ± 0.4 | 10.6 ± 1.3 | 9.1 ± 0.2 | 4.7 ± 0.4 | 5.7 ± 0.5 |
| | WM | 8.5 ± 0.7 | 8.6 ± 0.2 | 5.1 ± 0.2 | 11.4 ± 0.3 | 6.7 ± 0.3 | 11.5 ± 0.4 | 5.2 ± 0.2 | 7.1 ± 0.2 |
| | CSF | 5.4 ± 0.4 | 20.4 ± 2.9 | 23.7 ± 3.7 | 5.2 ± 1.3 | 15.7 ± 2.1 | 5.5 ± 0.9 | 7.1 ± 0.8 | 6.3 ± 0.5 |

TABLE 1-continued also reproduced in FIG. 37, shows examples of normalized BS
levels in GM, WM, and CSF; and the averaged tSNR in GM and WM across subjects

| ASL schemes (n = 6) | | PASL | VSS | mm-VSS | dm-VSS (BS1) | VSI | dm-VSI (BS1) | dm-VSS (BS2) | dm-VSI (BS2) |
|---|---|---|---|---|---|---|---|---|---|
| Mean tSNR (mean ± SEM) | GM | 4.7 ± 1.3 | 2.1 ± 1.0 | 1.8 ± 0.7 | 4.0 ± 1.1 | 3.2 ± 1.4 | 6.2 ± 1.2 | 3.7 ± 1.4 | 5.6 ± 2.0 |
| | WM | 1.9 ± 0.6 | 0.9 ± 0.2 | 0.8 ± 0.2 | 1.3 ± 0.3 | 1.5 ± 0.5 | 2.3 ± 0.4 | 1.3 ± 0.4 | 2.2 ± 0.5 |

Note:
dm-VSS (BS1) and dm-VSI (BS1) were referred to as dm-VSS and dm-VSI for simplicity in later analyses.
Abbreviations: ASL, arterial spin labeling; BS, background suppression; dm-VSI, dual-module velocity-selective inversion; dm-VSS, dual-module velocity-selective saturation; GM, gray matter; mm-VSS, multi-module velocity-selective saturation; PASL, pulsed ASL; SEM, standard error of the mean; tSNR, temporal SNR; VSS, velocity-selective saturation; VSI, velocity-selective inversion; WM, white matter.

Of the 2 BS settings using dm-VSS and dm-VSI, BS1 had higher GM ($P<0.0006$) and WM ($P<1.3\times10^{-6}$) tissue signal than BS2 but lower CSF tissue signal (though not significant, $P=0.11$ and $0.17$ for dm-VSS and dm-VSI, respectively). BS1 produced ASL images with higher quality than BS2, that is, with higher (though not significantly) tSNR ($P=0.22$ for dm-VSS, and $P=0.27$ for dm-VSI, respectively), and should provide a reasonable representation of the performance of dm-VSASL. Therefore, further analyses focused on the measurements using the BS1 setting for comparisons between different labeling schemes. For simplicity, dm-VSS with BS1 was referred to as dm-VSS and dm-VSI with BS1 as dm-VSI unless specified.

Raw ASL signal maps are shown in FIG. 36 (top right). CSF artifacts were noticeable using VSS, mm-VSS, and VSI; whereas dm-VSASL methods yielded markedly improved quality with almost no CSF artifact, especially around the ventricles. These observations were confirmed by the tSNR maps shown in FIG. 36 (bottom) where obvious tSNR improvement was observed in both the cortical GM and the deep GM regions when comparing dm-VSS versus VSS and mm-VSS, and dm-VSI versus VSI. Note that there was some regional ASL signal reduction in the frontal area in subjects 4 and 6 with VSI-based labeling but not with VSS-based labeling, likely due to its sensitivity to field inhomogeneities (see discussion).

High signal fluctuations were observed in regions where CSF signals were not sufficiently suppressed with VSS, mm-VSS, and VSI labeling. Even though some of the fluctuations were averaged out, there were erroneous ASL signals in voxels with dominant CSF signals, for example, around ventricles and sulci. In contrast, both dm-VSS and dm-VSI produced ASL signals with high temporal stability throughout the brain and had a better performance than PASL.

Averaged tSNR in GM and WM ROIs across subjects is shown in the boxplots in FIS. 38 left and right graphs, respectively, and summarized in Table 1 (see FIG. 37). Compared to their single-module counterparts, dm-VSS significantly improved the tSNR by 90.8% in GM ($P=1.9\times10^{-5}$) and 41.5% in WM ($P=1.8\times10^{-3}$); and dm-VSI improved the tSNR by 94.9% in GM ($P=1.4\times10^{-4}$) and 55.1% in WM ($P=8.1\times10^{-4}$). Dm-VSS had a significantly higher tSNR in GM (25.9% higher, $P=0.0083$) but a lower tSNR in WM (13.8% lower, $P=0.036$) than VSI. Compared to VSS, mm-VSS had a similar tSNR in GM ($P=0.11$) but a lower tSNR in WM ($P=4.5\times10^{-4}$). In GM, dm-VSI had the highest tSNR among all methods ($P<0.006$, n=8); in WM, dm-VSI had the highest tSNR among the VSASL methods ($P<8.1\times10^{-4}$, n=8) and tended to have a higher tSNR than PASL ($P=0.048$, not significantly after correction, n=8).

Figure 38:
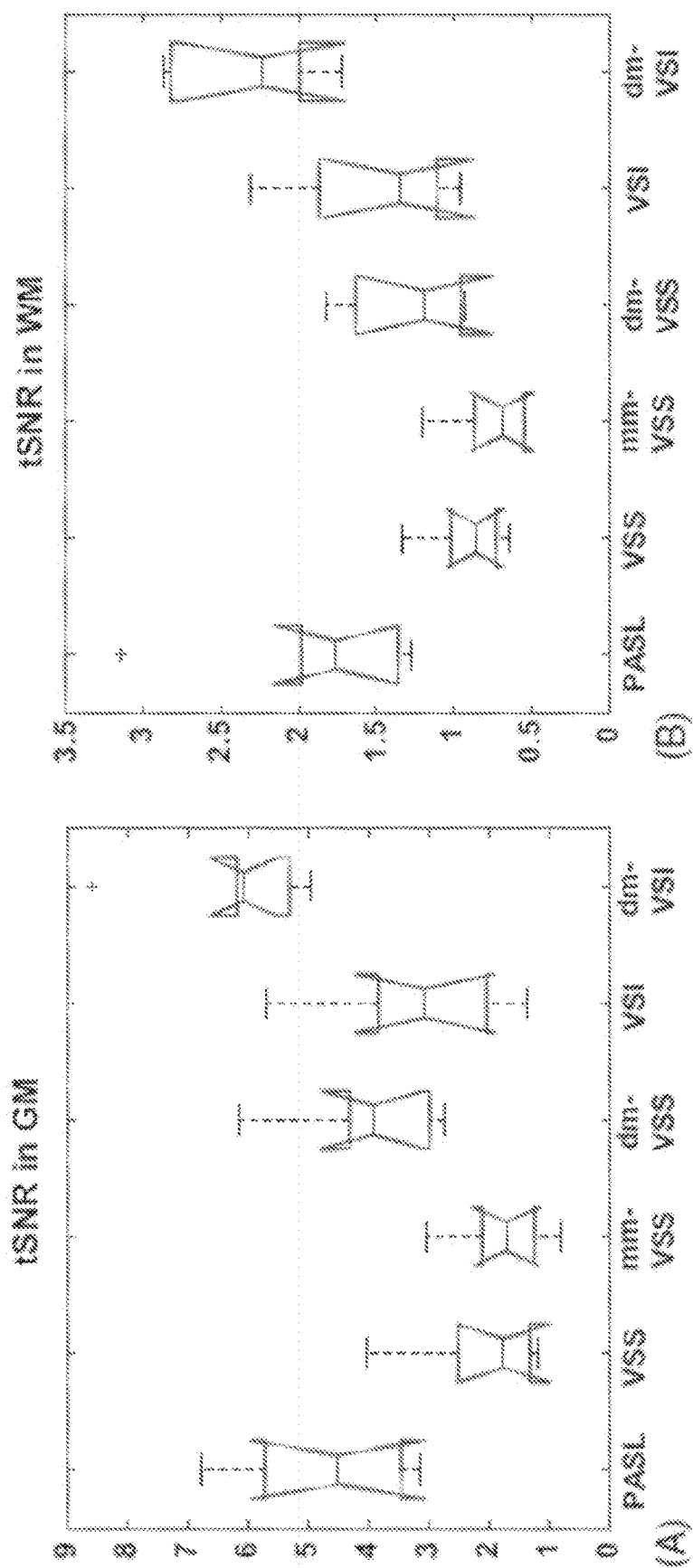
FIG. 38 shows boxplots for averages of tSNR.

FIG. 38 shows boxplots of the averaged tSNR in the left graph (A) and right graph WM (B) ROIs across subjects. GM, gray matter; ROI, region of interest; tSNR, temporal SNR; WM, white matter.

Figure 39:
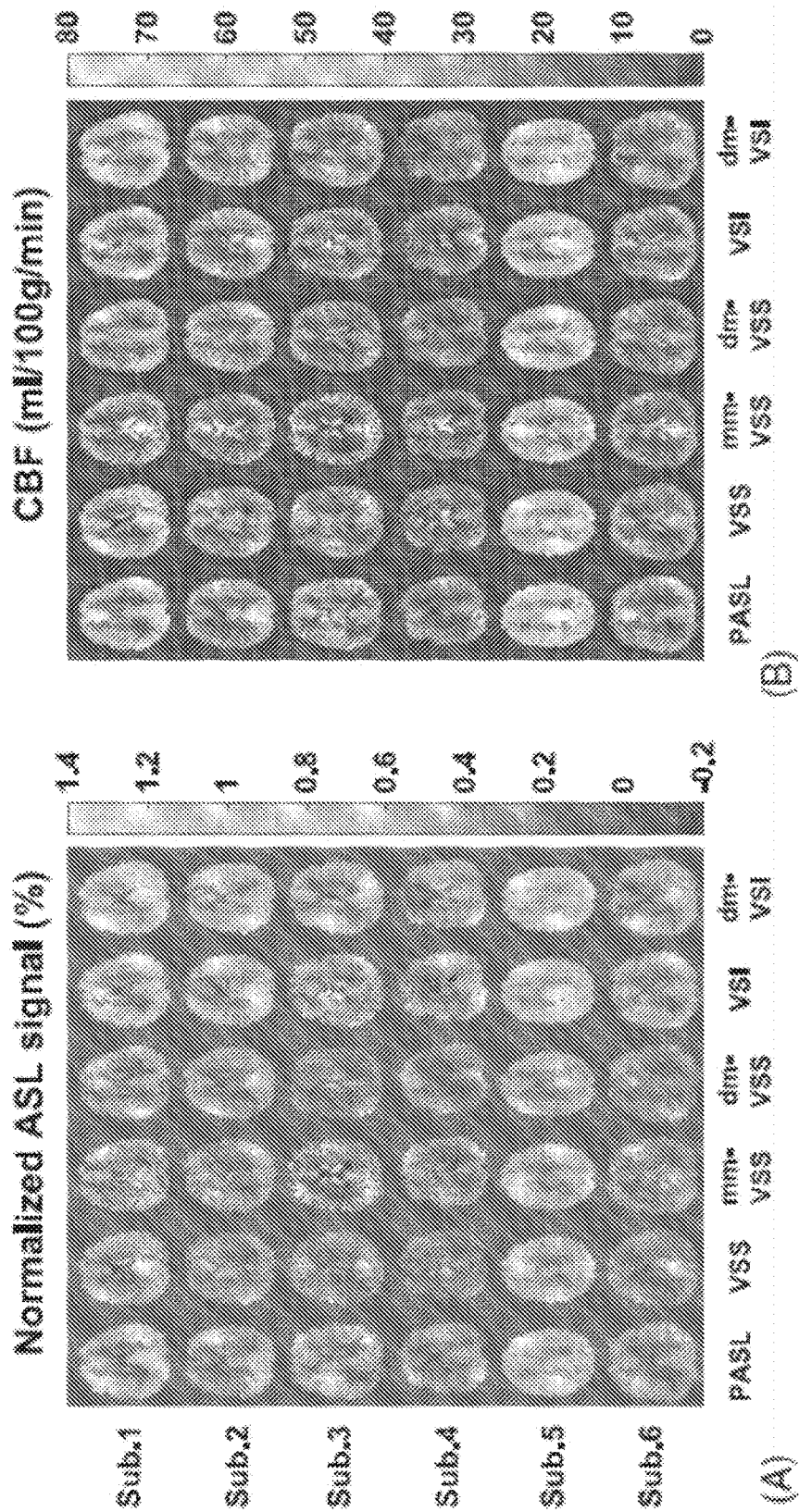
FIG. 39 shows examples of normalized ASL signal and CBF maps.
Figure 40:
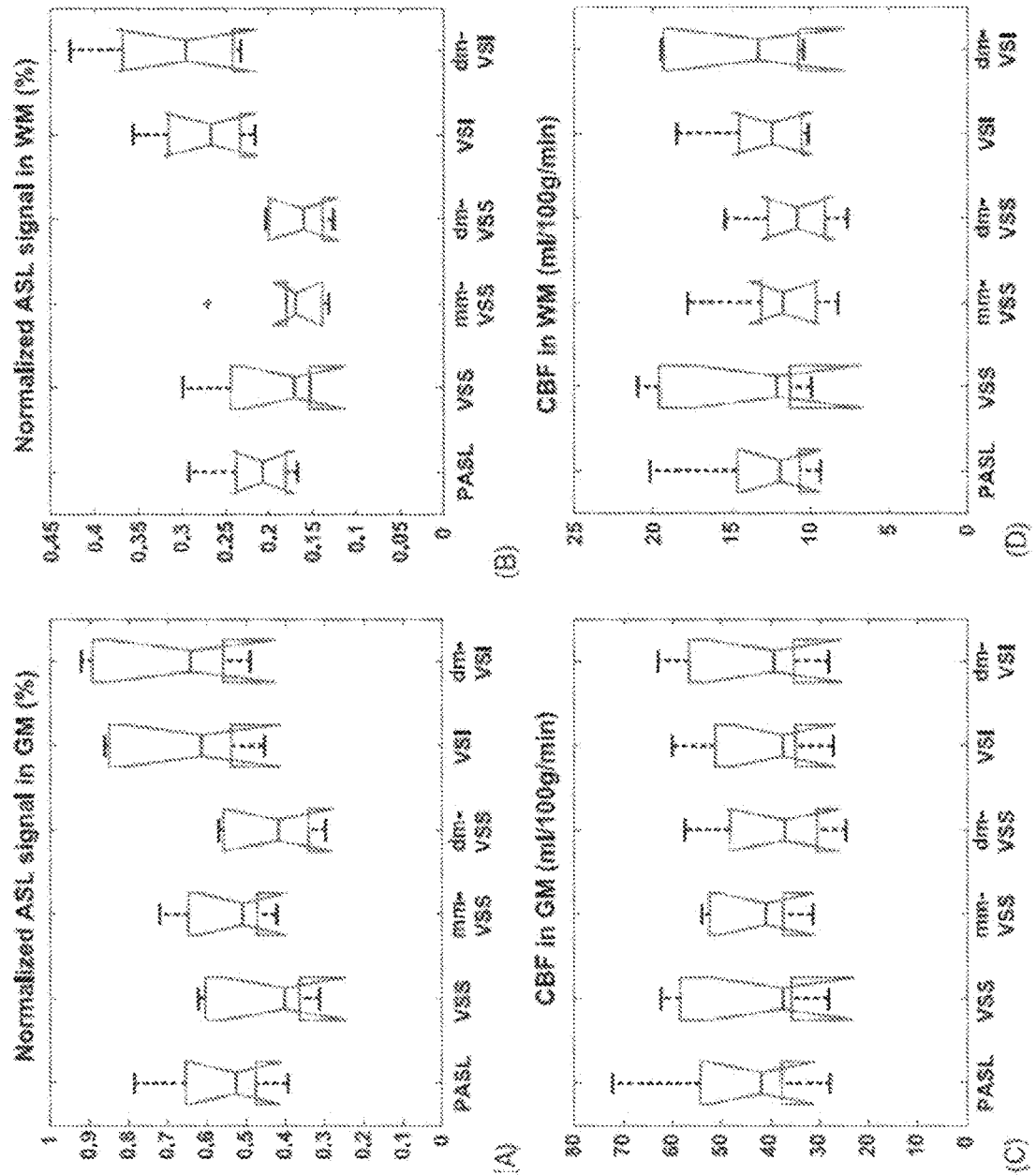
FIG. 40 shows graphs for average values of ASL signals in various subjects.

Normalized ASL signal and quantified CBF maps are shown in FIG. 39. The averaged values in GM and WM ROIs across subjects are shown in FIG. 40 and summarized in Table 2. For GM ASL signal, dm-VSI increased the ASL signal by 5.4% ($P=0.018$) compared to VSI labeling; mm-VSS increased ASL signal by 21.1% ($P=0.0009$) compared to VSS, consistent with previous results; whereas dm-VSS had a comparable ASL signal compared to VSS ($P=0.27$). Compared to VSS, VSI and dm-VSI increased the ASL signal by 45.1% ($P=0.0002$, n=4) and 53.0% ($P=0.0001$, n=4), respectively. For WM ASL signal, compared to VSS, mm-VSS ($P=0.33$) and dm-VSS ($P=0.15$) had similar ASL signal, VSI and dm-VSI increased the ASL signal by 39.1% ($P=0.012$, n=4) and 56.3% ($P=0.0006$, n=4), respectively. Compared to VSI, dm-VSI yielded 12.4% higher signal in WM, though not significantly ($P=0.15$).

FIG. 39 shows (A) the normalized ASL signal maps (with respect to the reference image) and (B) corresponding quantitative CBF maps from a representative slice across subjects. ASL, arterial spin labeling; CBF, cerebral blood flow.

FIG. 40 shows boxplots of the normalized ASL signal (A and B), and the CBF (C and D) in the GM and WM ROIs, averaged across subjects.

TABLE 2

(see also FIG. 41) shows results of an averaged normalized ASL
signal and CBF in GM and WM ROIs across subjects, and averaged gray/white ratio.

| ASL schemes (n = 6) | | PASL | VSS | mm-VSS | dm-VSS | VSI | dm-VSI |
|---|---|---|---|---|---|---|---|
| Normalized ASL signal (mean ± SEM, %) | GM | 0.56 ± 0.13 | 0.45 ± 0.12 | 0.55 ± 0.10 | 0.43 ± 0.11 | 0.66 ± 0.15 | 0.69 ± 0.17 |
| | WM | 0.22 ± 0.04 | 0.20 ± 0.05 | 0.18 ± 0.05 | 0.16 ± 0.03 | 0.28 ± 0.05 | 0.31 ± 0.07 |

TABLE 2-continued (see also FIG. 41) shows results of an averaged normalized ASL signal and CBF in GM and WM ROIs across subjects, and averaged gray/white ratio.

| ASL schemes (n = 6) | | PASL | VSS | mm-VSS | dm-VSS | VSI | dm-VSI |
|---|---|---|---|---|---|---|---|
| CBF (mean ± SEM, ml/100 g/min) | GM | 46.0 ± 14.2 | 43.4 ± 12.6 | 42.9 ± 8.1 | 39.2 ± 11.0 | 41.5 ± 11.0 | 43.6 ± 12.3 |
| | WM | 13.1 ± 3.6 | 14.3 ± 4.3 | 12.0 ± 3.1 | 11.0 ± 2.6 | 13.1 ± 3.0 | 14.4 ± 3.9 |
| Gray/white ratio | | 3.51 | 3.03 | 3.57 | 3.55 | 3.17 | 3.02 |

Note:
The signal attenuation from additional background suppression pulses was corrected in ASL signal and CBF calculation.

There was no significant difference in CBF measured using different ASL methods in GM (P=0.97) or WM (P=0.62) ROIs according to 1-way analysis of variance. Averaged gray/white ratios were within the range of 3.02~3.57. These values are reported in Table 2.

The novel dm-VSASL strategy offers a few distinctive advantages compared to existing VSASL methods: (1) the label/control condition switching in the second VS module creates a more balanced distribution of VS (motion-sensitizing) gradients and diffusion weighting in the label/control acquisition, reducing artifacts and errors from sources such as diffusion attenuation, ECs, and possibly pulsatile motion such as in CSF; (2) the inversion effect from the first VS module at an early time point enables more flexible and effective BS, especially of CSF, resulting in further noise reduction; (3) dual-module labeling can increase the SNR efficiency, improving the quality and/or the efficiency of VSASL scans. These features significantly enhanced the accuracy and the robustness of VSASL. Combined with its insensitivity to ATT artifacts and SNR advantage in presence of delayed blood flow, VSASL is particularly suited for perfusion imaging applications such as in vascular disease cohorts or in aging population. VSASL's insensitivity to ATT effects has been demonstrated in healthy subjects and patients. An interesting case was encountered in this study and is shown in FIGS. 8A,B, where ATT artifacts were accidentally observed in a young healthy subject using PASL with a PLD of 1.2 s (corresponding to a TI of 2 s, already longer than recommended TI value of 1.8 s), and were mostly gone (ASL images still a little grainy) after increasing the PLD to 1.6 s; whereas VSASL (only dm-VSI is shown) yielded consistent and ATT-artifact-free perfusion maps.

Figure 42:
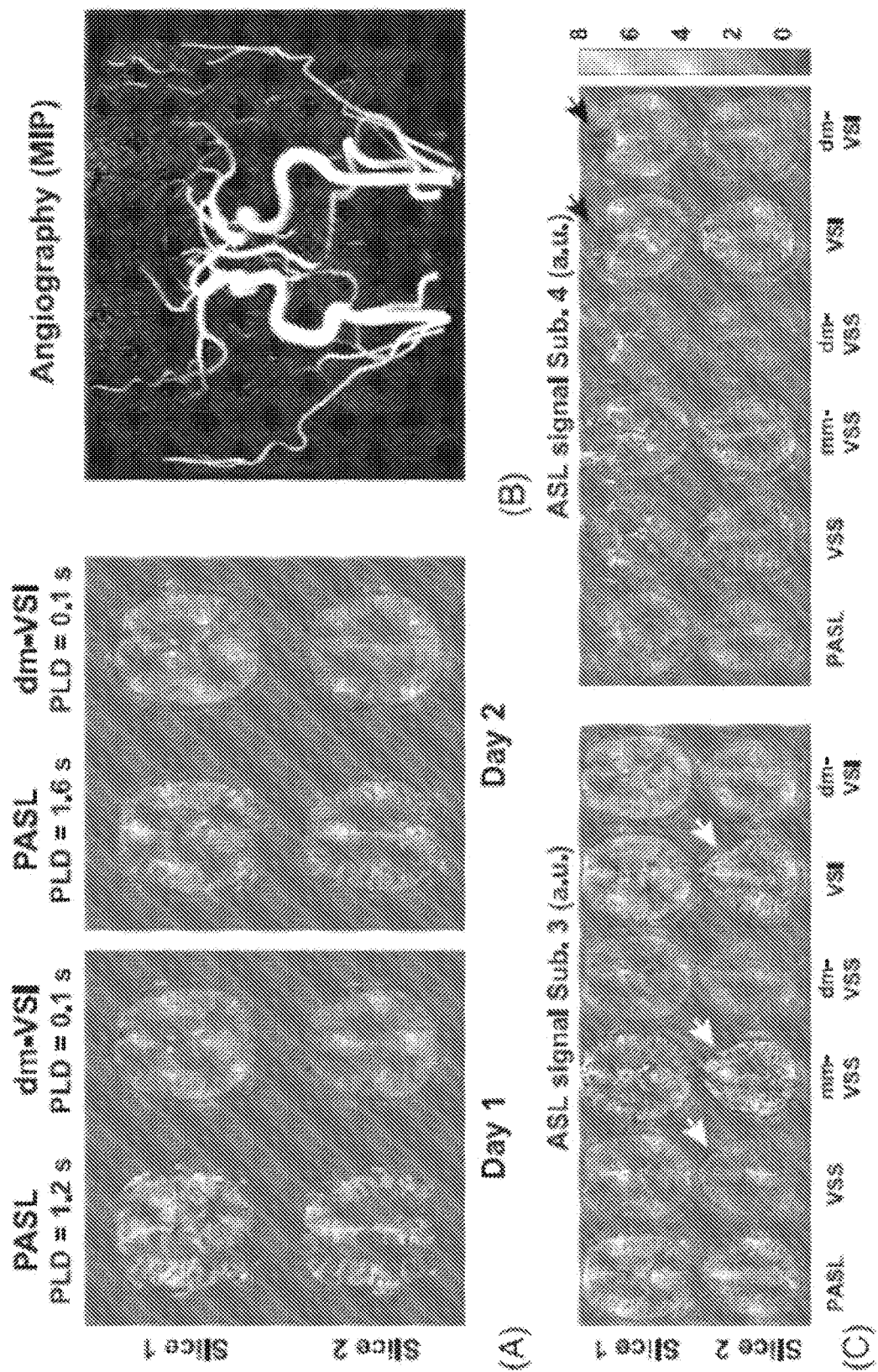
FIG. 42 shows results from another experiment.

FIG. 42 shows, at top left, (A) examples showing the ATT artifacts (delayed flow and strong intravascular signals are indicated by white and black arrows, respectively) using PASL with a normal PLD of 1.2 s in subject 3; to right (B) the MIP of the angiogram from subject 3 showing a tortuous vertebrobasilar artery, likely to be the cause of the ATT artifacts; and bottom row (C) examples of CSF artifacts (left panel, white arrows) using single-module VSASL (VSS and VSI) and previous multi-module VSASL (mm-VSS); and artifacts using the VSI pulses (right panel, black arrows). ATT, arterial transit time; MIP, maximum-intensity-project.

In principle, dm-VSASL is applicable with any even number of VS modules (e.g., more than 2); however, as each additional VS labeling module results in higher signal reduction due to imperfect labeling, it may not be beneficial to use more than 2 VS module in practice. The SNR efficiency simulation results also emphasized the need for robust VS modules of higher β and shorter effect TE.

The constraint of $TI_1+TI_2<BD_{max}=2$ s was adopted for accurate quantification of VSASL in the brain, based on estimation from a few healthy subjects with a whole-body RF coil for labeling.[14] $BD_{max}$ may vary in different situations, such as applications in different organs, using different RF coils or in subjects with abnormal arterial velocities. If $BD_{max}$ is smaller, the timing optimization for optimal SNR efficiency should be adjusted accordingly; if $BD_{max}$ is larger, for example, in vascular disease patients with slow and delayed flow, the constraint remains valid and the timings reported in this study are directly applicable, with a slightly suboptimal SNR efficiency. For example, if $BD_{max}$ increases to 2.5 s, using the timings derived under $BD_{max}=2$ s will still achieve 95% of the optimal SNR efficiency.

Compared to PASL, VSASL methods yielded comparable CBF values, suggesting the R values used in this study were reasonable. This is also consistent with the results from a study performed on a different scanner and using PCASL as the reference.[22] Compared to VSI, dm-VSI yielded a 5.4% increase of GM ASL signal in in vivo experiments despite the possibility of VSI having artificially higher signal due to diffusion attenuation effect from CSF. This is higher than predicted, possibly due to an improved overall labeling robustness using the dual-module strategy, that is, a slightly higher averaged β in dual-module labeling (e.g., an improved β in the second VS module) than in single-module labeling. On the other hand, the ASL signal improvement of dm-VSS with respect to VSS was lower than that predicted by simulation, suggesting either reduced averaged β in dm-VSS labeling or more severe CSF contamination in VSS labeling. The latter is more likely, judging from the ASL signal maps compared to PASL and the fact that the β of VSS is already close to 1. Nevertheless, accurate measurement of the labeling efficiencies (especially β) of different VS modules and under different labeling strategies is needed for further improved quantification accuracy using VSASL.

Dm-VSASL with BS1 (higher GM/WM and lower CSF signals) had a better tSNR performance than with BS2 (lower GM/WM but slightly higher CSF signals), indicating that CSF contributed much higher noise than GM or WM. This is also supported by the observation that the tSNR improvement with dm-VSASL in GM is higher than that in WM (90.8% vs. 41.5% with VSS and 94.9% vs. 55.1% with VSI) compared with sm-VSASL, likely due to a generally higher partial volume of CSF in "GM" voxels. In PASL and PCASL, the labeling and imaging volumes are separated, and the labeling mechanisms hardly interact with CSF. Therefore, CSF is typically not a significant source of signal variations in PASL and PCASL and can be well suppressed using existing methods. In contrast, the labeling in VSASL is global and interacts with tissues in the imaging volume in a more complex way. In sm-VSASL and mm-VSASL, effective suppression of CSF is difficult and limited by the timing constraints for optimizing the SNR, resulting in insufficient BS levels (typically >20%) and high noise from CSF. In addition, the diffusion attenuation effect from CSF is also a greater source of error than that from GM and WM in VSASL. Therefore, good suppression of CSF should be prioritized in VSASL (additional examples of CSF artifacts can be found in FIG. 8C). Previous studies had emphasized its importance with efforts to directly suppress CSF signal at the cost of SNR or to correct for its erroneous signal with additional post-processing steps. With the new dm-VSASL schemes, the BS optimization in VSASL, especially for CSF, is much more amiable. For example, both sm-VSS and dm-VSS had the same number (2) of effective BS pulses, including 1 from the built-in inversion in $VSS_{inv}$, and dm-VSS had better BS and tSNR performance. The 2 sets of BS parameters used in this study were for demonstration of the flexibility and effectiveness of BS with dm-VSASL; its optimization was not a focus and should be investigated further. In general, more additional BS pulses may provide more flexibility in BS, but the associated signal reduction and increased specific absorption rate should also be taken into consideration in pulse sequence design. In addition, complex reconstruction would be beneficial as it allows more aggressive timings for improved BS while avoiding rectification errors.

Aside from the effective suppression of CSF, the more balanced VS gradient application in label/control images also contributed significantly to the tSNR improvement with dm-VSASL. This is more evident when comparing the tSNR in WM, where the partial volume fraction of CSF is much smaller than in GM. The tSNR increased by 41.5% (dm-VSS vs. VSS) and 55.1% (dm-VSI vs. VSI) despite higher tissue signals (less BS) in WM with dm-VSASL than with sm-VSASL.

In addition to the application in baseline perfusion measurement, VSASL is useful in fMRI studies for its insensitivity to ATT effects. And a recent study demonstrated the SNR advantage of VSI-based VSASL in fMRI. With almost doubled tSNR in GM compared to existing VSASL methods, dm-VSI should be an excellent tool for imaging functional changes of blood flow.

Despite the excellent SNR of VSI-based labeling, its current implementations (rect-VSI and sinc-VSI) are still somewhat susceptible to field inhomogeneities as predicted by Bloch simulation and shown in vivo. For example, as shown in FIG. 8C, insufficient labeling and artifacts were observed in regions with compromised homogeneity in $B_0$ and $B_1$ fields. Improving the robustness to field inhomogeneities is highly desired for VSI-based labeling and should be studied further. In addition, better shimming should also help improve the performance. In contrast, sBIR8 VSS-based labeling did not generate such artifacts, suggesting dm-VSS may be more suitable for applications with higher field inhomogeneities. Dual-module labeling increases the specific absorption rate compared to single-module labeling. Though dm-VSI has slightly higher specific absorption rate than dm-VSS, both were within the normal safety limit and can be reduced with pulse optimization.

The dm-VSASL strategy can significantly reduce noise and artifacts that are typically encountered with existing VSASL methods, offering dramatically enhanced tSNR in both GM and WM. It is achieved by utilizing a more balanced VS gradient configuration in control and label image acquisition and enabling more efficient suppression of background tissue signals, especially of CSF. A slight SNR improvement is also achieved with dm-VSI compared to VSI. With enhanced labeling robustness and reduced artifacts, dm-VSASL can measure perfusion more reliably and accurately, especially in applications where ATT effects are concerned.

It will be appreciated by one of skill in the art that the present document discloses techniques that provide improvements in the SNR, particularly temporal SNR, of acquired MRI images.

It will further be appreciated that various embodiments of MRI systems may implement a method that uses multiple (typically two) VS saturation and/or inversion modules to label arterial blood. The first VS module inverts the stationary spins in addition to the arterial blood for ASL signal generation, and then the label/control condition in the second VS module is flipped to allow proper accumulation of ASL signal in the tissue. The new dm-VSASL strategy provides two major advantages: 1) the inversion effect from the first VS module enables more flexible and optimized background suppression; 2) the label/control condition flipping in the second VS module creates a more balanced distribution of VS gradients and diffusion weighting in the label/control conditions, reducing artefacts from sources such as motion, diffusion and ECs. Therefore, stability of VSASL signal, e.g., the temporal SNR, is significantly improved. In addition, the perfusion quantification may be more accurate with the new labeling strategy.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

The described systems, apparatus and techniques can be implemented in electronic circuitry, computer hardware, firmware, software, or in combinations of them, such as the structural means disclosed in this specification and structural equivalents thereof. This can include at least one computer-readable storage medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Only a few implementations are disclosed. However, variations and enhancements of the disclosed implementations and other implementations can be made based on what is described and illustrated in this specification.

The invention claimed is:

1. A method of obtaining an image of a target using a magnetic resonance imaging (MRI) system, comprising:
   generating an MRI image by processing:
   a first image obtained by applying a first order of modules including at least a first control module at a first time point and a first labeling module at a second time point to a target object, wherein the first control module inverts a magnetization of the target object; and
   a second image obtained by applying a second order of modules including at least a second labeling module at a third time and a second control module at a fourth time to the target object, wherein the second labeling module inverts the magnetization of the target object.

2. A magnetic resonance imaging (MRI) system, comprising:
   a scanner comprising a magnet,
   gradient coils and
   a processor,
   wherein the processor is configured to generate an MRI image by processing:
   a first image obtained from the scanner by applying a first order of modules using the gradient coils, the first order of modules including at least a first control module at a first time point and a first labeling module at a second time point to a target object, wherein the first control module inverts a magnetization of the target object; and
   a second image obtained from the scanner by applying a second order of modules using the gradient coils, the second order of modules including at least a second labeling module at a third time and a second control module at a fourth time to the target object, wherein the second labeling module inverts the magnetization of the target object.

3. A non-transitory computer readable medium having processor-executable code for implementing a method of obtaining an image of a target using a magnetic resonance imaging (MRI) system, the code, upon execution by a processor, causing the processor to:
   generate an MRI image by processing:
   a first image obtained by controlling a gradient coil to apply a first order of modules including at least a first control module at a first time point and a first labeling module at a second time point to a target object, wherein the first control module inverts a magnetization of the target object; and
   a second image obtained by controlling the gradient coil to apply a second order of modules including at least a second labeling module at a third time and a second control module at a fourth time to the target object, wherein the second labeling module inverts the magnetization of the target object.

4. The method of claim 1, wherein the first control module and the second labeling module comprise a velocity selective inversion (VSI) module.

5. The method of claim 1, wherein the first control module and the second labeling module comprise a velocity selective saturation (VSS) module, and wherein the VSS module comprises an amplitude or a phase modulation of a radio frequency (RF) pulse, or additional one or more RF pulses following the VSS module immediately or after a time delay that causes the VSS module to invert magnetization of stationary spins ($VSS_{inv}$) of the target object.

6. The method claim 1, wherein the first labeling module and the second control module are a VSS module, a velocity selective saturation with a $VSS_{inv}$ module, or a VSI module with corresponding labeling or control conditions.

7. The method of claim 1, wherein a third or more VS modules are applied with corresponding labeling or control condition in the first and the second orders of the modules, wherein the third or more VS modules comprise VSS, $VSS_{inv}$, VSI or $VSI_{inv}$ modules.

8. The method of claim 1, wherein the first labeling module or the second labeling module comprises a sinc pulse.

9. The method of claim 1, wherein the first labeling module or the second labeling module comprises a symmetric B1 insensitive rotation 8 (sBIR8) pulse.

10. The MRI system of claim 2, wherein the first control module and the second labeling module comprise a velocity selective inversion (VSI) module.

11. The MRI system of claim 2, wherein the first control module and the second labeling module comprise a velocity selective saturation (VSS) module, and wherein the VSS module comprises an amplitude or a phase modulation of a radio frequency (RF) pulse, or additional one or more RF pulses following the VSS module immediately or after a time delay that causes the VSS module to invert magnetization of stationary spins ($VSS_{inv}$) of the target object.

12. The MRI system of claim 2, wherein the first labeling module and the second control module are a VSS module, a velocity selective saturation with a $VSS_{inv}$ module, or a VSI module with corresponding labeling or control conditions.

13. The MRI system of claim 2, wherein a third or more VS modules are applied with corresponding labeling or control condition in the first and the second orders of the modules, wherein the third or more VS modules comprise VSS, $VSS_{inv}$, VSI or $VSI_{inv}$ modules.

14. The MRI system of claim 2, wherein the first labeling module or the second labeling module comprises a sinc pulse.

15. The MRI system of claim 2, wherein the first labeling module or the second labeling module comprises a symmetric B1 insensitive rotation 8 (sBIR8) pulse.

16. The non-transitory computer readable medium of claim 3, wherein the first control module and the second labeling module comprise a velocity selective inversion (VSI) module.

17. The non-transitory computer readable medium of claim 3, wherein the first control module and the second labeling module comprise a velocity selective saturation (VSS) module, and wherein the VSS module comprises an amplitude or a phase modulation of a radio frequency (RF) pulse, or additional one or more RF pulses following the VSS module immediately or after a time delay that causes the VSS module to invert magnetization of stationary spins ($VSS_{inv}$) of the target object.

18. The non-transitory computer readable medium of claim 3, wherein the first labeling module and the second control module are a VSS module, a velocity selective saturation with a $VSS_{inv}$ module, or a VSI module with corresponding labeling or control conditions.

19. The method of claim 6, wherein the VSI module used in the first labeling module and the second control module comprises amplitude or phase modulated pulse(s), or additional one or more RF pulses following the VSI module immediately or after a time delay, that causes the VSI module to set the magnetization of stationary spins to equilibrium ($VSI_{inv}$) in the target object.

20. The MRI system of claim 12, wherein the VSI module used in the first labeling module and the second control module comprises amplitude or phase modulated pulse(s), or additional one or more RF pulses following the VSI module immediately or after a time delay, that causes the VSI module to set the magnetization of stationary spins to equilibrium ($VSI_{inv}$) in the target object.

* * * * *